United States Patent
Tobita

[11] Patent Number: 6,034,391
[45] Date of Patent: Mar. 7, 2000

[54] SEMICONDUCTOR DEVICE INCLUDING CAPACITANCE ELEMENT HAVING HIGH AREA EFFICIENCY

[75] Inventor: Youichi Tobita, Hyogo, Japan

[73] Assignee: Mitsubishi Denki Kabushiki Kaisha, Tokyo, Japan

[21] Appl. No.: 08/805,016

[22] Filed: Feb. 21, 1997

[30] Foreign Application Priority Data

Jun. 21, 1996 [JP] Japan ..................... 8-162068

[51] Int. Cl.⁷ ............ H01L 27/108; H01L 29/76; H01L 29/94; H01L 31/119
[52] U.S. Cl. .................... 257/306; 257/311; 257/532; 438/253; 438/396
[58] Field of Search .................... 257/296, 306, 257/311, 532; 438/253, 396

[56] References Cited

U.S. PATENT DOCUMENTS

| | | |
|---|---|---|
| 4,879,631 | 11/1989 | Johnson et al. . |
| 4,980,799 | 12/1990 | Tobita . |
| 5,032,892 | 7/1991 | Chern et al. ............ 257/532 |
| 5,243,209 | 9/1993 | Ishii . |
| 5,302,844 | 4/1994 | Mizuno et al. ............ 257/396 |
| 5,336,922 | 8/1994 | Sakamoto ............ 257/534 |
| 5,465,058 | 11/1995 | Krenik et al. . |
| 5,739,576 | 4/1998 | Shirley et al. ............ 257/532 |

FOREIGN PATENT DOCUMENTS

| | | |
|---|---|---|
| 58-009289A | 1/1983 | Japan . |
| 61-050282A | 3/1986 | Japan . |
| 64-80066 | 3/1989 | Japan . |
| 1-296490 | 11/1989 | Japan . |
| 2-276088 | 11/1990 | Japan . |
| 4-88665 | 3/1992 | Japan ............... 257/306 |
| 6 215570A | 8/1994 | Japan . |
| 7-106518 | 4/1995 | Japan . |

*Primary Examiner*—Olik Chaudhuri
*Assistant Examiner*—Howard Weiss
*Attorney, Agent, or Firm*—McDermott, Will & Emery

[57] ABSTRACT

First conductive layers having structures similar to that of a storage node of a memory cell capacitor are isolated from each other, and are commonly and electrically connected to a third conductive layer. A second conductive layer corresponding to a cell plate of the memory cell capacitor is formed on the first conductive layers with a capacitor insulating film therebetween. Opposed portions of the first and second conductive layers have large areas, so that a large number of parallel unit capacitance elements can be formed within a limited area, and a capacitance element can have a good area efficiency.

11 Claims, 41 Drawing Sheets

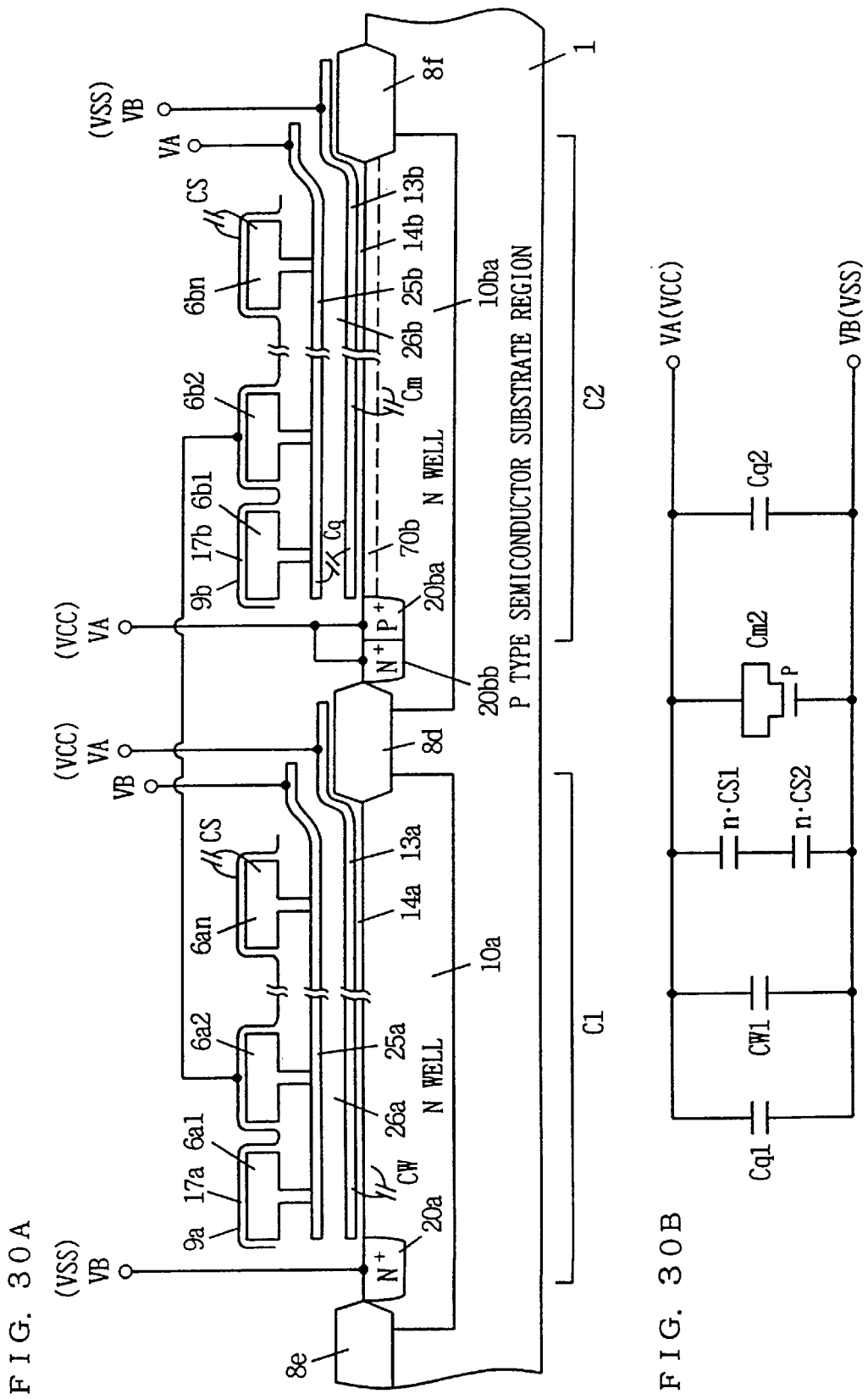

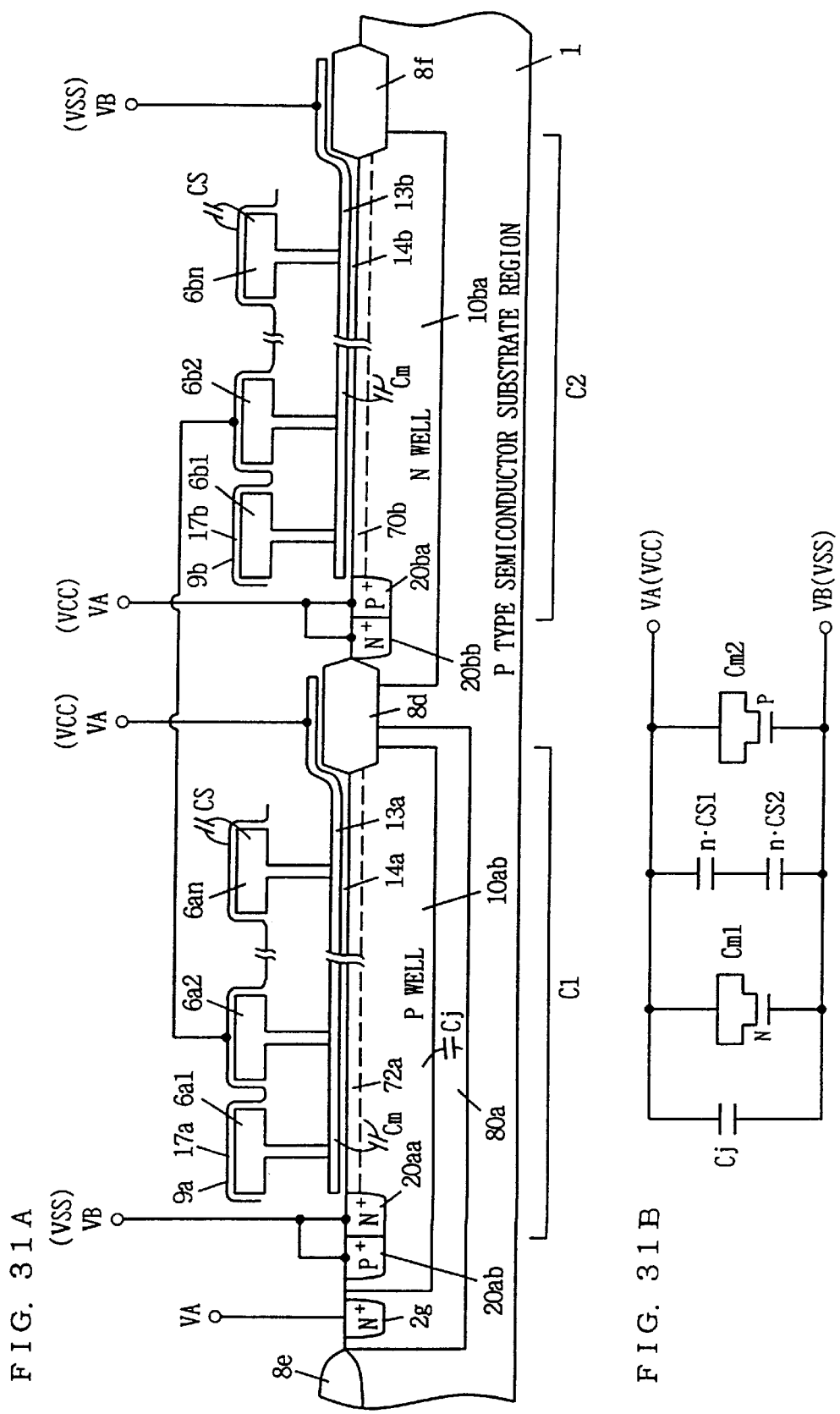

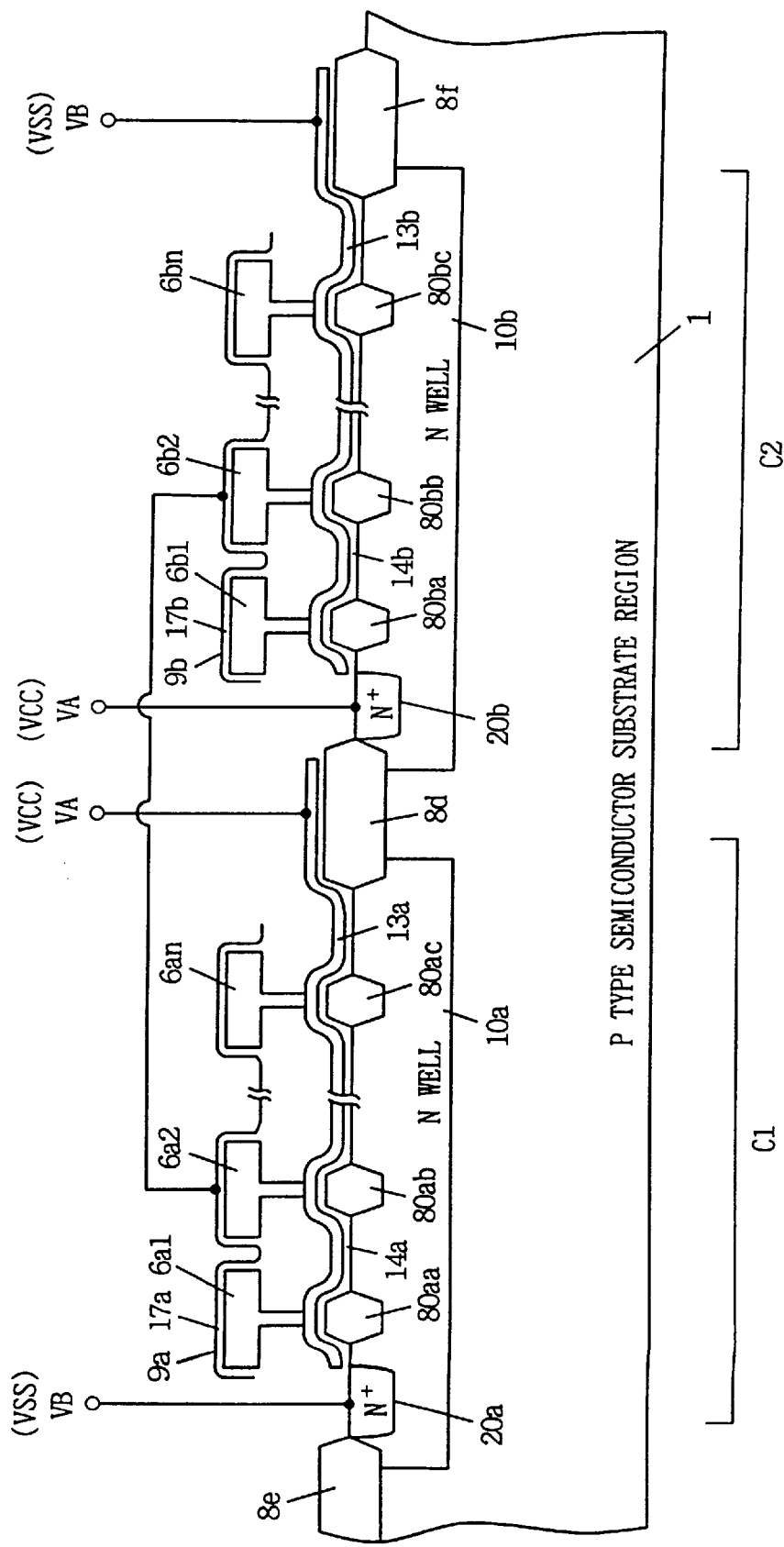

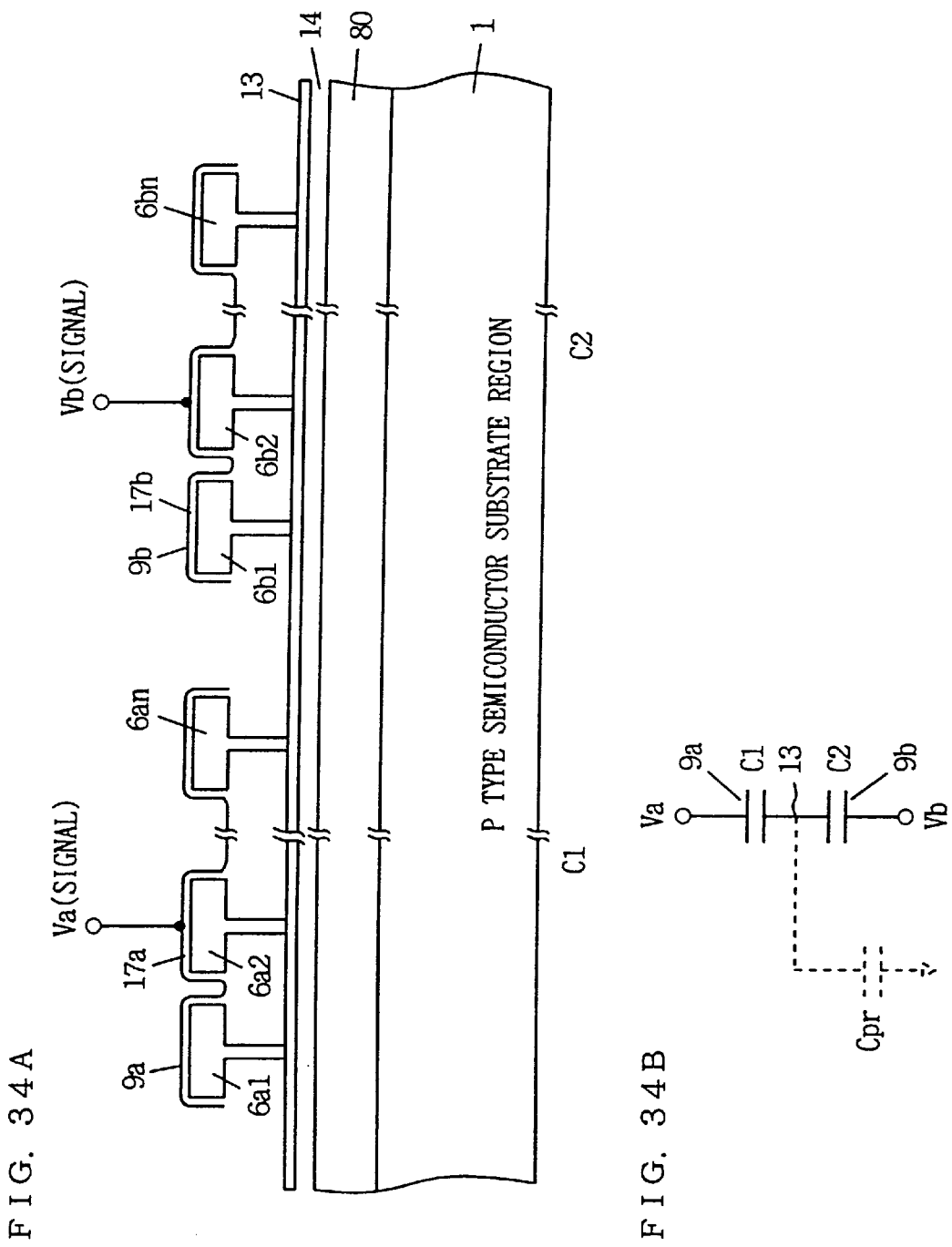

SEMICONDUCTOR DEVICE INCLUDING CAPACITANCE ELEMENT HAVING HIGH AREA EFFICIENCY

BACKGROUND OF THE INVENTION

1. Field of the Invention

The present invention relates to a structure of a capacitive element having a high area efficiency, and in particular to a capacitive element which occupies a small area and is suitable to use in a dynamic semiconductor memory device including memory cells each including one transistor and one capacitor, and also relates to utilization of this capacitance element.

2. Description of the Background Art

Applied products such as personal computers utilizing DRAMs (Dynamic Random Access Memories) have been improved to increase the operation speed and the number of information bits for rapidly processing information. In order to satisfy demands for these applied products, DRAMs used as main memories in the applied products have been improved to increase the operation speed and the number of inputs and outputs (i.e., the number of data I/O bits (the number of I/O nodes)).

Fast operation results in fast charging/discharging of signal lines in the DRAM, and the increase of I/O nodes increases the number of simultaneously operated I/O buffer circuits. Accordingly, a charging current supplied from a power supply line and a discharging current flowing to a ground potential are increased. Therefore, voltage noises on the power supply line and ground line on a DRAM chip increase, and therefore an operation margin, which determines a voltage range for stable operation of internal circuits, decreases, so that stable operation of the DRAM becomes difficult. For example, it is assumed that the device operates stably even with a power supply voltage of 4.5 V when the power supply voltage is 5 V and the voltage noise is 0.5 V. Under the same conditions, when the voltage noise increases to 1.0 V, the circuits operate with the power supply voltage of 4 V due to the voltage noise when the power supply voltage is 5 V, so that it is impossible to ensure a stable operation of internal circuits due to noises when the power supply voltage lowers below 5 V.

In particular, it is a main trend for DRAMS in generations of or after 16 Mbits DRAMs to include internal power supply circuits which produce internal power supply voltages by lowering external power supply voltages. In this internal power supply circuit, an MOS transistor (insulated gate type field effect transistor) is arranged between an external power supply node and an internal power supply line. A gate potential of this MOS transistor is controlled in accordance with a level of a voltage on the internal power supply line, and thereby a quantity of current flowing from the external power supply node to the internal power supply line is controlled for producing the internal power supply voltage at an intended voltage level.

When the internal circuit operates to cause a charging current flowing from the internal power supply line to the internal circuit, the charging current is supplied from the external power supply node through the MOS transistor. The MOS transistor has a channel resistance. Therefore, the channel resistance increases the impedance of the internal power supply line, compared with a structure without the internal power supply circuit. This impedance component further lowers the voltage on the internal power supply line during flow of the charging current (the voltage drop quantity is given by a product of the impedance component Z and the charging current I). Therefore, the voltage noises further increase, resulting in a further remarkable problem of reduction in operation margin.

In order to suppress an influence by the voltage noises on the power supply line and ground line described above, a decoupling capacitance is arranged between the power supply line and the ground line. The decoupling capacitance is arranged near the internal circuit which operates using the power supply voltage on the power supply line and the ground voltage on the ground line as its operation power supply voltages. When the internal circuit operates, it consumes the current supplied from the power supply line, and the power supply voltage on the power supply line lowers. In this case, the decoupling capacitance supplies charges accumulated therein to the internal circuit through the power supply line. This compensates for the current consumed by the internal circuit, and variation in the power supply voltage on the power supply line is suppressed.

Conversely, when the discharging current raises the ground voltage level on the ground line during operation of the internal circuit, the decoupling capacitance absorbs the current discharged from the internal circuit, and thereby suppresses variation in ground voltage on the ground line.

In many cases, semiconductor devices generally use stabilizing capacitances for stably maintaining voltages on predetermined internal nodes as well as charge pump capacitances for generating voltages at predetermined levels. Circuits using the charge pump capacitances include, for example, a charge pump circuit for generating a boosted voltage to be transmitted onto a selected word line, and a charge pump circuit for generating a negative voltage for substrate bias to be applied to a substrate region of a memory cell array in a DRAM.

A current supplied or absorbed by the decoupling capacitance depends on the quantity of charges accumulated therein. Therefore, an effect of suppressing voltage noises by the decoupling capacitance increases as the capacitance value of the decoupling capacitance increases as can be understood from the relationship of $Q=C \cdot V$, where Q represents a quantity of accumulated charges, C represents an electrostatic capacity and V represents a voltage applied to the capacitance.

In general, the capacitance value of the capacitance is proportional to an area of opposing portions of electrodes. Therefore, increase in capacitance value of the decoupling capacitance results in increase in occupying area of the capacitance, so that a chip area increases, resulting in increase in chip cost.

In order to achieve sufficient functions of the stabilizing capacitance and charge pump capacitor, the capacitance values thereof must be large. Therefore, similarly to the decoupling capacitance, increase in the capacitance values of these capacitances result in increase in chip cost due to increase in occupied area by such a capacitor.

Japanese Patent Laying-Open No. 64-80066 (1989) discloses a structure for reducing an occupied area by a capacitance without increasing the number of manufacturing steps. In this prior art, a conductive layer formed of the same interconnection layer as an electrode layer of a stacked (i.e., stacked type) capacitor of a memory cell in a DRAM is used to form a capacitor above an MOS transistor. However, the structure disclosed in Japanese Patent Laying-open No. 64-80066 merely utilizes conductive layers of the same interconnection layers as a storage node electrode layer and the cell plate electrode layer of a stacked capacitor as opposing electrodes, and is equivalent to the structure of the capacitor of a parallel plane electrode type. Therefore, it is difficult to achieve a sufficiently large capacitance value with a small occupying area.

Since the insulating film of the capacitance has the same thickness as the insulating film of the memory cell capacitor, the capacitance has a breakdown voltage equal to a half of power supply voltage VCC, so that it is difficult to use the capacitance as the decoupling capacitance for suppressing noises on the power supply line and ground line.

Japanese Patent Laying-Open No. 7-106518 (1995) discloses a structure in which a power supply bypass capacitor, i.e., decoupling capacitance is formed through the same manufacturing steps as those of forming a stacked capacitor of a memory cell in a DRAM. However, the structure disclosed in Japanese Patent Laying-Open No. 7-106518 requires formation of a dielectric film for increasing a breakdown voltage of the decoupling capacitor in the steps of forming the power supply bypass capacitor in addition to the steps of forming of a memory cell capacitor. Therefore, the power supply bypass capacitor cannot be formed with the completely same steps as the stacked capacitor. In the structure disclosed in this Japanese Patent Laying-Open No. 7-106518, the power supply bypass capacitor likewise has a capacitor structure of the parallel plane electrode type, so that it is difficult to achieve a large capacitance value with a small occupied area.

SUMMARY OF THE INVENTION

An object of the invention is to provide a semiconductor device including a capacitance element having a good area efficiency.

Another object of the invention is to provide a capacitance element structure which has a good area efficient and is suitable to use in a DRAM.

Still another object of the invention is to provide a capacitance element which has a good area efficiency and is suitable to use in a DRAM including a memory cell having a stacked capacitor.

Yet another object of the invention is to provide a semiconductor device including a stabilizing capacitor, a decoupling capacitor or a coupling capacitor which has a good area efficiency and a high reliability.

A semiconductor device according to a first aspect of the invention includes a capacitance element having one electrode node and other electrode node. The capacitance element includes a plurality of first impurity regions of a first conductivity type spaced from each other and arranged at a surface of a semiconductor substrate region of the first conductivity type electrically connected to the one electrode node; a plurality of first conductive layers each having a predetermined pattern, formed on the surface of the semiconductor substrate region, electrically connected to the plurality of first impurity regions, respectively, and physically isolated from each other; and a second conductive layer opposed to the plurality of first conductive layers with an insulating film therebetween and electrically connected to the other electrode node.

A semiconductor device according to a second aspect of the invention includes a capacitance element having one electrode node and other electrode node. The capacitance element includes a plurality of first conductive layers each having a predetermined pattern, formed on a surface of a semiconductor substrate region and spaced from each other; a second conductive layer formed on the plurality of first conductive layers with an insulating film therebetween, opposed to the plurality of first conductive layers and electrically connected to the one electrode node; and a third conductive layer formed between the plurality of first conductive layers and the semiconductor substrate region, electrically connected commonly to the plurality of first conductive layers and electrically connected to the other electrode node.

The conductive layers and impurity layers forming the electrodes of the capacitance element are formed in the same steps as the steps of forming an internal circuit, particularly a memory cell array.

Owing to arrangement of the second conductive layer opposed to the plurality of first conductive layers with the insulating film therebetween, an area of opposing portions of the first and second conductive layers increase, so that the capacitance element can have a good area efficiency. In particular, the first and second conductive layers may be formed of the same conductive layers as a storage node electrode and a cell plate electrode of a memory cell capacitor. Therefore, it is possible to provide the capacitance element having a good area efficiency without increasing the number of manufacturing steps.

Capacitance elements each having the same structure as the above may be electrically connected in series, whereby the composite capacitance element can have double the breakdown voltage of the memory cell capacitor, so that a decoupling capacitance and a stabilizing capacitance stabilizing a voltage at a power supply voltage level can be implemented easily.

By supplying a constant voltage to a connection node of the capacitance elements of the composite capacitance element, it is possible to prevent a following disadvantage even when a large leak current flows due to a failure occurred in the unit capacitance element included in the composite capacitance element. More specifically, even in the above case, the leak current can be compensated for to hold the capacitance element connection node at the constant voltage level, and a voltage difference between the electrode nodes of this capacitance element can be held constant, so that intended breakdown voltage characteristics of the capacitance element is ensured, and an intended reliability of the composite capacitance element is ensured. By holding the connection node of the capacitance element at the constant voltage to prevent a floating state thereof, it is possible to prevent variation of the potential on this connection node due to an influence by noises and others, and therefore it is possible to suppress variation of the potential on the electrode nodes of the composite capacitance element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 30A and 30B show a schematic sectional structure and an electrically equivalent circuit of a third modification of the embodiment 3 of the invention, respectively;

FIGS. 31A and 31B show a schematic sectional structure and an electrically equivalent circuit of a fourth modification of the embodiment 3 of the invention, respectively;

FIG. 33 shows a schematic sectional structure of a seventh modification of the embodiment 3 of the invention;

FIGS. 34A and 34B show a schematic sectional structure and an electrically equivalent circuit of an embodiment 4 of the invention, respectively;

DESCRIPTION OF THE PREFERRED EMBODIMENTS

[Basic Structure of the Invention]

Figure 1:
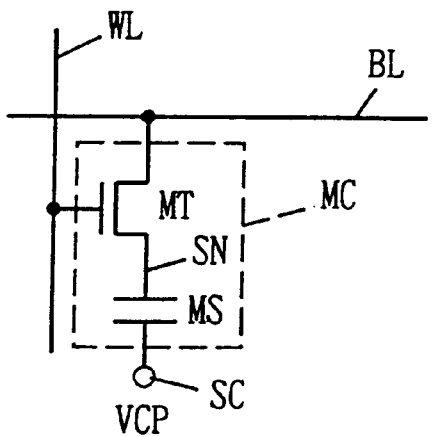
FIG. 1 shows a structure of a memory cell of a DRAM to which the invention is applied.

FIG. 1 shows a structure of a memory cell of a DRAM, i.e., an example of a semiconductor device to which the invention is applied. In FIG. 1, a memory cell MC is arranged at a crossing between a bit line BL and a word line WL respectively. Although the whole structure of the DRAM will be described later in detail, memory cells MC are arranged in a matrix form. Word lines WL are arranged corresponding to the rows of memory cells, respectively, and they are each connected to memory cells MC in the corresponding row. Bit lines BL are arranged corresponding to columns of the memory cells, respectively, and they are each connected to the memory cells in the corresponding column. Bit lines BL are usually arranged in pairs. A reference potential with respect to the bit line BL is provided by the other (i.e., complementary) bit line in the pair in a data sense operation.

Each memory cell MC includes a memory cell capacitor MS for storing information in the form of electric charges and an access transistor MT formed of an n-channel transistor, which is turned on in response to selection of word line WL and thereby connects a storage node SN of memory cell capacitor MS to bit line BL (or complementary bit line /BL). The other electrode node (cell plate electrode node) of memory cell capacitor MC is supplied with an intermediate voltage (cell plate voltage VCP). Intermediate voltage VCP is at a voltage level equal to half a difference between an operation power supply voltage VCC of the DRAM and a ground voltage GND. In the following description, the operation power supply voltage may be either an externally supplied power supply voltage or an internal power supply voltage produced by down-converting the externally supplied power supply voltage. The voltage level is defined based on the ground voltage.

The memory capacitor MS has a capacitor insulating film, of which thickness is reduced to implement a large capacitance value with a small occupying area. In order to ensure the breakdown voltage of memory cell capacitor MS having a thin capacitor insulating film, a cell plate voltage VCP at an intermediate voltage level is applied to a cell plate electrode node SC. The potential on word line WL is raised to a voltage level higher than the operation power supply voltage level when it is selected, as will be described later in detail. Therefore, access transistor MT has a gate insulating film thicker than that of memory cell capacitor MS in order to ensure the dielectric breakdown characteristics.

Figure 2:
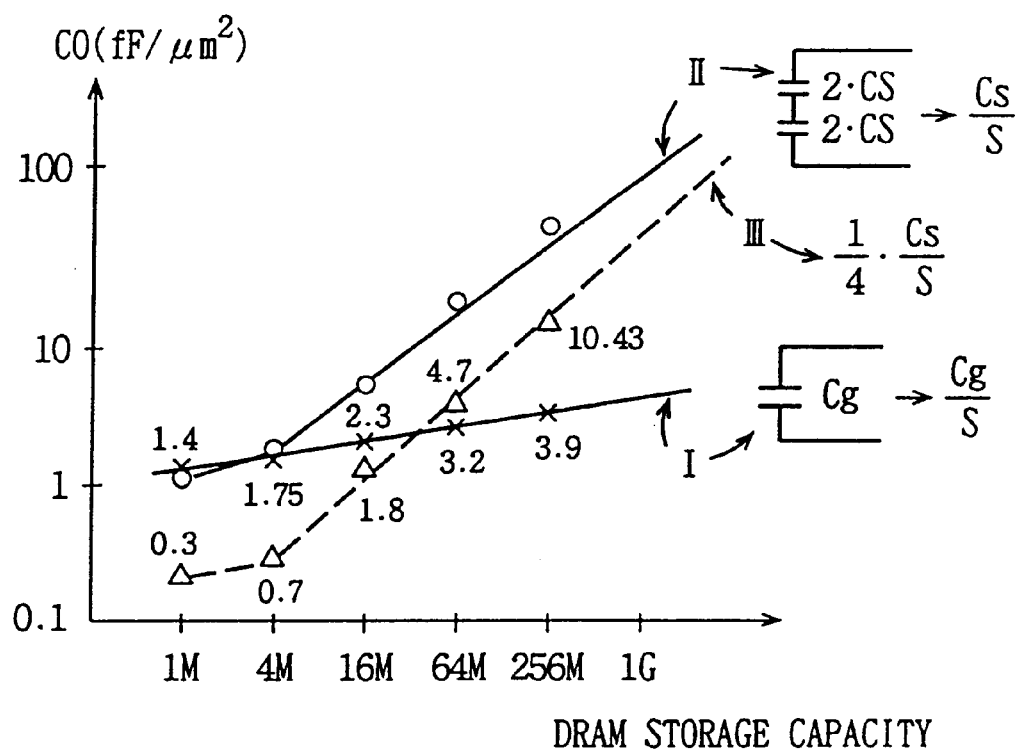
FIG. 2 shows a relationship between a storage capacity of a DRAM and of a capacitance per area of a gate capacitor and of a memory cell capacitor.

FIG. 2 shows a relationship of capacitance values per unit area of a capacitor (gate capacitor) used in access transistor MT and memory cell capacitor MS with respect to a storage node of a DRAM. In FIG. 2, the abscissa gives the storage capacity of the DRAM, and the ordinate gives the capacitance value in a unit of fF per unit area ($\mu m^2$). The gate capacitor employing access transistor MT has a breakdown voltage higher than the power supply voltage. A transistor used as this gate capacitor may be similar to an MOS transistor included in a peripheral circuit or a logic circuit. Therefore, FIG. 2 shows a unit capacitance value C0 of capacitors Cg using an access transistor MT and an MOS transistor in the peripheral or logic circuit.

In memory cell capacitor MS, a cell plate receives an intermediate voltage VCP equal to VCC/2 in order to implement a sufficiently large capacitance value with a small occupying area. Therefore, memory cell capacitor MS has a breakdown voltage of VCC/2. In the structure where memory cell capacitor MS is utilized as the same purpose as this MOS transistor, therefore, two memory cell capacitors MS are connected in series for achieving the breakdown voltage equal to power supply voltage VCC. In this case, an area of memory cell capacitor MS is doubled in order to compensate for lowering of the capacitance value due to the series connection. In the case where memory cell capacitors MS are used, therefore, a relationship of C0=CS/4 is satisfied as represented by a curve III. More specifically, actual capacitance value CS of memory cell capacitor MS goes to a quarter of the value on the ordinate shown in FIG. 2, in which capacitance value C0 on the ordinate represents the capacitance value per unit area.

As shown in FIG. 2, capacitance values Cg and Cs of the gate capacitor using the MOS transistor and the memory cell capacitor MS increase as the storage capacity of DRAM increases. In the gate capacitor, a thickness of the gate insulating film and channel width and length are scaled down in accordance with a scaling rule. Therefore, as the degree of integration increases, the capacitance value increases, but the degree of increase of the capacitance value is relatively small (see curve I in FIG. 2). Meanwhile, in the case of memory cell capacitor MS, as the storage capacity of DRAM increases, the occupying area of the capacitor decreases, but the substantially constant capacitance value can be achieved as will be described later. Therefore, the unit capacitance value C0 of memory cell capacitor MS increases more rapidly than that of the MOS capacitor in accordance with increase in storage capacity of the DRAM (see curve II).

In the DRAM, reading of storage information from memory cell MC is performed by sensing and amplifying a voltage (read voltage) $\Delta V$ appearing on bit line BL (or /BL). An absolute value of read voltage $\Delta V$ increases in accordance with increase of CS/CB, i.e., a ratio between capacitance value CS of memory cell capacitor MS and a capacitance value CB of bit line BL (or /BL). Bit line capacitance CB depends on the length of bit line BL (or /BL) and the number of access transistors MT connected thereto. In order to minimize the bit line capacitance CB, the DRAM usually employs a block division structure or the like so as to reduce the length of bit line and the number of memory cells connected thereto. The value of bit line capacitance CB can be reduced only to a limited extent. Therefore, it is necessary to maximize capacitance value CS of memory cell capacitor MS for increasing the absolute value of read voltage ΔV.

In the DRAM, when holes and electron pairs produced by incident α-rays change the quantity of accumulated charges, the value of read voltage ΔV changes, which impedes accurate reading of the memory cell data. In a static random access memory (SRAM), a memory cell has a structure of a flip-flop. In a memory cell of a flash memory (nonvolatile semiconductor memory device), a threshold voltage of a memory transistor depends on accumulated charges at a floating gate. An influence by incident α-rays on these memory cells is smaller than that on DRAM memory cells. In order to reduce an influence by the α-rays and produce a sufficient read voltage ΔV, the quantity of accumulated charges of memory cell capacitor MC in the DRAM is increased as large as possible. In particular, when operation power supply voltage VCC is of a small value of 2.5 V or 1.2 V, the quantity of charges accumulated in memory cell capacitor MS decreases, so that memory cell capacitor MS of a sufficiently large capacitance value is required.

In view of the above, it is necessary that the capacitance value of the memory cell capacitor of DRAM is substantially constant (30 to 35 fF) regardless of the degree of integration.

In FIG. 2, line I represents capacitance value Cg of the MOS capacitor, and line II represents the capacitance value per unit area in the case where two memory cell capacitors are connected in series. Line III represents the capacitance value of the actual memory cell capacitor. FIG. 2 also shows capacitance values C0 of the memory cell capacitor MS and MOS capacitor.

For example, in a 16-Mbit DRAM, the capacitance value of a capacitance using memory cell capacitor MS is 0.8 times as large as the capacitance value of the gate capacitor, as shown in FIG. 2. In a 64-Mbit DRAM, the capacitance value per unit area of the capacitance using memory cell capacitor MS is 1.5 times as large as the capacitance value per unit area of the gate capacitor. In a 256-Mbit DRAM, the capacitance value per unit area of the capacitance using memory cell capacitor MS is about 2.5 times as large as the capacitance value per unit area of the gate capacitor. Thus, in the DRAMs of and after the generation of 64-Mbit DRAM, the capacitance using memory cell capacitor MS has a higher area efficiency than the gate capacitor, and a difference in capacitance value between them rapidly increases in accordance with increase in storage capacity of the DRAM. The invention effectively utilizes the advantage of memory cell capacitor MS over the gate capacitor, and thereby achieves the capacitance element having a good area efficiency. In particular, the invention provides the capacitance element which achieves the capacitance value sufficiently larger than that of the gate capacitor with a small occupying area, and thus can have a good area efficiency, even if the memory cell capacitor is to be employed in the DRAM having a storage capacity smaller than 16 Mbits.

[Application Example 1 of the Invention]

Figure 3A:
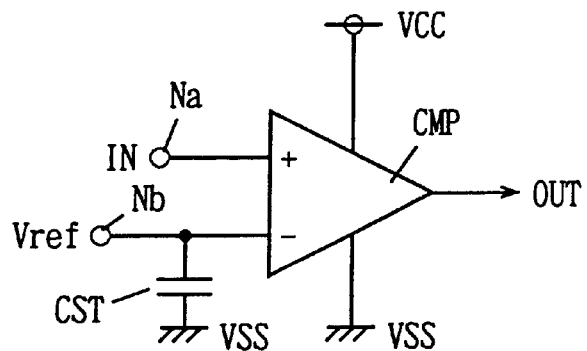
FIGS. 3A and 3B show an example of a structure of a semiconductor device according to the invention.
Figure 3B:
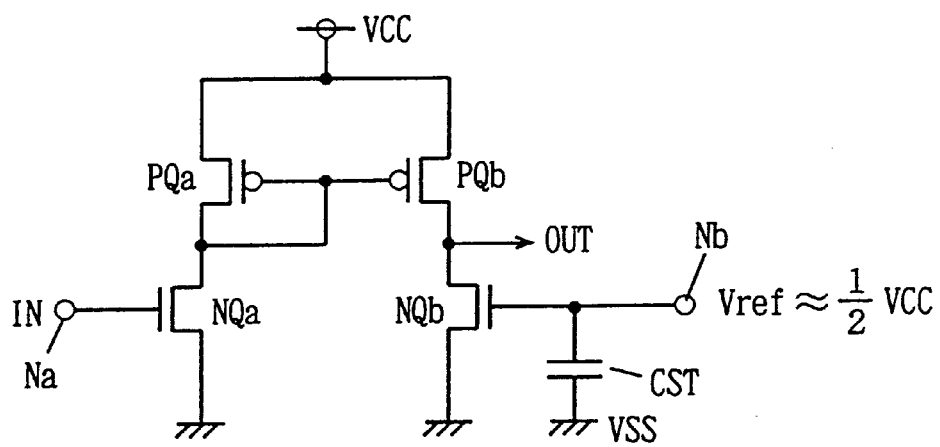

FIGS. 3A and 3B show a structure of a circuit to which the capacitance element of the invention is applied. FIG. 3A shows a comparison circuit CMP, which makes comparison between an input signal IN applied to an input node Na and a reference voltage Vref applied to a reference voltage input node Nb. Comparison circuit CMP uses power supply voltage VCC on power supply node VCC and ground voltage VSS on ground node VSS (nodes and voltages thereon are indicated by the same reference characters) as operation power supply voltages. When a level of an input signal IN is higher than reference voltage Vref, an output signal OUT is set to H-level. When the level of input signal IN is lower than reference voltage Vref, output signal OUT is set to L-level. A capacitance CST utilizing the memory cell capacitor according to the invention is arranged between reference voltage input node Nb and ground node VSS.

For fast transmission of the signal, input signal IN has small amplitude and voltage level. Particularly, such interfaces have recently been used that the H-level of input signal IN is 1.2 V and the amplitude of input signal IN is 0.8 V. In order to determine the logical level of such input signal IN for producing output signal OUT at a logical level corresponding to the input signal IN, the interface is provided with comparison circuit CMP shown in FIG. 3A.

FIG. 3B shows an example of an internal structure of comparison circuit CMP shown in FIG. 3A. In FIG. 3B, comparison circuit CMP includes p-channel MOS transistors PQa and PQb forming a current mirror circuit, and also includes n-channel MOS transistors NQa and NQb forming a comparison stage for input signal IN and reference voltage Vref. Gates of p-channel MOS transistors PQa and PQb are connected to a drain of n-channel MOS transistor NQa. Input signal IN is supplied to a gate of n-channel MOS transistor NQa, and reference voltage Vref is supplied to n-channel MOS transistor NQb.

The comparison circuit shown in FIG. 3B is known also as a current mirror type differential amplifier circuit. When input signal IN is higher than reference voltage Vref, a conductance of MOS transistor NQa is larger than that of MOS transistor NQb, so that a quantity of current flowing through MOS transistor NQa is larger than that flowing through MOS transistor NQb. MOS transistors PQa and PQb form the current mirror circuit, so that a current of the same quantity as the current flowing through MOS transistor NQa is supplied to MOS transistor NQb through MOS transistor PQb, provided that MOS transistors PQa and PQb have the same size. In this state, therefore, the potential level of output signal OUT rises. Conversely, when the potential level of input signal IN is lower than that of reference voltage Vref, the conductance of MOS transistor NQb is larger than that of MOS transistor NQa, so that MOS transistor NQb discharges a current, of which quantity is larger than that supplied through MOS transistor PQb. Thereby, the potential level of output signal OUT lowers. Reference voltage Vref is set to a voltage level equal to a half of power supply voltage VCC. The level of output signal OUT from comparison circuit CMP is converted into a signal level corresponding to the power supply voltage level for operation of the internal circuit.

For accurately and stably performing the comparison operation of comparison circuit CMP, it is important to stabilize the voltage level of reference voltage Vref which is the reference for comparison of the logical level of input signal IN.

A main factor which causes instability in the voltage level of reference voltage Vref is capacitive coupling noises which are caused by capacitive coupling between the line transmitting reference voltage Vref and a signal line adjacent to this reference voltage transmitting line. In order to increase the stability against these noises, capacitance element CST is arranged between reference voltage input node Nb and ground node Vss. Capacitance element CST utilizes a capacitor of the same structure as the memory cell capacitor structure which will be described later. Reference voltage Vref is at the voltage level of VCC/2. Therefore, capacitor CST can reliably have intended breakdown voltage characteristics, even if capacitance CST has the same insulating film as that of the memory cell capacitor. The memory cell capacitor has a good area efficiency as shown FIG. 2, capacitance element CST can be used to form the stabilizing capacitance which occupies a small area and has a required capacitance value.

[Modification]

Figure 4:
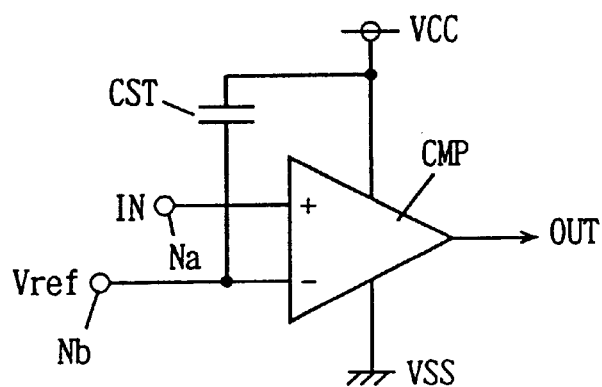
FIG. 4 shows a structure of a modification of the semiconductor device shown in FIGS. 3A and 3B.

FIG. 4 shows a structure of a first modification of this application example 1. In the structure shown in FIG. 4, capacitance CST is arranged between reference voltage input node Nb of comparison circuit CMP and power supply node VCC. The voltage level of reference voltage Vref is equal to VCC/2. A voltage difference between power supply voltage VCC and reference voltage Vref is equal to about VCC/2, and therefore, the capacitor for stabilizing reference voltage Vref can be similarly implemented even by the structure in which capacitance element CST is connected between reference voltage input node Nb and power supply node VCC.

[Application Example 2]

Figure 5A:
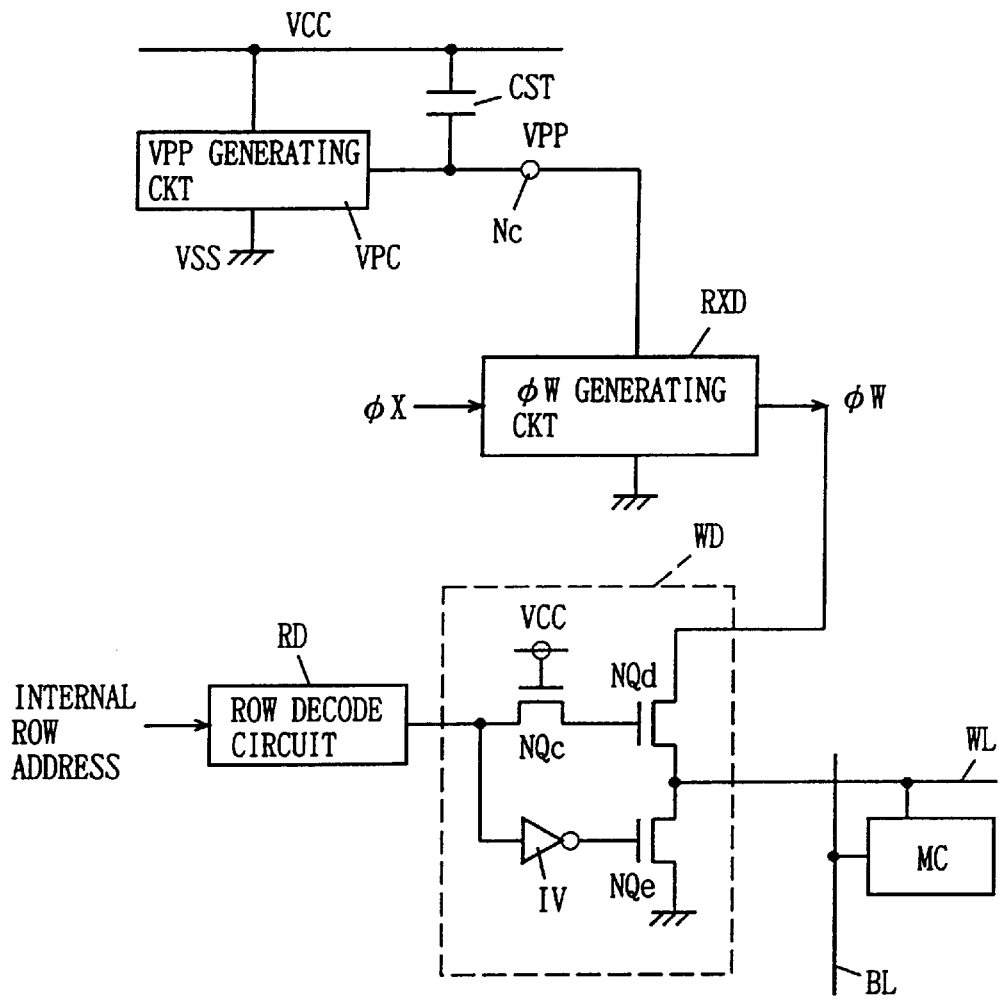
FIG. 5A shows another structure of a semiconductor device according to the present invention.

FIG. 5A schematically shows a structure of an application example 2 of this invention. In FIG. 5A, a semiconductor device includes a row decode circuit RD for decoding an internal row address signal, a $\phi W$ generating circuit RXD generating a word line drive signal $\phi W$ in accordance with a timing signal $\phi X$, and a word line drive circuit WD transmitting word line drive signal $\phi W$ to corresponding word line WL. A memory cell MC is arranged at a crossing between word line WL and bit line BL. Memory cell MC has a memory cell structure of 1-transistor/1-capacitor type which is the same as that shown in FIG. 1.

This semiconductor device includes a VPP generating circuit VPC, which uses power supply voltage VCC on power supply node (power supply line) VCC and ground voltage VSS on the ground node as the operation power supply voltages, and produces a voltage VPP higher than power supply voltage VCC. VPP generating circuit VPC usually includes a charge pump capacitor, and performs a charge pump operation to produce high voltage VPP at a predetermined level in response to a clock signal. This high voltage VPP is usually at a voltage level nearly 1.5 times higher than that of power supply voltage VCC. High voltage VPP supplied from VPP generating circuit VPC is supplied to $\phi W$ generating circuit RXD. $\phi W$ generating circuit RXD produces a word line drive signal $\phi WC$ at high voltage VPP level and supplies the same to word line drive circuit WD when timing signal $\phi X$ is active.

Word line drive circuit WD includes an inverter circuit IV receiving the output signal of row decode circuit RD, an n-channel MOS transistor NQc transmitting the output signal of row decode circuit RD therethrough, an n-channel MOS transistor NQd which is turned on in response to the voltage level transmitted through MOS transistor NQc to transmit word line drive signal $\phi W$ to word line WL, and an n-channel MOS transistor NQe which is turned on in response to H-level of the output signal of inverter circuit IV to drive word line WL to the ground potential level. MOS transistor NQc receives power supply voltage VCC on its gate.

A stabilizing capacitance CST is arranged between power supply node (power supply line) VCC and a node Nc from which high voltage VPP is issued. Stabilizing capacitance CST has a structure which will be described later in detail and is similar to that of the memory cell capacitor.

Figure 5B:
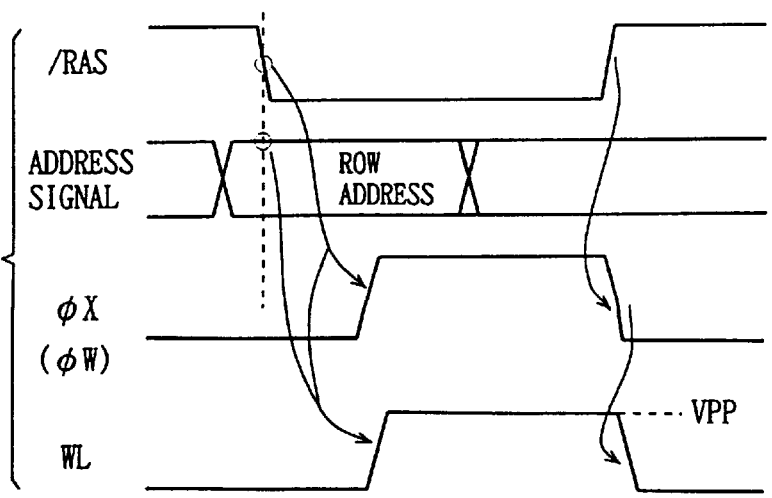
FIG. 5B shows an operation waveform of the device of FIG. 5A.

Referring to an operation waveform diagram shown in FIG. 5B, an operation of the circuit shown in FIG. 5A will now be described below.

When a row address strobe signal /RAS (not shown) falls from H-level to L-level, the DRAM is selected, and a memory selecting operation internally starts. In response to falling of row address strobe signal /RAS, an externally applied address signal is taken in as a row address signal, and the internal row address signal produced therefrom is applied to row decode circuit RD. Row decode circuit RD decodes the internal row address signal thus applied, and generates a signal at H-level when the corresponding word line is addressed. A signal issued from row decode circuit RD is sent to word line drive circuit WD.

Then, in response to falling of row address strobe signal /RAS, timing signal $\phi X$ is activated to attain H-level upon elapsing of a predetermined time, so that $\phi W$ generating circuit RXD generates word line drive signal $\phi W$ at high voltage VPP level. When word line drive circuit WD is selected, the output signal of inverter circuit IV attains L-level, so that a voltage at H-level is transmitted to a gate of MOS transistor NQd via MOS transistor NQc. MOS transistor NQd is turned on to transmit word line drive signal fW onto word line WL. MOS transistor NQc receives power supply voltage VCC on its gate, and is off when a signal at H-level is applied to the gate of MOS transistor NQd. Therefore, when word line drive signal $\phi W$ at high voltage VPP level is applied to a source of MOS transistor NQd, the gate potential of MOS transistor NQd rises owing to the self-bootstrap operation of MOS transistor NQd, and word line drive signal $\phi W$ at high voltage VPP level is transmitted onto word line WL, so that the potential level on selected word line WL attains high voltage VPP level.

Owing to transmission of high voltage VPP onto word line WL, the voltage at power supply voltage VCC level can be transmitted from the bit line to the storage node of memory cell capacitor without a loss of threshold voltage of the access transistor included in memory cell MC. The access transistor of memory cell MC connected to word line WL thus selected is turned on, and charges on the storage node of memory cell capacitor are transmitted onto bit line BL. Data read onto bit line BL is sensed, amplified and latched by a sense amplifier (not shown). Thereafter, a column decoder (not shown) operates to select a column in this selected row, whereby data is read from or written into the memory cell.

High voltage VPP is transmitted onto selected word line WL through $\phi W$ generating circuit RXD. Therefore, when word line WL is selected, high voltage VPP is consumed, so that the voltage level of high voltage VPP from VPP generating circuit VPC may lower. Stabilizing capacitor CST is arranged for preventing lowering of the voltage level of high voltage VPP. By using the memory cell capacitor structure as this stabilizing capacitance CST, the stabilizing capacitance occupying a small area can be achieved. High voltage VPP is at the voltage level which is 1.5 times higher than power supply voltage VCC. In the structure where stabilizing capacitance CST is arranged between output node Nc of high voltage VPP and power supply node (power supply line) VCC, a voltage difference between power supply node (power supply line) VCC and output node Nc is 0.5·VCC. Therefore, use of the memory cell capacitor structure in stabilizing capacitance CST does not cause any problem relating to its breakdown voltage.

In the word line drive circuit WD shown in FIG. 5A, the gate of MOS transistor NQc may be supplied with high voltage VPP. In this case, a level converter circuit is arranged at an output stage of row decode circuit RD, which generates from its output stage the word line select signal at high voltage VPP level. Such a structure may be employed that φW generating circuit RXD receives the address signal in addition to timing signal φX, and decodes the address signal to transmit the active word line drive signal only to the selected word line.

[Application Example 3]

Figure 6A:
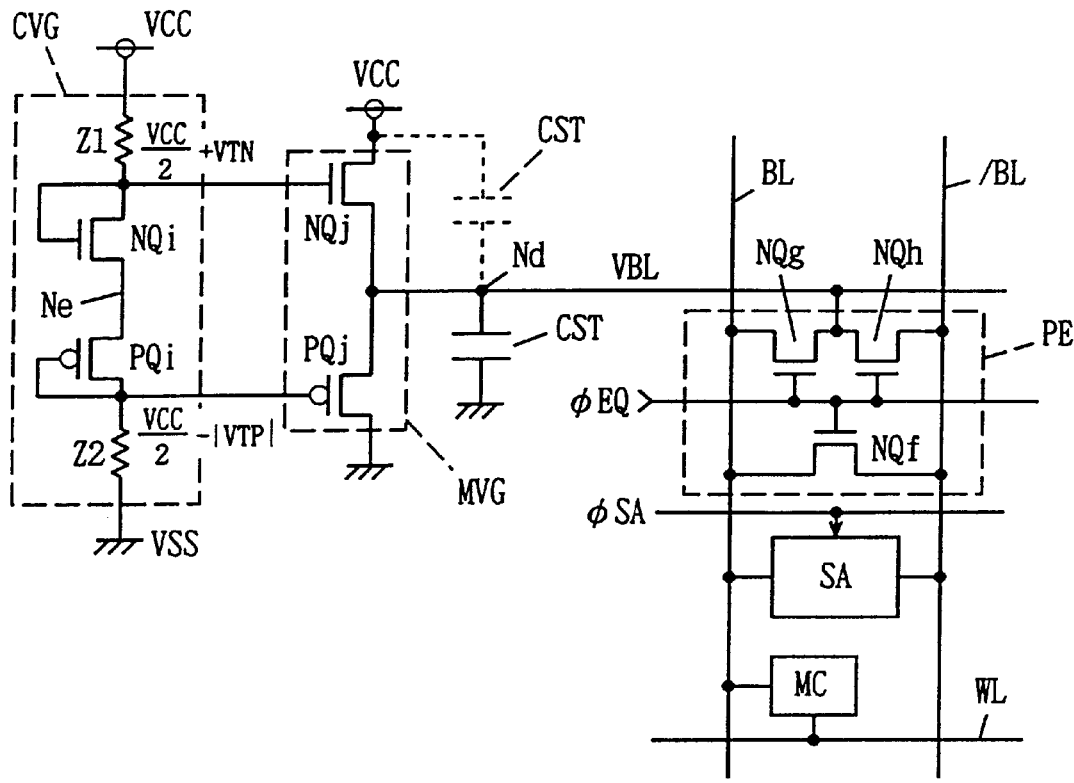
FIG. 6A shows still another structure to which the invention is applied.

FIG. 6A shows a structure of a third application example of the capacitance element of the invention. In FIG. 6A, a semiconductor device (DRAM) includes paired bit lines BL and /BL, word line WL, memory cell MC arranged at the crossing between word line WL and bit line BL, a sense amplifier SA which is activated in response to a sense amplifier activating signal USA to amplify a potential difference between bit lines BL and /BL, and a precharge/equalize circuit PE which is activated in response to precharge/equalize instructing signal φEQ to precharge and equalize bit lines BL and /BL to intermediate potential VBL. Bit lines BL and /BL have a so-called "folded bit line" structure, in which only one of bit lines BL and /BL in each pair is connected to memory cell MC in each row. In FIG. 6A, only memory cell MC arranged at the crossing between word line WL and bit line BL is representatively shown.

Precharge/equalize circuit PE includes n-channel MOS transistors NQg and NQh, which are turned on in response to precharge/equalize signal φEQ to transmit intermediate voltage VBL to bit lines BL and /BL, respectively, and n-channel MOS transistor NQf which is turned on in response to precharge/equalize instructing signal φEQ to electrically short-circuit bit lines BL and /BL. Intermediate voltage VBL is usually at the voltage level equal to half the level of power supply voltage VCC.

The bit line precharge voltage generating circuit includes a control voltage generating circuit CVG which is coupled between power supply node VCC and ground node VSS, and produces a first control voltage VCC/2+VTN and a second control voltage VCC/2−|VTP|, an intermediate voltage generating circuit MVG which produces intermediate voltage VBL in accordance with the first and second control signals from control voltage generating circuit CVG, and stabilizing capacitance CST coupled between intermediate voltage output node Nd and ground node VSS.

Control voltage generating circuit CVG includes a high-resistance resistance element Z1 having a one end coupled to power supply node VCC, a diode-coupled n-channel MOS transistor NQi coupled between the other end of resistance element Z1 and node Ne, a high-resistance resistance element Z2 having a one end coupled to ground node VSS, and a diode-coupled p-channel MOS transistor PQi coupled between the other end of high-resistance resistance element Z2 and node Ne. MOS transistors NQi and PQi have threshold voltages VTN and VTP, respectively. The potential level on node Ne is substantially VCC/2. Resistance elements Z1 and Z2 have high resistance values. MOS transistors NQ1 and PQ1 operate in a diode mode to cause voltage drops by absolute values of their threshold voltages, respectively. Therefore, the gate to drain potential of MOS transistor NQi is equal to VCC/2+VTN, and the gate to drain potential of MOS transistor PQi is equal to VCC/2−|VTP|.

Intermediate voltage generating circuit MVG includes an n-channel MOS transistor NQj coupled between power supply node VCC and output node Nd, and receiving on its gate the first control voltage, and a p-channel MOS transistor PQj coupled between output node Nd and ground node VSS and receiving on its gate the second control voltage. MOS transistors NQj and PQj operate in a source follower mode.

When the voltage level on output node Nd exceeds VCC/2, a voltage between the gate and source of MOS transistor NQj becomes smaller than the threshold voltage of MOS transistor NQj, so that MOS transistor NQj is turned off. Meanwhile, the absolute value of voltage between the gate and source of MOS transistor PQj exceeds the absolute value of threshold voltage of MOS transistor PQj, so that MOS transistor PQj is turned on to lower the potential level on output node Nd. Conversely, when the potential level on output node Nd lowers below VCC/2, MOS transistor NQj is turned on, and MOS transistor PQj is turned off. Therefore, the intermediate voltage VBL from output node Nd is kept at nearly half the voltage level of power supply voltage VCC. An operation of the semiconductor device shown in FIG. 6A will now be described below with reference to an operation waveform diagram of FIG. 6B.

Figure 6B:
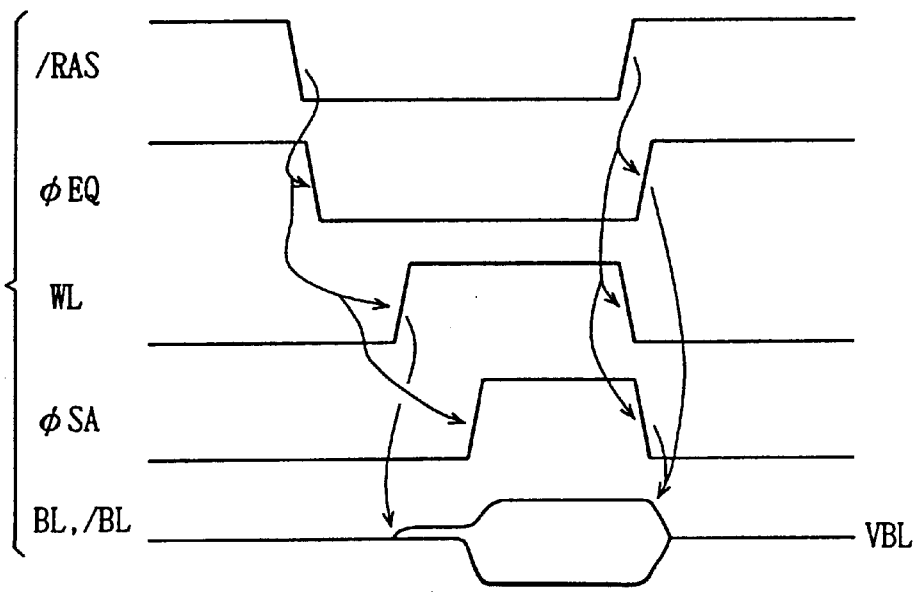
FIG. 6B shows an operation waveform representing an operation thereof.

When row address strobe signal /RAS falls to L-level, the memory cycle starts, so that precharge/equalize signal φEQ attains L-level, and all MOS transistors NQf–NQh included in precharge/equalize circuit PE are turned off. Thereby, bit lines BL and /BL are electrically floated at intermediate voltage VBL. Then, the potential on word line WL rises, and storage information of memory cell MC is read onto bit line BL. FIG. 6B shows, as an example, operation waveforms in the case where memory cell MC has stored information at H-level and the potential on bit line BL rises. When a potential difference between bit lines BL and /BL sufficiently increases thereafter, sense amplifier activating signal USA is activated to activate sense amplifier SA, so that the potential difference between bit lines BL and /BL is increased, and the potential difference between bit lines BL and /BL is driven to a level between power supply voltage VCC and ground voltage VSS. Thereafter, data is read or written through a column select circuit (not shown) and a read/write circuit (not shown).

When row address strobe signal /RAS rises to H-level, the memory cycle is completed, so that the potential on selected word line falls to L-level. Thereby, information latched by sense amplifier SA is written into memory cell MC (i.e., restoring is performed), and then sense amplifier SA is deactivated in response to deactivation of sense amplifier activating signal φSA. Then, precharge/equalize instructing signal φEQ is set to the active state of H-level, and precharge/equalize circuit PE is activated so that bit lines BL and /BL are precharged to intermediate voltage VBL.

DRAM includes a large number of bit lines BL and /BL, and the bit line precharge voltage generating circuit supplies intermediate voltage VBL to these many bit lines BL and /BL. Therefore, intermediate voltage VBL is consumed during precharging of bit lines BL and /BL. MOS transistor NQf for equalizing operates to move charges between bit lines BL and /BL, so that the potential levels on bit lines BL and /BL are driven to the intermediate potential level. In spite of this operation, such precharging consumes intermediate voltage VBL. Stabilizing capacitor CST is arranged at output node Nd so that lowering of the voltage level of intermediate voltage VBL can be prevented, and bit lines BL and /BL can be precharged stably to a predetermined voltage level and can be held at the intermediate voltage level. As the stabilizing capacitance CST, a memory cell capacitor structure which will be described later in detail is utilized. Thereby, the stabilizing capacitance having a good area efficiency can be implemented. Intermediate voltage VBL is at the voltage level equal to a half of power supply voltage VCC. Therefore, the level of voltage applied across the electrodes of stabilizing capacitance CST is VCC/2, and the breakdown voltage characteristics of stabilizing capacitance CST is ensured even if the memory cell capacitor structure is utilized.

As represented by broken line in FIG. 6A, stabilizing capacitance CST may be arranged between power supply node VCC and output node Nd, in which case a similar effect can be achieved.

[Application Example 4]

Figure 7:
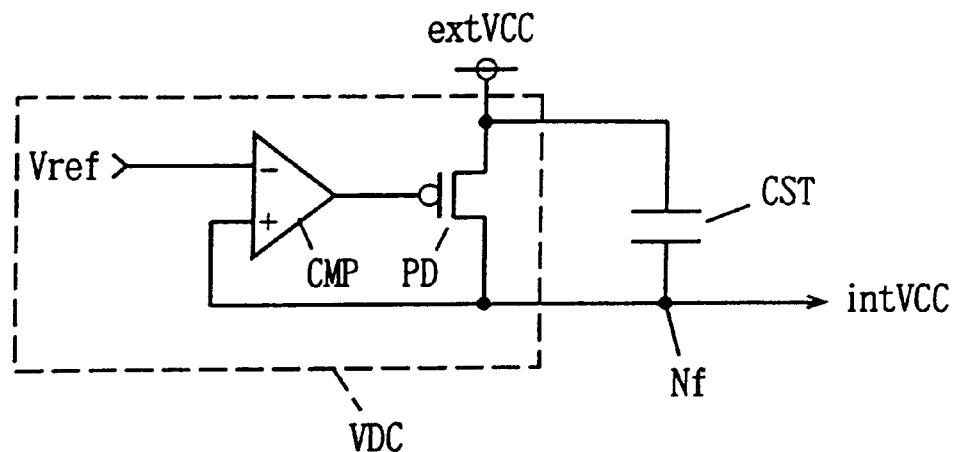
FIG. 7 shows yet another structure of a semiconductor device according to the present invention.

FIG. 7 shows a structure of a main portion of a semiconductor device which is a fourth application example of the invention. In FIG. 7, the semiconductor device includes an internal voltage down-converting circuit VDC which down-converts an external power supply voltage extVCC applied to an external power supply node extVCC to produce an internal power supply voltage intVCC. Internal voltage down-converting circuit VDC includes comparison circuit CMP performing comparison between reference voltage Vref and internal power supply voltage intVCC, and a drive transistor PD formed of a p-channel MOS transistor which supplies a current from external power supply node extVCC to output node (internal power supply line) Nf in accordance with an output signal of comparison circuit CMP.

When internal power supply voltage intVCC is higher than reference voltage Vref, the output signal of comparison circuit CMP is at H-level, so that drive transistor PD is turned off.

When the voltage level of internal power supply voltage intVCC is lower than reference voltage Vref, the voltage level of comparison circuit CMT lowers, and the conductance of drive transistor PD increases, so that a current is supplied from external power supply node extVCC to output node (internal power supply line) Nf, and thereby the voltage level of internal power supply voltage intVCC rises. Therefore, internal power supply voltage intVCC attains the voltage level substantially equal to reference voltage Vref.

Usually, the voltage level of internal power supply voltage intVCC, i.e., reference voltage Vref is set to about $2/3$ of external power supply voltage extVCC. Therefore, the voltage difference between external power supply voltage extVCC and internal power supply voltage intVCC is extVCC/3. Meanwhile, the voltage applied to the cell plate of memory cell capacitor is intVCC/2=extVCC/3.

Therefore, the voltage difference between external power supply voltage extVCC and internal power supply voltage intVCC is equal to the voltage applied across the electrodes of memory cell capacitor. Therefore, the breakdown voltage characteristics of stabilizing capacitance CST can be sufficiently ensured even in the structure where stabilizing capacitance CST is arranged between output node (internal power supply line) Nf of internal voltage down-converting circuit VDC and external power supply node extVCC, and for this stabilizing capacitance, the memory cell capacitor structure as shown in FIG. 7 can be employed. Therefore, even in the case where internal power supply voltage intVCC lowers due to flow of a large current during charging and discharging of bit lines, stabilizing capacitance CST can suppress variation of internal power supply voltage intVCC. In particular, owing to utilization of the memory cell capacitor structure, stabilizing capacitance CST can have a good area efficiency. Specific structures of the stabilizing capacitance according to the invention will now be described below.

[Memory Cell Structure]

Figure 8:
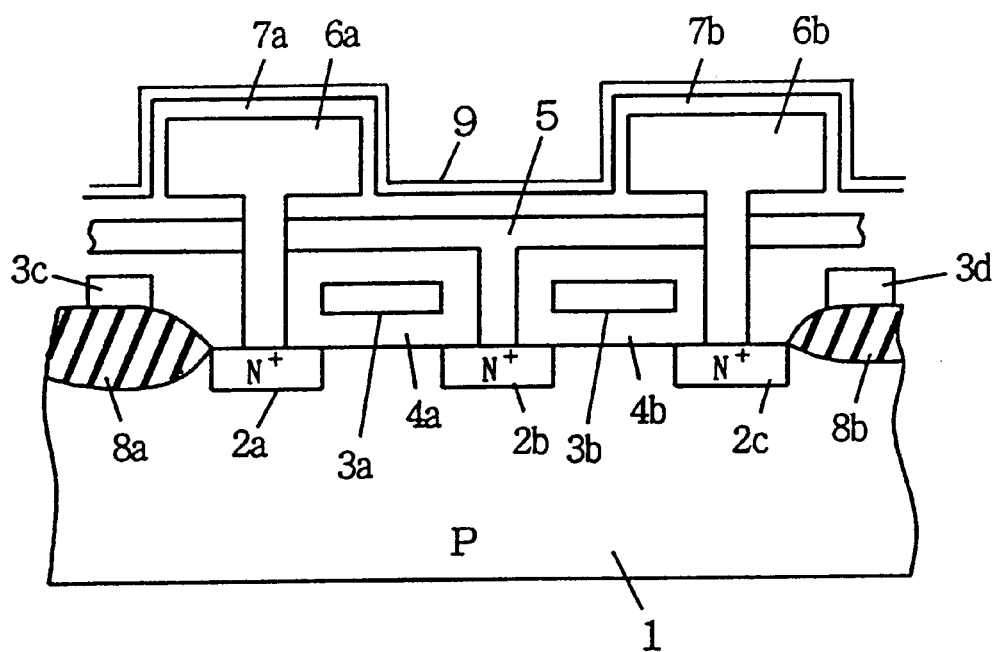
FIG. 8 schematically shows a cross sectional structure of a memory cell of a DRAM to which the invention is applied.

The memory cell structure of a DRAM, which is an example of the semiconductor device to which the invention is applied, includes a memory cell capacitor of a stacked capacitor structure. The stacked capacitor may have any one of fin-shaped, cylindrical and T-shaped structures. The electrode layer for storage node may have an irregular surface provided with spherical dimples. FIG. 8 shows a typical example of a structure of the memory cell including a T-shaped stacked capacitor.

In FIG. 8, a plurality of (three) heavily doped N-type impurity regions 2a, 2b and 2c are arranged with a space between each other at a surface of a P-type semiconductor substrate region 1. The semiconductor substrate region 1 may be the semiconductor substrate itself, or may be an epitaxial layer or a well region. Semiconductor substrate region 1 may have any structure, provided that it has a function as a substrate for a memory cell.

On a surface of semiconductor substrate region 1 between impurity regions 2a and 2b, there is arranged a gate electrode layer (word line) 3a having a predetermined pattern with a gate insulating film 4 therebetween. A gate electrode layer (word line) 3b is arranged on the surface of semiconductor substrate region 1 between impurity regions 2b and 2c with a gate insulating film 4b therebetween. Gate electrode layers 3a and 3b are made of polycrystalline silicon of a low resistance doped with impurity. Alternatively, gate electrode layers 3a and 3b may have composite structures of a low resistance made of polycrystalline silicon and a metal having a high melting point (refractory metal) such as tungsten or molybdenum. Also, they may have high melting point (refractory) metal silicide structure of a low resistance. As will be described later in detail, the memory cells are arranged in a matrix of rows and columns. Gate electrode layers 3a and 3b are arranged corresponding to each row of memory cells, and are connected to the memory cells in the corresponding rows.

At impurity region 2a, there is arranged conductive layer 6a forming a storage node of a memory cell capacitor. Likewise, a conductive layer 6b forming a storage node and having a T-shaped section is formed at impurity region 2c. Conductive layers 6a and 6b forming these storage nodes are made of polycrystalline silicon of a low resistance doped with impurity. Conductive layers 6a and 6b are electrically connected to corresponding impurity regions 2a and 2c, respectively, and each of them has an upper portion having a square section of a relatively large height for the purpose of increasing an area opposed to a cell plate which will be described later. Here, "to be electrically connected" means connection allowing transmitting and receiving of electrical signals between the regions. Between the conductive layer and the impurity region, another interconnection layer (e.g., barrier layer) may be present, or they may be connected together via a switching transistor.

A conductive layer 5 forming a bit line is electrically connected to impurity region 2b. Conductive layer 5 is shown being arranged above gate electrode layers 3a and 3b and under the upper portions of the storage nodes. However, conductive layer 5 forming the bit line may be arranged above the storage node and a cell plate which will be described later. The conductive layer 5 forming the bit line may have a composite structure made of high melting point metal such as tungsten and polycrystalline silicon, or may have a high melting point metal silicide structure. Conductive layer 5, which extends in the column direction of memory cells, is arranged corresponding to each row and is connected to the memory cells in the corresponding column.

Element isolating films 8a and 8b made of, e.g., LOCOS (Local Oxidation of Silicon) films neighboring to impurity regions 2a and 2c are formed for achieving isolation from adjacent memory cells. Gate electrode layers (word lines) 3c and 3d arranged for the memory cells in adjacent rows are formed on element isolation films 8a and 8b.

A conductive layer 9 forming a cell plate is arranged on and opposed to the surfaces of conductive layers 6a and 6b forming storage nodes with insulating films 7a and 7b therebetween, respectively. Conductive layer 9 forming the cell plate is made of polycrystalline silicon of a low resistance doped with impurity. Capacitor insulating films 7a and 7b each has a double-layer structure formed of a silicon nitride film and a silicon oxide film, and have a large dielectric constant, which increases an effective thickness of the capacitor dielectric films.

In the structure shown in FIG. 8, one memory cell is formed of impurity regions 2a and 2b, gate electrode layer 3a, conductive layer 6a serving as a storage node, insulating film 7a and conductive layer 9 serving as a cell plate. Another memory cell is formed of impurity regions 2b and 2c, gate insulating layer 3b, conductive layer 6b, insulating film 7b and conductive layer 9. Owing to common use of one impurity region 2b by the adjacent memory cells, an area occupied by the memory cells can be reduced.

As can be seen from the structure shown in FIG. 8, the memory cell capacitor is arranged such that, in a plan view, the memory cell capacitor overlaps with the transistor of the memory cell, i.e., access transistor. Owing to this three-dimensional cell structure, the area occupied by the cell is reduced. Conductive layers 6a and 6b forming the storage nodes have relatively thick upper portions. This increases an area of the portion opposed to conductive layer 9 forming the cell plate. Thus, the area of opposed portion is increased without increasing the occupied area in the plan view, and therefore can increase the capacitance value of the memory cell capacitor. Thus, the capacitor of the stacked capacitor structure achieves a good area efficiency. This invention utilizes this structure of the memory cell capacitor.

[Embodiment 1]
[Capacitance Element 1]

Figure 9A:
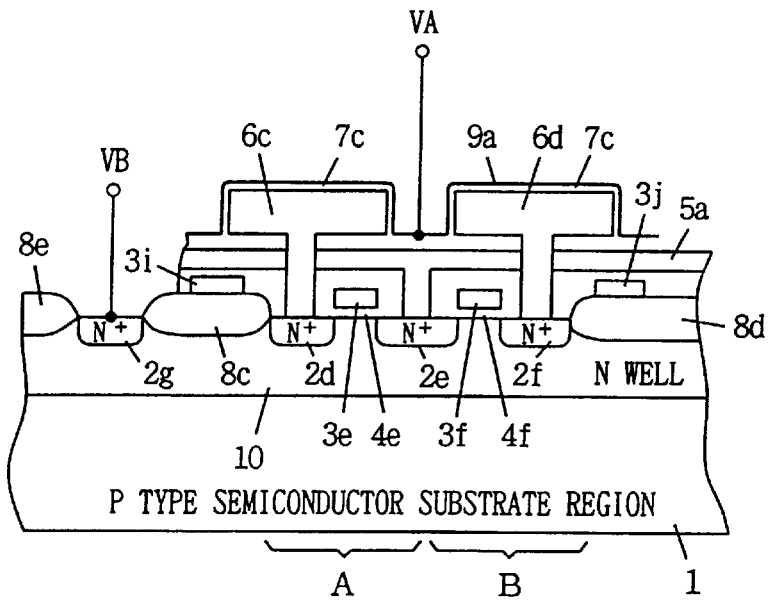
FIGS. 9A and 9B show a cross sectional structure and a planar layout of a capacitance element of an embodiment 1 of the invention, respectively.
Figure 9B:
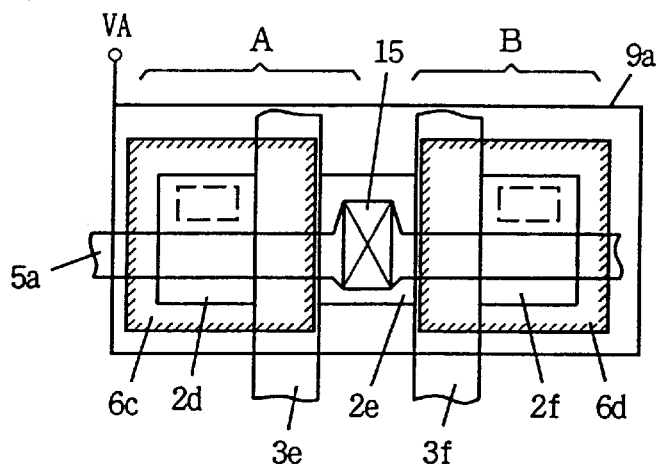

FIGS. 9A and 9B schematically show a structure of a capacitance element according to an embodiment 1 of the invention. In FIG. 9A, an N-well (N-type semiconductor layer) 10 is formed as a semiconductor substrate region of a first conductivity type on the surface of P-type semiconductor substrate region 1. A capacitance element having the same structure as the memory cell shown in FIG. 8 is formed using N-well 10 as its substrate region. More specifically, heavily doped N-type impurity regions 2d–2g are formed at the surface of N-well 10 with a space between each other. Impurity regions 2d–2g are formed by the same manufacturing process as impurity regions 2a–2c of the memory cell shown in FIG. 8. In the following description, components shown in FIG. 8 and components shown in FIG. 9A which bear the same reference numbers except for suffixes are formed by the same manufacturing process.

A element isolating film 8d made of, e.g., thermal oxidation film for element isolation is formed adjacent to impurity region 2f. Element isolating film 8c is formed between impurity regions 2d and 2g, and element isolating film 8e is formed in contact with an outer side of impurity region 2g. Element isolating films 8e and 8d define a capacitance element formation region. Gate electrode layer 3e serving as third or fourth conductive layer is formed on semiconductor substrate region (N-well) 10 between impurity regions 2d and 2e with gate insulating film 4e therebetween. Conductive layer 3f is formed on the surface of semiconductor region 10 between impurity regions 2e and 2f with gate insulating film 4f therebetween. Conductive layers 3i and 3j are formed on element isolating films 8c and 8d, respectively. Conductive layers 3e, 3f, 3i and 3j are made of polycrystalline silicon metal having a low resistance doped with impurity or a high melting point metal, or a high melting point metal silicide, similarly to gate electrode layers 3a and 3b shown in FIG. 8, and are formed at the same interconnection layer. Thus, conductive layers 3e, 3f, 3i and 3j are conductive layers corresponding to the word lines.

For impurity regions 2d and 2f, first conductive layers 6c and 6d each having a T-shaped section are formed, and are electrically connected to impurity regions 2d and 2f, respectively. Each of first conductive layers 6c and 6d has a plug portion (leg portion) electrically connected to corresponding impurity region 2d and 2f and a flat portion having a relatively large surface area for forming a capacitance. Conductive layers 6c and 6d are formed by the same manufacturing process as conductive layers 6a and 6b forming the storage nodes of memory cells shown in FIG. 8, and have the same structures and materials (impurity-doped polycrystalline silicon) as conductive layers 6a and 6b. First conductive layers 6c and 6d have predetermined pattern, and are isolated from each other by an interlayer insulating film (not explicitly shown).

On conductive layers 6c and 6d, there is formed a second conductive layer 9a which is opposed to conductive layers 6c and 6d with an insulating film 7c therebetween and is made of a low resistance polycrystalline silicon heavily doped with impurity. Second conductive layer 9a is electrically connected to one of electrode nodes VA.

Impurity region 2g formed at the surface of semiconductor substrate region 10 is connected to other electrode node VB.

Impurity region 2e is electrically connected to a third conductive layer 5a extending horizontally in the figure. Third conductive layer 5a which corresponds to conductive layer 5 forming the bit line of memory cell shown in FIG. 8 is formed by the same manufacturing process, and is made of the same material (e.g., high melting point metal silicide) as conductive layer 5 corresponding to this bit line.

In the structure shown in FIG. 9A, second conductive layer 9a forms one of electrodes, and first conductive layers 6c and 6d are electrically connected to N-well (semiconductor substrate region) 10 through impurity regions 2d and 2f, and are further connected electrically to other electrode node VB. Therefore, capacitances formed at regions A and B are connected in parallel with each other between electrode nodes VA and VB. Nodes which are supplied with voltages having a voltage difference of VCC/2 are connected to electrode nodes VA and VB, respectively, whereby the stabilizing capacitance can be implemented.

The capacitance element shown in FIG. 9A has the same structure as the memory cell, and the capacitance element formed at regions A and B occupies a sufficiently reduced area. Capacitor insulating film 7c has a two-layer structure formed of a silicon nitride film and a silicon oxide film similarly to capacitor insulating films 7a and 7b in the memory cells, and therefore can achieve a sufficiently large capacitance value with a small occupying area.

The capacitance element formed at regions A and B has the same structure as the memory cells, so that components thereof can be formed in the same steps as those of forming the corresponding components of the memory cells except for formation of semiconductor substrate region (N-well) 10. Therefore, it is possible to provide the capacitance having a good area efficiency without increasing the number of manufacturing steps of the DRAM.

FIG. 9B shows a plane layout of the capacitance element shown in FIG. 9A. In FIG. 9A, conductive layer 3e is arranged between impurity regions 2d and 2e, and conductive layer 3f is arranged between impurity regions 2e and 2f. Impurity region 2e is electrically connected to conductive layer 5a corresponding to the bit line through a contact hole 15. Conductive layers 3e and 3f are arranged perpendicularly to conductive layer 5a. This is because the capacitance element has the same structure as the memory cells, and specifically because conductive layers 3e and 3f correspond to the word lines, and conductive layer 5a corresponds to the bit line. Impurity region 2d is electrically connected to conductive layer 6c through a plug portion indicated by broken line. Impurity region 2f is electrically connected to conductive layer 6a through a plug portion indicated by broken line. Conductive layer 9a is arranged on conductive layers 6c and 6d. Conductive layers 6c and 6d forming electrode nodes of the capacitances have extended portions located above conductive layers 3e and 3f, respectively.

As shown in FIG. 9A, the upper flat portions of conductive layers 6c and 6d are thick and therefore have side surfaces of sufficiently large areas. Therefore, conductive layer 9a has portions of a sufficiently large area opposed to conductive layers 6c and 6d. Thus, it is possible to provide the capacitance having a distinctive feature of the memory cell capacitor of DRAM, i.e., the feature that a large capacitance value is achieved with a small occupying area. An appropriate number of capacitance elements each having the same structure as that shown in FIGS. 9A and 9B are arranged in the row and column direction similarly to the array of memory cells.

Figure 10A:
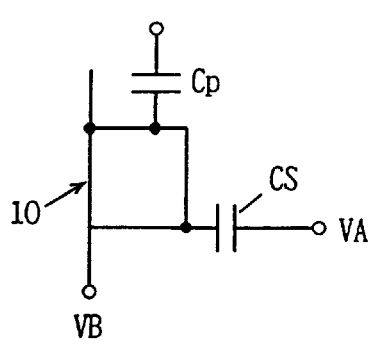
FIG. 10A shows an electrically equivalent circuit of a unit capacitance element forming the capacitance element of the embodiment 1 of the invention.
Figure 10B:
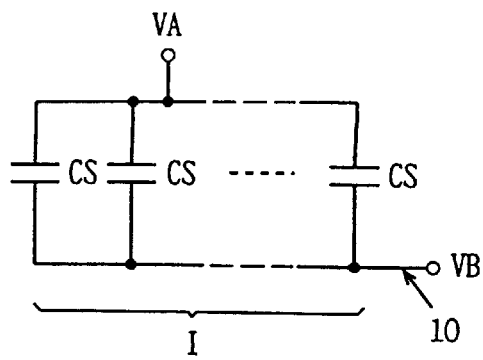
FIG. 10B shows an electrically equivalent circuit of the capacitance element according to the invention.

FIGS. 10A and 10B are electrically equivalent circuit diagrams showing one unit capacitance element and the capacitance element according to the invention, respectively. As shown in FIG. 10A, one unit capacitance element includes a capacitor CS (corresponding to memory cell capacitor MS) formed of conductive layers 9a and 6 (6c or 6d), and a capacitor Cp formed of conductive layer 3 (3e or 3f) and semiconductor substrate region (N-well) 10. Capacitances Cp and CS are connected in parallel to semiconductor substrate region 10. One of electrodes of capacitance CS is connected to node VA. Semiconductor substrate region 10 is connected to the other electrode node VB. Conductive layers 3 (3e, 3f, 3i and 3a) forming capacitors Cp may be electrically floated, or may be stationarily connected to receive a constant potential. Capacitance Cp corresponds to the gate capacitance of access transistor of the memory cell. Therefore, the capacitance Cp has a breakdown voltage equal to or higher than power supply voltage VCC, and a reliability is not impaired even if power supply voltage VCC is stationarily applied to conductive layer 3. The capacitance CS corresponding to the memory cell capacitor has the sufficiently thin insulating film, and therefore has a small breakdown voltage. However, a voltage applied across electrode nodes VA and VB is at a voltage level of VCC/2, so that its reliability is not impaired in any way.

In FIG. 10B, a plurality of capacitances CS are connected in parallel between electrode nodes VA and VB. In FIG. 10B, capacitors Cp are not shown because they are smaller than capacitances CS. As shown in FIG. 10B, the capacitance element including the capacitances CS, which are connected in parallel between VA and VB and are X in number, provides the capacitance value of X·CS. By coupling in parallel a required number of unit capacitance elements CS corresponding to the memory cell capacitors, it is possible to provide the capacitance element having a required capacitance value with a small occupying area.

According to the first capacitance element of the invention, as described above, the same structure as the memory cell, and in particular, the same structure as the memory cell capacitor is utilized, and a plurality of memory cell capacitors are coupled in parallel, so that the capacitance element having a required capacitance value can be easily implemented with a small occupying area. Further, the capacitance element can be produced in the same process as the memory cell, so that the number of steps in the manufacturing process does not increase, and thus the cost does not increase.

[Capacitance Element 2]

Figure 11A:
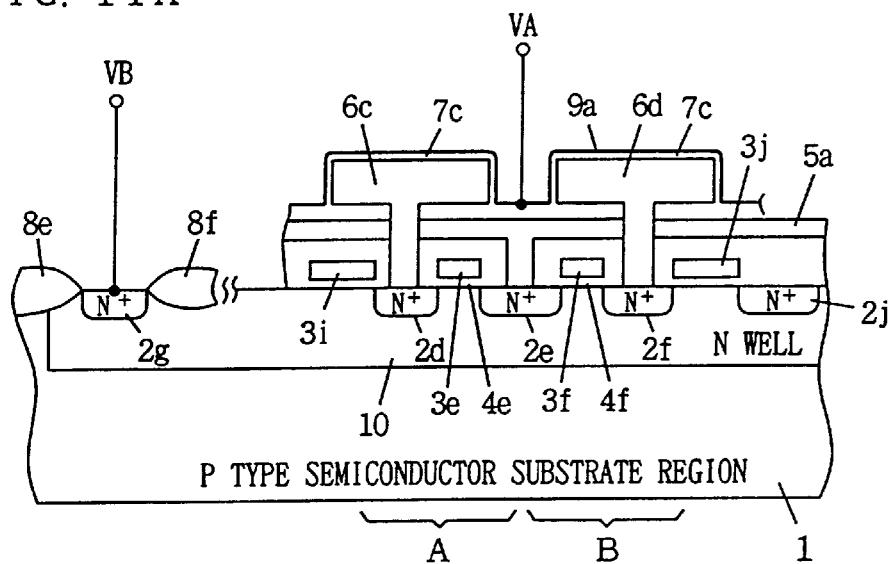
FIGS. 11A and 11B show a modification of the embodiment 1 of the invention and an electrically equivalent circuit of a unit capacitance element of the same, respectively.

FIG. 11A schematically shows a second structure of the capacitance element according to the invention. The structure shown in FIG. 11A does not include field insulating films 8c and 8d shown in FIG. 9A and corresponding to the element isolating films for isolating the memory cells. Therefore, conductive layers 3i and 3j located at positions corresponding to field insulating films 8c and 8d shown in FIG. 9A are arranged on the surface of semiconductor substrate region 10 with a gate insulating film therebetween. Field insulating films 8e and 8f are formed adjacent to impurity region 2g for coupling semiconductor substrate region (N-well) 10 to electrode node VB. Field insulating film 8f is provided only for isolating impurity region 2g from impurity regions which are provided for forming other unit capacitance elements. Since semiconductor substrate region (N-well) 10 is coupled to electrode node VB via impurity region 2g, field insulating film 8f is not essential. In place of the field insulating film 8f formed at this region, an impurity region 2i may be formed at the same region, so that the surface resistance of the semiconductor substrate region (N-well) can be reduced.

The element isolating films are used for isolating memory cells and others from each other. All the impurity regions formed at the surface of semiconductor substrate region (N-well) 10 are electrically connected together. Therefore, elimination of the element isolating films causes no problem. The field insulating film corresponding to the element isolating film is sufficiently thicker than the gate insulating film. Therefore, a distance from conductive layers 3i and 3j to semiconductor substrate region (N-well) 10 can be reduced, and the capacitance value of capacitance formed between conductive layers 3i and 3j and N-well (semiconductor substrate region) 10 can be increased, and therefore the capacitance value of capacitance element can be further increased.

Figure 11B:
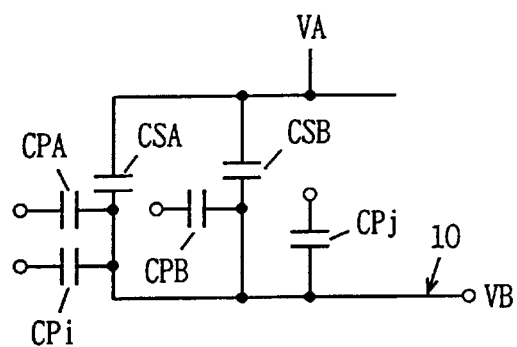

FIG. 11B shows an electrically equivalent circuit of the capacitance element shown in FIG. 11. In FIG. 11B, a capacitance CSA formed of a unit capacitance element at region A and a capacitance CSB formed of a unit capacitance element at region B are coupled in parallel with each other between node VA and semiconductor substrate region 10. Capacitances CPA and CPB provided by conductive layers 3e and 3f are connected in parallel to capacitances CSA and CSB, respectively. Capacitances CPi and CPj, which are provided by conductive layers 3i and 3j, respectively, are also connected to semiconductor substrate region (N-well) 10 owing to elimination of the field insulating film for the element isolating film. Semiconductor substrate region 10 is electrically connected to electrode node VB.

As can be seen from FIG. 11B, the field insulating film corresponding to the element isolating film is eliminated to reduce a distance from conductive layers 3i and 3j to semiconductor substrate region (N-well) 10, whereby the capacitance values of capacitances CPi and CPj increase, and such capacitances in a parallel arrangement is connected to semiconductor substrate region (N-well) 10. Therefore, the capacitance value between electrode nodes VA and VB can be large, and the capacitance element can have a large capacitance value with a small occupying area.

[Capacitance Element 3]

Figure 12:
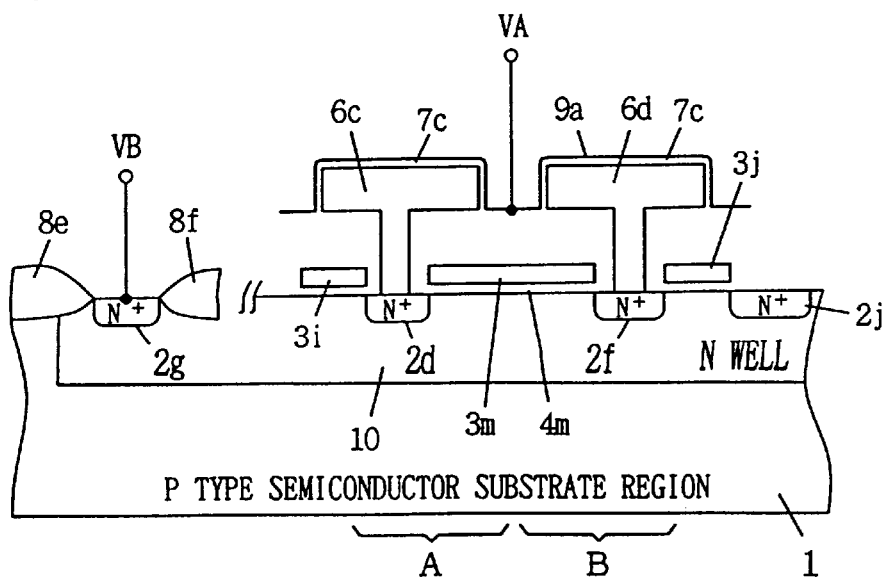
FIG. 12 shows a structure of a second modification of the embodiment 1 of the invention.

FIG. 12 schematically shows a structure of a third capacitance element according to the invention. The structure shown in FIG. 12 is not include a conductive layer 5a corresponding to the bit line. Also, there is no impurity region connected to conductive layer 5a corresponding to the bit line. A long substrate surface region is present between impurity regions 2d and 2f electrically connected to conductive layers 6c and 6d corresponding to the storage nodes, respectively. A conductive layer 3m is formed on the semiconductor substrate region (N-well) 10 between impurity regions 2d and 2f with a gate insulating film 4m therebetween. Conductive layer 3m is manufactured in the same process and of the same material as the conductive layers 3i and 3j. Structures other than the above are the same as those shown in FIG. 11A. Corresponding parts and portions bear the same reference characters, and will not be described below.

The structure shown in FIG. 12 is not include an impurity region connected to the conductive layer corresponding to the bit line, and alternatively, conductive layer 3m corresponding to the word line is extended to the same region. In contrast to the structure shown in FIG. 11A, the capacitance value of the capacitance formed of conductive layer 3m, gate insulating film 4m and semiconductor substrate region (N-well) 10 is larger than the sum of capacitance values of the capacitance formed of conductive layer 3e, gate insulating film 4e and semiconductor substrate region (N-well) 10 shown in FIG. 11A and the capacitance formed of conductive layer 3f, gate insulating film 4f and semiconductor substrate region (N-well) 10. Thus, the capacitance having a capacitance value larger than the sum of capacitance values of capacitances CPA and CPB in FIG. 11B is electrically connected to semiconductor substrate region (N-well) 10. Therefore, the capacitance value between electrode nodes VA and VB increases, and it is possible to provide the capacitance element having a large capacitance value with a small occupying area.

According to the structure of capacitance element 3, as described above, an impurity region connected to the conductive layer corresponding to the bit line is eliminated from a region, and the conductive layer corresponding to the word line is extendingly located on the same region, so that the capacitance between the additional conductive layer corresponding to the word line and the semiconductor substrate (N-well) is larger, and therefore the capacitance element thus constructed can have a larger capacitance value.

[Capacitance Element 4]

Figure 13:
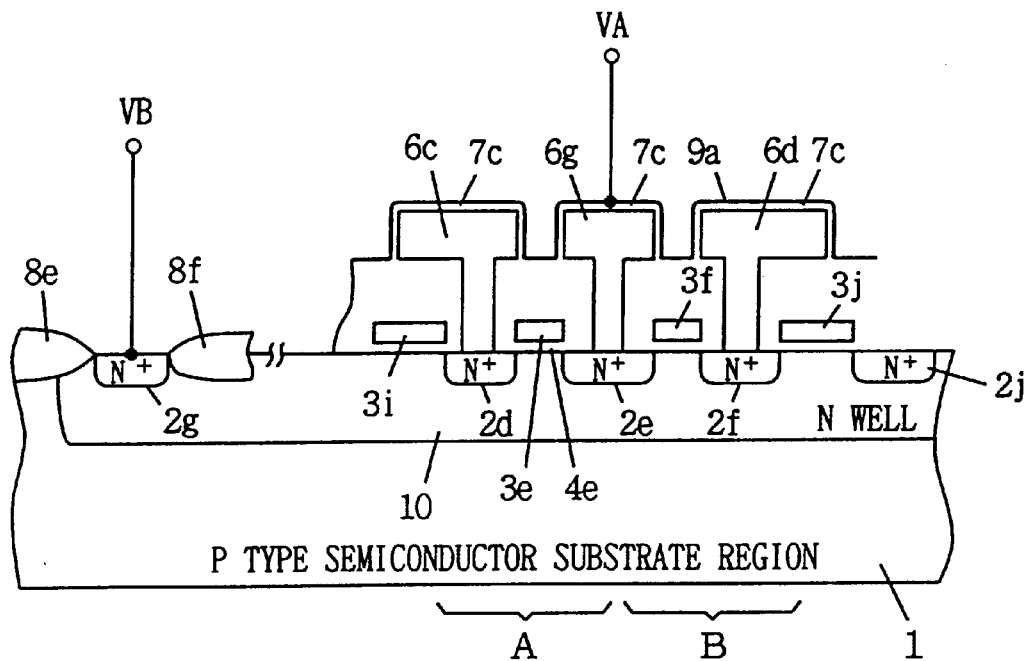
FIG. 13 schematically shows a structure of a third modification of the embodiment 1 of the invention.

FIG 13 schematically shows a structure of a fourth capacitance element according to the invention. Likewise, the structure shown in FIG. 13 does not include a conductive layer corresponding to the bit line. Conductive layer 6g corresponding to the storage node is arranged for impurity region 2e in place of the conductive layer corresponding to the bit line and connected to impurity region 2e. Conductive layer 6g has a plug portion (leg portion) electrically connected to the corresponding impurity region 2e, and a flat portion for providing a capacitance at its surface. Conductive layer 9a corresponding to the cell plate is opposed to the surfaces of conductive layers 6c, 6d and 6g with insulating film 7c therebetween. Strictures other than the above are the same as those shown in FIG. 9A. Corresponding parts and portions bear the same reference characters, and will not be described below.

In the structure shown in FIG. 13, conductive layer 6g increases surface areas of the conductive layers corresponding to the storage nodes opposed to conductive layer 9a. The areas of flat portions of conductive layers 6c and 6d decrease due to insertion of additional conductive layer 6g. However, reduction in surface area of conductive layers 6c and 6d is compensated for by the surface area of the flat portion of conductive layer 6g. Further, conductive layer 9a is opposed to the side surface of the flat portion of conductive layer 6g, so that the capacitance value increases by the amount equal to the area of the side surface of the flat portion. Therefore, the conductive layer corresponding to the storage node is connected to the impurity region connected the conductive layer corresponding to the bit line and is utilized as the capacitance element, so that the capacitance element can have a further large capacitance value without increasing the area occupied by the capacitance element.

[Capacitance Element 5]

Figure 14:
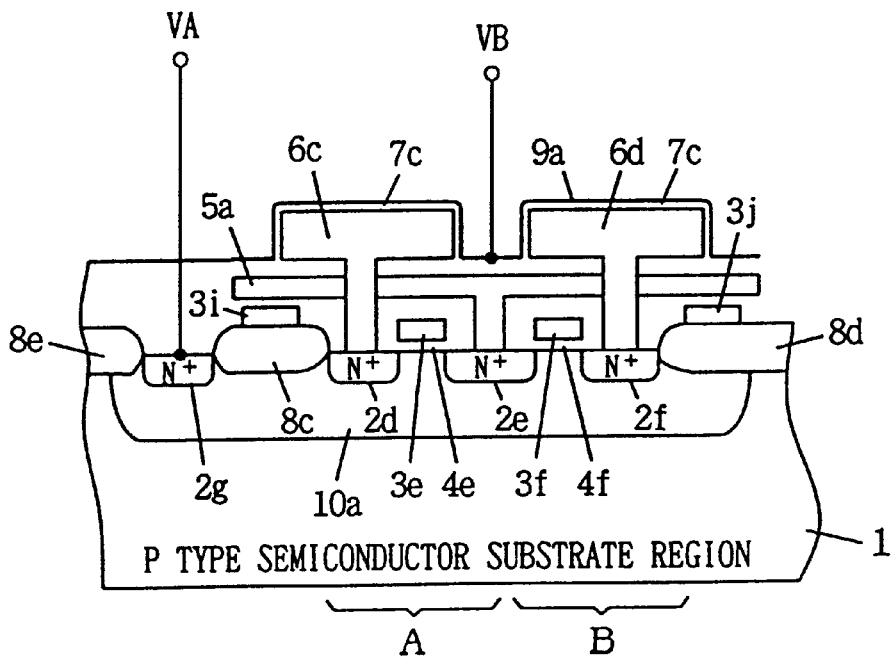
FIG. 14 schematically shows a structure of a fourth modification of the embodiment 1 of the invention.

FIG. 14 schematically shows a structure of a fifth capacitance element according to the invention. FIG. 14 shows, as a representative example, the structures of unit capacitance elements formed at regions A and B corresponding to two memory cells. The capacitance element is formed at an N-well 10a, which is isolated by field insulating films 8e and 8d from other regions. In the structure shown in FIG. 14, conductive layers 3i and 3j corresponding to word lines are formed at the surfaces of field insulating films 8c and 8d, respectively. Structures other than the above are the same as those shown in FIG. 9A. Electrodes are connected to N-well (semiconductor substrate region) 10a and conductive layer 9a in a manner merely opposite to that in FIG. 9A. Therefore, the structure of capacitance element shown in FIG. 14 is substantially equivalent to the capacitance element shown in FIG. 9A. Change of the electrodes does not change the voltage applied across the electrodes of capacitance element, and does not cause a forward biasing between the P type substrate region 1 and N-well 10a, so that no problem arise.

In the structure shown in FIG. 14, the memory cell structure is utilized to form the capacitance element as described above, so that it is possible to provide the capacitance element having a necessary capacitance value with a small occupying area and therefore having a good area efficiency.

In particular, the surface area of N-well 10a can be reduced, so that charges can be rapidly absorbed and supplied without an RC delay while preventing voltage drop due to a resistance component at the surface of N-well 10a and an influence by a coupling capacitance between N-well 10a and substrate region 1. Thus, the capacitance element having good frequency response characteristics can be achieved.

[Capacitance Element 6]

Figure 15:
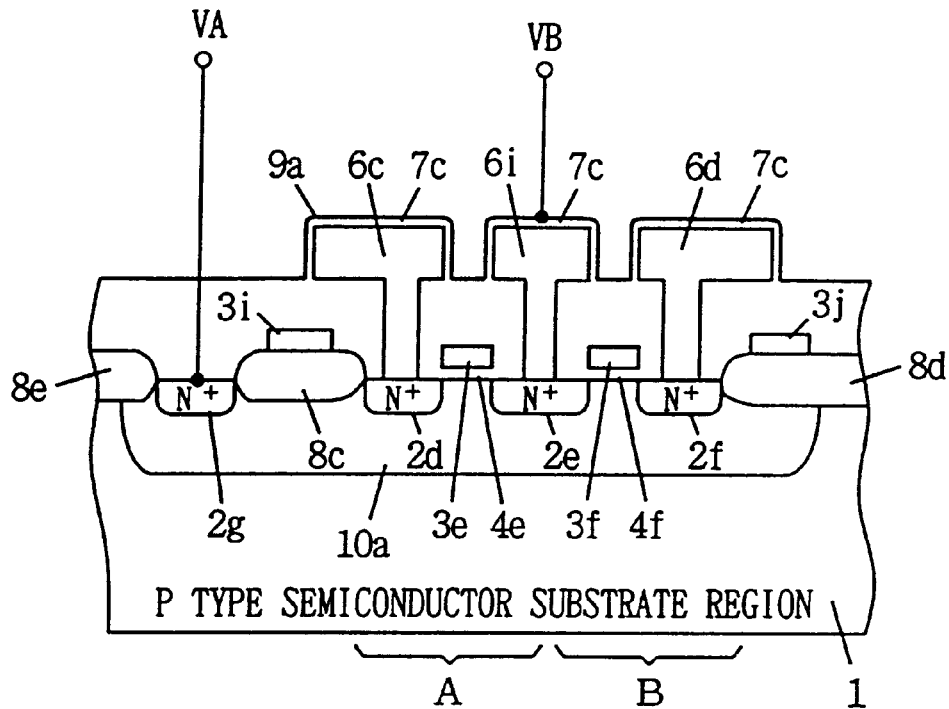
FIG. 15 schematically shows a structure of a fifth modification of the embodiment 1 of the invention.

FIG. 15 schematically shows a structure of a sixth capacitance element according to the invention. The structure shown in FIG. 15 differs from the structure shown in FIG. 14 in the following point. First, there is no conductive layer corresponding to the bit line. Conductive layer 6i corresponding to the storage node is arranged for and electrically connected to impurity region 2e, to which the conductive layer corresponding to the bit line is electrically connected in another structure already described. Conductive layer 9a corresponding to the cell plate is opposed to the surfaces of conductive layers 6c, 6i and 6d with insulating film 7c therebetween.

Structures other than the above are the same as those shown in FIG. 14. Corresponding parts and portions bear the same reference characters. The structure of capacitance element 6 can increase the area of opposed portions of the electrodes in the capacitance element, and can provide a large capacitance value, similarly to the structure shown in FIG. 13.

[Capacitance Element 7]

Figure 16:
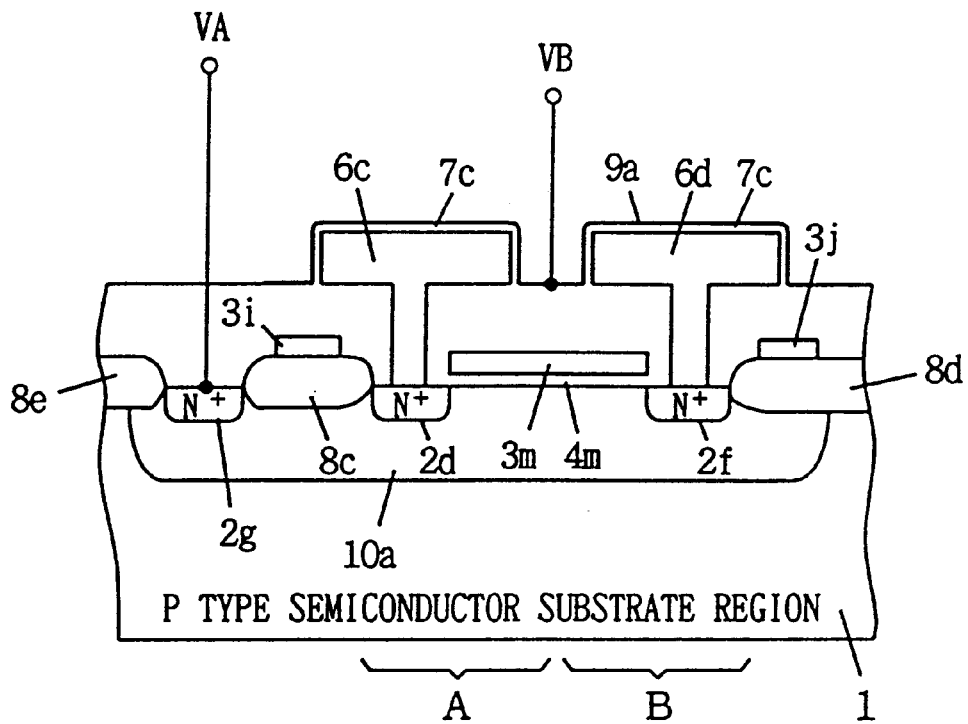
FIG. 16 schematically shows a structure of a sixth modification of the embodiment 1 of the invention.

FIG. 16 schematically shows a structure of a seventh capacitance element according to the invention. The structure of capacitance element shown in FIG. 16 differs from the capacitance element shown in FIG. 14 in the following points. This structure does not include a conductive layer corresponding to the bit line. Also, the structure does not include an impurity region (impurity region 2e in FIG. 14) connected to the conductive layer corresponding to the bit line. In semiconductor substrate region (N-well) 10a, conductive layer (gate electrode layer) 3m corresponding to the word line is arranged on the surface of semiconductor substrate (N-well) 10a between impurity regions 2d and 2f with a gate insulating film 4m therebetween.

In the structure shown in FIG. 16, the capacitance value of capacitance element can be larger than that in the structure shown in FIG. 14 owing to formation of the capacitance between conductive layer 3m and semiconductor substrate region (N-well) 10a. Therefore, the capacitance element can have a good area efficiency.

[Capacitance Element 8]

Figure 17A:
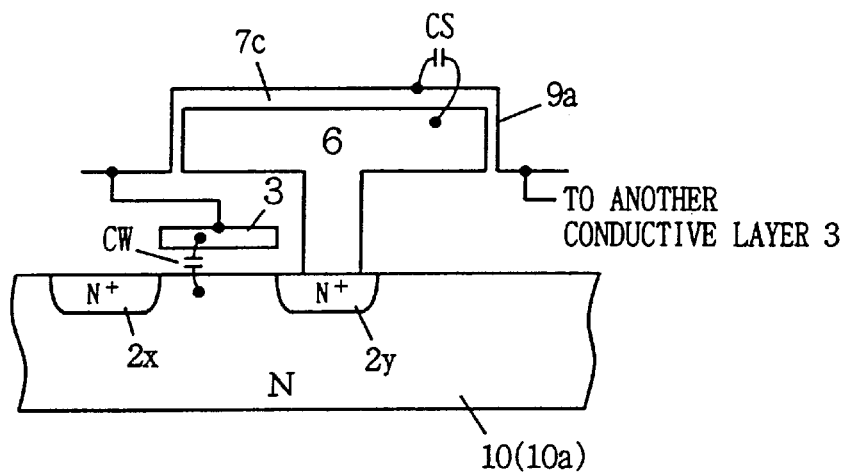
FIGS. 17A and 17B show a structure and an electrically equivalent circuit of a seventh modification of the embodiment 1 of the invention, respectively.

FIG. 17A schematically shows a structure of a third capacitance element according to the invention. FIG. 17A representatively shows a structure of one unit capacitance element. In FIG. 17A, heavily doped N-type impurity regions 2x and 2y are formed at the surface of semiconductor substrate region. Impurity region 2y is electrically connected to conductive layer 6 corresponding to the storage node. Conductive layer 9a corresponding to the cell plate layer is formed on the surface of conductive layer 6 with insulating film 7c therebetween.

Conductive layer 3 corresponding to the word line is formed on the surface of semiconductor substrate region (N-well) 10 (10a) between impurity regions 2x and 2y. Conductive layer 3 is electrically connected to conductive layer 9a. All conductive layers 3 corresponding to the word lines are electrically connected to conductive layer 9a corresponding to the cell plate layer. Since conductive layer 3 forms a capacitance together with semiconductor substrate region (N-well) 10 (10a), capacitance CS which is formed of conductive layer 9a and conductive layer 6 as well as insulating film 7c arranged between them is connected in parallel to capacitance CW which is formed between conductive layer 3 and semiconductor substrate region (N-well) 10 (10a) as well as the gate insulating film arranged between them. Therefore, the capacitance element can have an increased capacitance value.

Figure 17B:
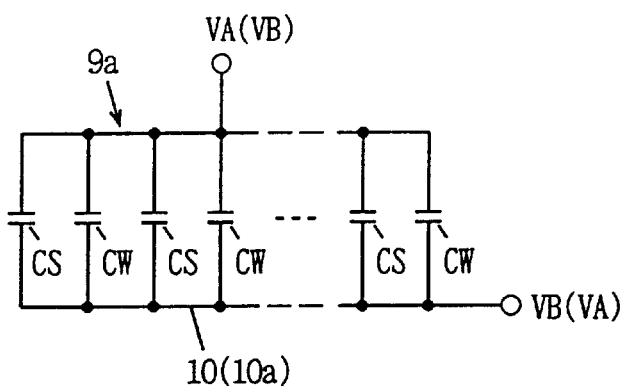

FIG. 17B shows a form of connection of unit capacitance elements forming the capacitance element shown in FIG. 17A. Unit capacitance elements CS and unit capacitance elements CW are connected in parallel between conductive layer 9a corresponding to the cell plate layer and the semiconductor substrate region (N-well) 10 (10a). Owing to electrically connection between conductive layer 3 corresponding to the word line and conductive layer 9a corresponding to the cell plate, capacitance CW does not function merely as a parasitic capacitance but can surely function as the capacitance in parallel to the capacitance CS, so that the capacitance value of this capacitance element can be increased. Positions of electrode nodes VA and VB may be interchanged.

[Capacitance Element 9]

Figure 18:
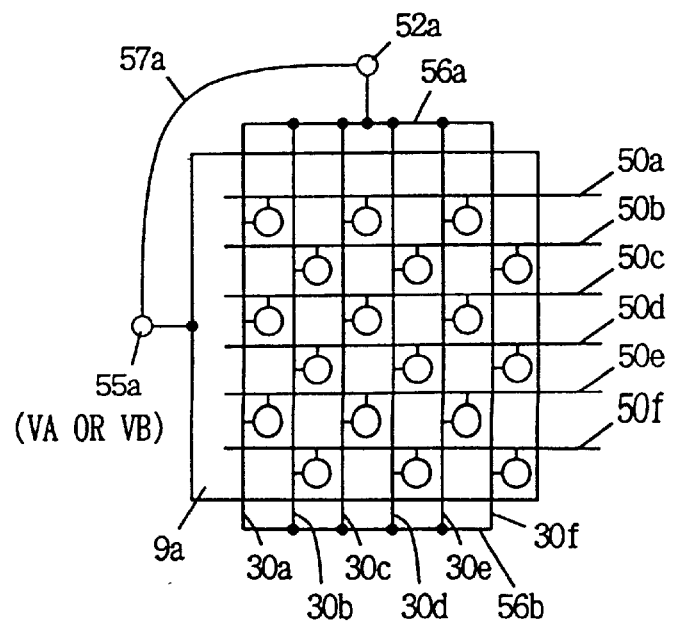
FIG. 18 shows a planar arrangement of the capacitance element of the embodiment 1 of the invention.

FIG. 18 schematically shows a structure of a ninth capacitance element according to the invention. In FIG. 18, a plurality of unit capacitance elements (indicated by circles in the figure) are arranged in a matrix form of rows and columns. Each of the unit capacitance elements has the same structure as the DRAM memory cell. Conductive layers 30a–30f corresponding to the word lines are arranged corresponding to the rows of unit capacitance elements, respectively. Conductive layers 50a–50f corresponding to bit lines extend in the column direction. Since the unit capacitance elements are arranged in a manner similar to that of memory cells, the conductive layers corresponding to bit lines are arranged in pairs. The unit capacitance elements are arranged corresponding to the crossings between the paired conductive layers (e.g., conductive layers 50a and 50b) and conductive layers 30a–30f corresponding to word lines. Conductive layers 30a–30f corresponding to word lines are mutually connected at their opposite ends by interconnections 56a and 56b made of a material of a low resistance such as aluminum. Interconnection 56a is electrically connected to a common node 52a.

For conductive layers 30a–30f which correspond to word lines, conductive layer 9a which corresponds to the cell plate is arranged at a higher level layer. Conductive layer 9a is electrically connected to a node 55a (electrode node VA or VB). Nodes 52a and 55a are mutually connected by a low-resistance interconnection 57a. A semiconductor substrate region (not shown) is electrically connected to the other electrode node (VB or VA).

The connection arrangement shown in FIG. 18 is electrically equivalent to the structure shown in FIG. 17B. Since the same structure as the memory cell structure is utilized as the unit capacitance element, the unit capacitance elements can be arranged efficiently, and the capacitance element having a necessary capacitance value can be easily achieved with a small occupying area. Similarly to the memory cells, the unit capacitance elements can be efficiently arranged in a matrix form, so that the capacitance element having a good area efficiency can be achieved.

[Capacitance Element 10]

Figure 19:
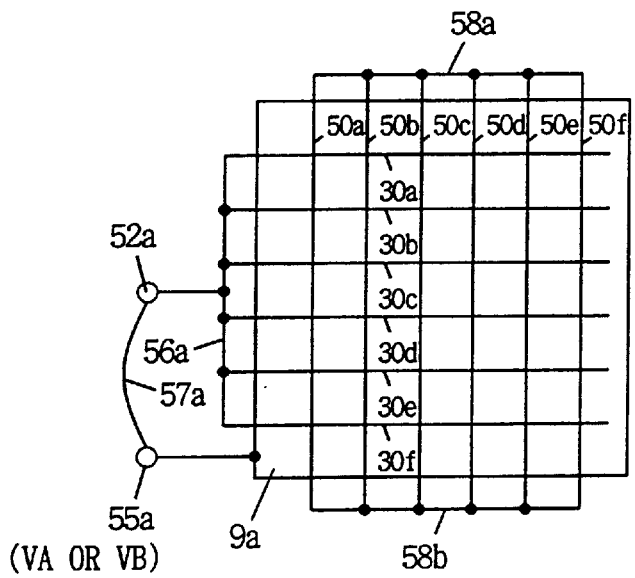
FIG. 19 shows another planar arrangement of the capacitance element of the embodiment 1 of the invention.

FIG. 19 schematically shows a structure of a tenth capacitance element according to the invention. The structure shown in FIG. 19 differs from the structure shown in FIG. 18 in that conductive layers 50a–50f corresponding to the bit lines are mutually and electrically connected at their opposite ends by low-resistance interconnections 58a and 58b. Structures other than the above are the same as those in FIG. 18, and corresponding parts and portions bear the same reference numbers. In FIG. 19, however, the unit capacitance elements (not shown in FIG. 19) are arranged similarly to the unit capacitance elements in FIG. 18 and therefore in the same manner as the memory cell arrangement.

In the structure shown in FIG. 19, even when noises occur at one of conductive layers 50a–50f, low-resistance interconnections 58a and 58b disperse or distribute the noises. As a result, the noises are absorbed, so that the structure can have a high resistance against noises. Conductive layers 50a–50f corresponding to bit lines are electrically connected to the semiconductor substrate region via corresponding impurity regions, respectively. Conductive layers 50a–50f correspond to bit lines, and therefore have low resistances. Accordingly, conductive layers 50a–50f reduce the effective surface resistance of the semiconductor substrate region, so that the resistance of electrodes of the capacitance element can be reduced. Therefore, electric charges can be rapidly charged and discharged (fast movement of charges in the semiconductor substrate region reduces an RC delay), and therefore the capacitance element can have good frequency characteristics.

[Embodiment 2]
[Capacitance Element 1]

Figure 20A:
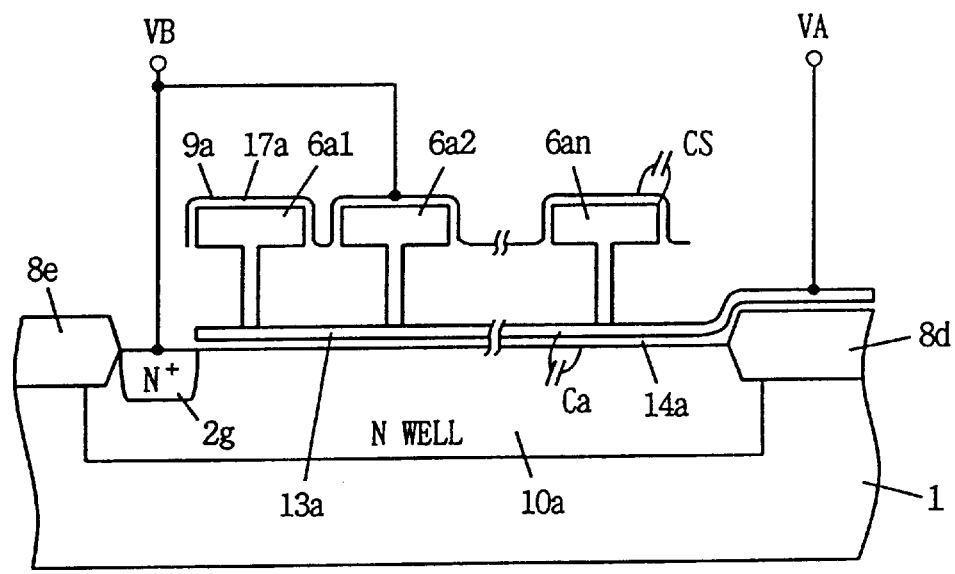
FIGS. 20A and 20B show a cross sectional structure and an electrically equivalent circuit of an embodiment 2 of the invention, respectively.

FIG. 20A schematically shows a structure of a first capacitance element of an embodiment 2 of the invention. In FIG. 20A, N-well 10a which functions as a substrate region of a capacitance element and will be referred to merely as "N-well" hereinafter is formed at the surface of P-type semiconductor substrate region 1. N-well 10a is defined by field insulating films 8e and 8d. A conductive layer 13a corresponding to the word line is formed on the substantially whole surface of N-well 10a with a gate insulating film 14a therebetween. N-well 10a is electrically connected to electrode node VB through heavily doped N-type impurity region 2g formed at its periphery. Conductive layer 13a is connected to electrode node VA. Conductive layer 13a, gate insulating film 14a and N-well 10a form a gate capacitor Ca similar to a conventional one.

In FIG. 20A, conductive layers 6a1–6an corresponding to storage nodes are formed on conductive layer 13a. Conductive layers 6a1–6an have T-shaped sections similarly to the storage nodes of memory cells. In the process of forming the memory cell capacitors, the storage node is formed after forming the gate electrode layer (word line) of the access transistor. In the process of forming the storage node, a contact hole is formed for making electrical contact with the impurity region of access transistor. In the structure shown in FIG. 20, therefore, the contact holes for making electrical contact between conductive layers 6a1–6an corresponding to the storage nodes and the conductive layer 13a can be formed utilizing the process of forming the contact holes for making electrical connection between the impurity regions and the conductive layers corresponding to the storage node in the embodiment 1 already described. Therefore, conductive layers 6a1–6an corresponding to the storage nodes can be formed in the same process as that of forming the storage nodes of the memory cells. Accordingly, it is not necessary to increase the number of required masks and the number of manufacturing steps.

Conductive layer 9a corresponding to the cell plate are formed on conductive layers 6a1–6an corresponding to the storage nodes with insulating film 17a corresponding to the capacitor insulating film of memory cell therebetween. Conductive layers 6a1–6an and conductive layer 9a form the capacitance, as is in the embodiment 1. Unit capacitance element CS is formed between each conductive layer 6ai and conductive layer 9a. Conductive layer 9a is electrically connected to electrode node VB.

Figure 20B:
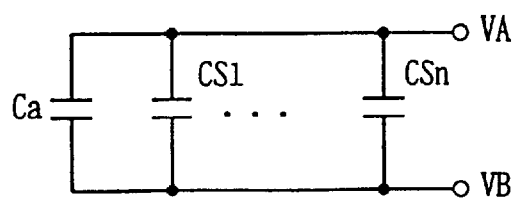

In the structure shown in FIG. 20A, of which electrically equivalent circuit is shown in FIG. 20B, unit capacitance element Ca and unit capacitance elements CS1–CSn are electrically connected in parallel between electrode nodes VA and VB. The capacitance element which is formed of conductive layers 6a1–6an corresponding to the storage nodes, insulating film 17a and conductive layer 9a is formed above the MOS capacitance formed of conductive layer 13a, insulating film 14a and N-well 10a. Therefore, the capacitance element is additionally arranged above the conventional MOS capacitor in a hierarchical manner, so that the capacitance value of capacitance element can be increased without increasing the area.

In the structure of the capacitance element shown in FIG. 20A, a voltage substantially equal to a half of power supply voltage VCC is applied across electrode nodes VA and VB. The capacitance element occupies a small area and has a good area efficiency without impairing breakdown voltage characteristics.

[Capacitance Element 2]

Figure 21A:
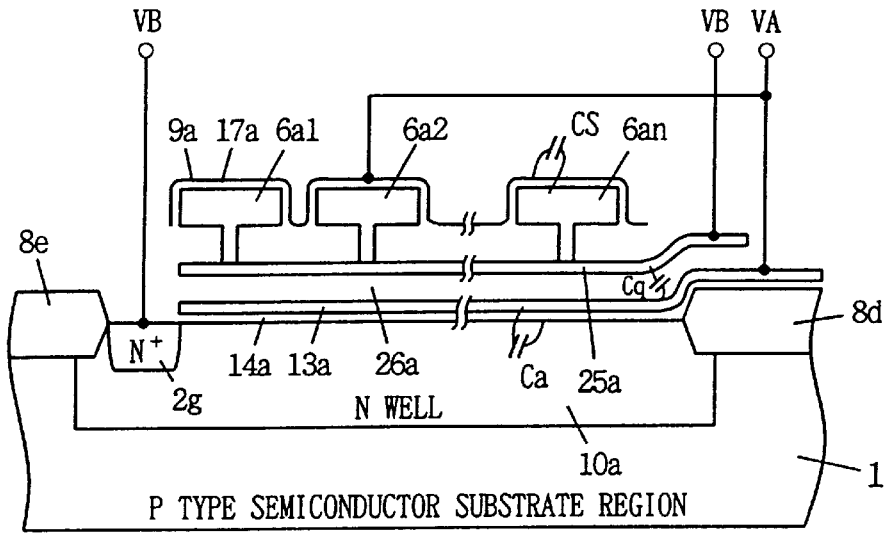
FIGS. 21A and 21B show a schematic sectional structure and an electrically equivalent circuit of a first modification of the embodiment 2 of the invention, respectively.

FIG. 21A schematically shows a structure of a second capacitance element of the embodiment 2 of the invention. In the structure shown in FIG. 21A, conductive layer 13a corresponding to the word line is formed over the surface of N-well 10a with an insulating film 14a therebetween. A conductive layer 25a corresponding to the bit line is formed on and opposed to the substantially whole surface of conductive layer 13a with an interlayer insulating film 26a therebetween. Conductive layers 6a1–6an corresponding to the storage nodes are formed on conductive layer 25a, and are electrically and commonly connected to conductive layer 25a. A capacitor forming portion (i.e., an upper flat portion) of the storage node of memory cell is formed at a level higher than the bit lines. In the manufacturing process of memory cells, therefore, the storage nodes are formed after manufacturing the bit line.

In the structure of capacitance element shown in FIG. 21A, therefore, contact holes through which conductive layers 6a1–6an are electrically connected to conductive layer 25a corresponding to the bit line can be formed in the same manufacturing process as the process of manufacturing the memory cell capacitors, as can be done in the process of forming contact holes for connecting the unit capacitance elements to the corresponding impurity regions in the embodiment 1. In the structure shown in FIG. 21A, therefore, the number of masks and the number of manufacturing steps do not increase.

N-well 10a is connected to electrode node VB through impurity region 2g. Conductive layer 13a is electrically connected to electrode node VA. Conductive layer 25a is electrically connected to electrode node VB.

In the structure of capacitance element shown in FIG. 21A, a capacitor Cq is formed by conductive layer 13a corresponding to the word line, conductive layer 25a corresponding to the bit line and interlayer insulating film 26a. Conductive layers 6a1–6an corresponding to the storage nodes and the conductive layer 9a implement the capacitance of n·CS, as is in the structure shown in FIG. 20A. Although this structure includes conductive layer 25a, the capacitance formed by conductive layers 6a1–6an and the conductive layer 9a has the capacitance value depending on the surface areas of upper flat portions of conductive layers 6a1–6an. Therefore, the capacitance value of the capacitor formed by conductive layer 9a, conductive layers 6a1–6an and insulating film 17a does not change from that of the capacitance shown in FIG. 20A.

Figure 21B:
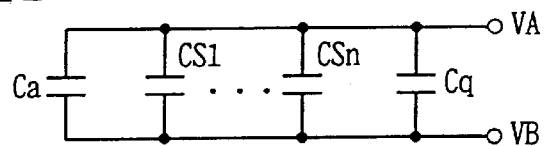

In the structure of capacitance element shown in FIG. 21A, capacitances Ca, CS1, . . . , CSn are connected in parallel between electrode nodes VA and VB, as can be seen from the electrically equivalent circuit shown in FIG. 21B. Therefore, the capacitance value can be increased by the capacitance value of capacitance Cq which is formed by conductive layer 25a, interlayer insulating film 26a and conductive layer 13a. The thickness of interlayer insulating film 26a is about 20 times as large as that of gate insulating film 14a. The purpose of this is to prevent capacitance coupling by a parasitic capacitance between interconnections. Therefore, the capacitance value of capacitance Cq is about 5% of the capacitance value of capacitance Ca, and the capacitance value of the capacitance element shown in FIG. 21 can increase the capacitance value of the capacitance element shown in FIG. 20A by about 5%.

Conductive layer 25a corresponding to the bit line may have a composite structure made of polycrystalline silicon and high melting point metal such as tungsten or molybdenum, or a high melting point metal silicide structure. These structures can be likewise employed in conductive layer 13a.

[Capacitance Element 3]

Figure 22A:
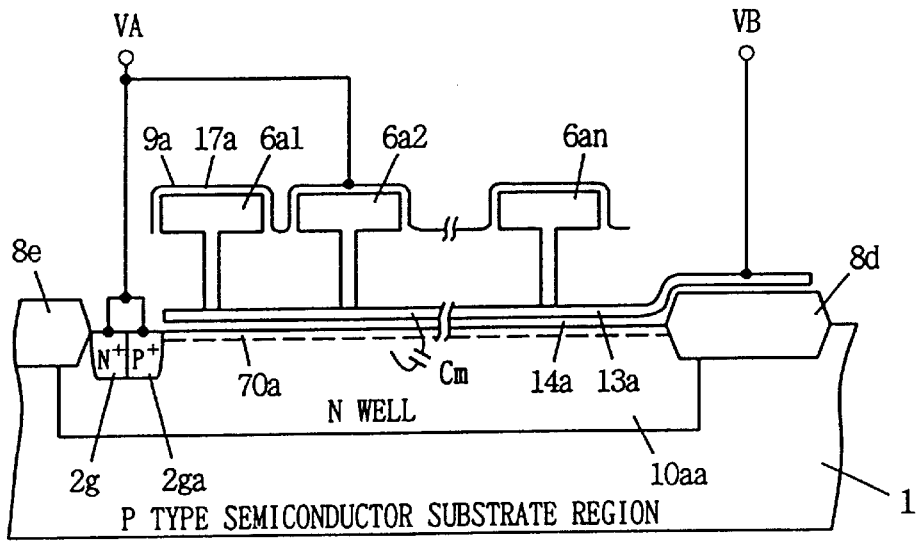
FIGS. 22A and 22B show a schematic sectional structure and an electrically equivalent circuit of a second modification of the embodiment 2 of the invention, respectively.

FIG. 22A schematically shows a structure of a third capacitance element of the embodiment 2 of the invention. In FIG. 22A, an N-well 10aa is formed at the surface of P-type semiconductor substrate 1. N-well 10aa has a surface impurity concentration lower than that of N-well 10a. The purpose of this is to facilitate formation of channels. Conductive layer 13a corresponding to the word line is formed on the substantially whole surface of N-well 10aa with gate insulating film 14a therebetween. Conductive layers 6a1–6an corresponding to the storage nodes is formed on conductive layer 13a. Conductive layer 9a corresponding to the storage node is formed on conductive layers 6a1–6an with insulating film 17a therebetween. Heavily doped N-type impurity region 2g and a heavily doped P-type impurity region 2ga are formed at a periphery of N-well 10aa. These impurity regions 2g and 2ga are electrically connected to node VA. Conductive layers 9a and 13a are electrically connected to electrode nodes VA and VB, respectively.

N-well 10aa has a relatively low surface impurity concentration, and a channel region 70a is formed at its surface. Therefore, conductive layer 13a, gate insulating film 14a and channel region 70a at the surface of N-well 10aa form an MOS capacitor. N-wells 10a and 10 already described have not a channel region formed at its surface. The surfaces of N-wells 10 and 10a are utilized as electrodes, and have relatively small surface resistances. Conversely, as shown in FIG. 22A, N-well 10aa has a relatively low surface impurity concentration, and has channel region 70a formed on the surface thereof. Thereby, a depletion layer region (not shown) is formed at channel region 70a, and, in the MOS capacitor, a capacitor provided by this depletion layer is added to the capacitance provided by the gate insulating film, so that the capacitance value increases and the capacitance element can have a large capacitance value.

Figure 22B:
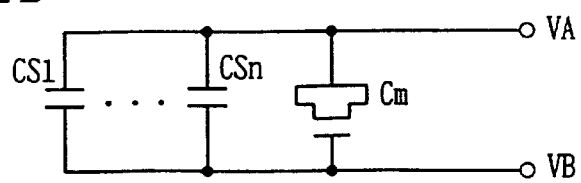

Thus, as shown in FIG. 22B, it is possible to provide the capacitance element having a further improved area efficiency, in which unit capacitance elements CS1, ..., CSn and MOS capacitor Cm are electrically connected in parallel between electrode nodes VA and VB. In this structure, the voltage which is lower than that applied to electrode node VA is applied to electrode node VB for forming channel region 70a. Since the substrate region of MOS capacitor is electrically connected to the electrode of MOS capacitor (source/drain of MOS transistor) through impurity region 2g, it is possible to eliminate a substrate effect on the threshold voltage of MOS transistor forming this MOS capacitor, and therefore it is possible to achieve stably a constant capacitance value.

[Capacitance Element 4]

Figure 23A:
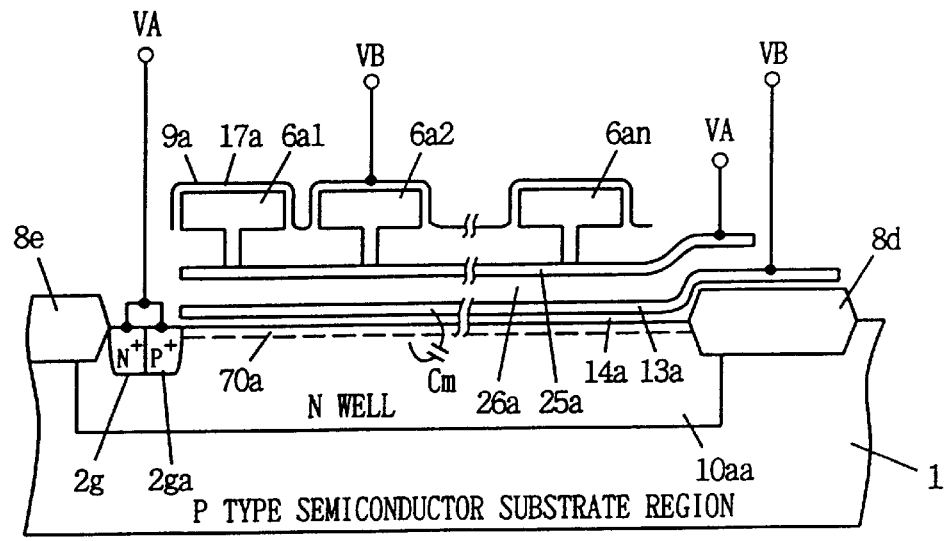
FIGS. 23A and 23B show a schematic sectional structure and an electrically equivalent circuit of a third modification of the embodiment 2 of the invention, respectively.

FIG. 23A schematically shows a structure of a fourth capacitance element of the embodiment 2 of the invention. In FIG. 23A, the structure of capacitance element shown in FIG. 23A differs from the structure shown in FIG. 22A in the following point. Conductive layer 25a corresponding to the bit line is formed on and opposed to conductive layer 13a corresponding to the word line with interlayer insulating film 26a therebetween. Conductive layers 6a1–6an corresponding to the storage nodes are electrically and commonly connected to conductive layer 25a. Conductive layer 25a is electrically connected to electrode node VA, and conductive layer 9a is electrically connected to electrode node VB. Structures other than the above are the same as those shown in FIG. 22A, and corresponding parts and portions bear the same reference characters.

Figure 23B:
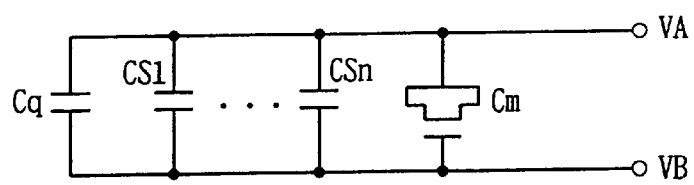

In the structure of capacitance element shown in FIG. 23A, capacitance Cq formed by conductive layer 25a, interlayer insulating film 26a and conductive layer 13a is arranged in parallel with unit capacitance elements CS1, ..., CSn and MOS capacitor Cm, and is connected between electrode nodes VA and VB, as can be seen from an electrically equivalent circuit diagram of FIG. 23B. Therefore, the capacitance value of this structure is larger by the capacitance value of capacitance Cp than that of the structure shown in FIG. 22A. The operation and effect are the same as those of the capacitance element shown in FIG. 22A.

[Capacitance Element 5]

Figure 24A:
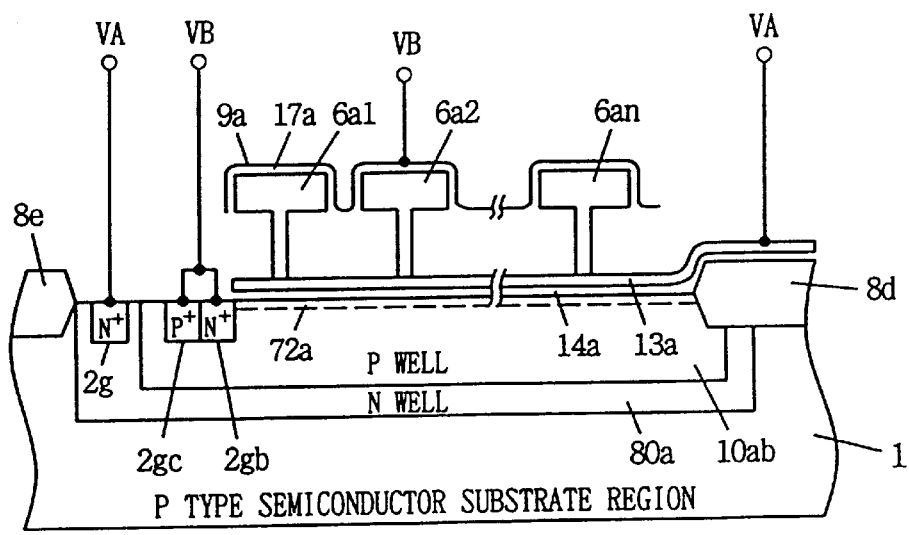
FIGS. 24A and 24B show a schematic sectional structure and an electrically equivalent circuit of a fourth modification of the embodiment 2 of the invention, respectively.

FIG. 24A schematically shows a structure of a fifth capacitance element of the embodiment 2 of the invention. In FIG. 24A, an N-well 80a is formed at the surface of P-type semiconductor substrate region 1. The region of N-well 80a is defined by field insulating films 8e and 8d. A P-well 10ab having a relatively low surface impurity concentration is formed at the surface of N-well 80a. Conductive layer 13a corresponding to the word line is formed on the substantially whole surface of P-well 10ab with gate insulating film 14a therebetween. Conductive layers 6a1–6an are formed on and electrically connected to conductive layer 13a. Conductive layer 9a corresponding to the cell plate is formed on and opposed to conductive layers 6a1–6an with insulating film 17a therebetween.

A heavily doped N-type impurity region 2gb is formed at the periphery of P-well 10ab, and a heavily doped P-type impurity region 2gc is formed outside impurity region 2gb. Further, heavily doped N-type impurity region 2g is formed at N-well 80a. Impurity region 2g and conductive layer 13a are electrically connected to electrode node VA. Meanwhile, impurity regions 2gb and 2gc and conductive layer 9a are electrically connected to electrode node VB. A voltage applied to electrode node VA is higher than a voltage applied to electrode node VB. P-well 10ab has a relatively low impurity concentration at its surface, and a channel region 72a is formed at the surface of P-well 10ab.

In the structure shown in FIG. 24A, therefore, conductive layer 13a, gate insulating film 14a, channel region 72a and impurity region 2gb form the MOS capacitor using an n-channel MOS transistor. The capacitor formed by conductive layers 6a1–6an corresponding to the storage nodes, conductive layer 9a and insulating film 17a has the same structure as the capacitance elements of the embodiment 2.

Figure 24B:
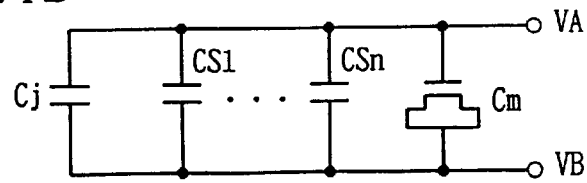

P-type semiconductor substrate region 1 extends to the memory cell array region, and N-well 80a is provided for isolating the substrate potential of the access transistor at the memory cell region from the potential on P-well 10ab of the capacitance element. In addition to this, N-well 80a is electrically connected to electrode node VA through impurity region 2g, whereby a junction capacitor Cj between P-well 10ab and N-well 80a is not utilized as a mere parasitic capacitance but can be utilized as the capacitance element. Thus, in the structure of capacitance element shown in FIG. 24A, capacitances Cj and CS1–CSn and capacitance Cm provided by the MOS capacitor are connected in parallel between electrode nodes VA and VB, as can be seen from an electrically equivalent circuit shown in FIG. 24.

Therefore, it is possible to provide the capacitance element having a further increased capacitance value. P-type semiconductor substrate region 1, which extends to the memory cell array region, is usually biased to a negative potential. Therefore, the voltage applied to electrode node VA is higher than that applied to electrode node VB, so that biasing across N-well 80*a* and substrate region 1 in the forward direction can be surely prevented.

[Capacitance Element 6]

Figure 25A:
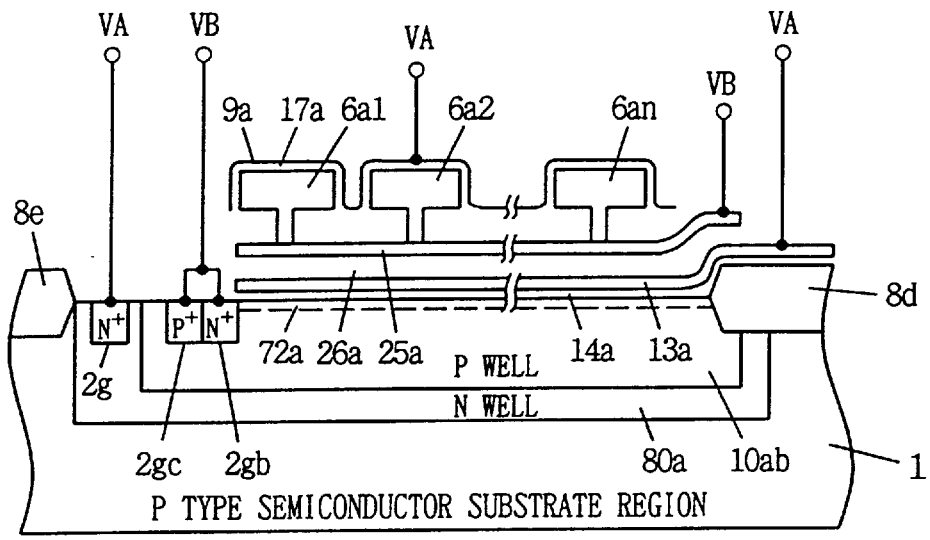
FIGS. 25A and 25B show a schematic sectional structure and an electrically equivalent circuit of a fifth modification of the embodiment 2 of the invention, respectively.

FIG. 25A schematically shows a structure of a sixth capacitance element of the embodiment 2 of the invention. The structure shown in FIG. 25A differs from that of capacitance element shown in FIG. 24A in the following point. Conductive layer 25*a* corresponding to the bit line is formed on the conductive layer 13*a* corresponding to the word line with the interlayer insulating film 26*a* therebetween. Conductive layers 6*a*1–6*an* corresponding to the storage nodes are electrically connected to conductive layer 25*a*. Conductive layer 25*a* is connected to electrode node VB, and conductive layer 9*a* corresponding to the cell plate is electrically connected to electrode node VA. Structures other than the above are the same as those shown in FIG. 24A. Corresponding parts and portions bear the same reference characters, and will not be described below.

Figure 25B:
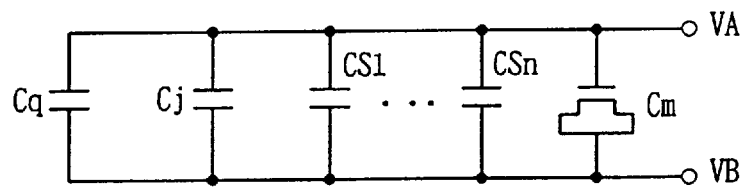

In the structure of capacitance element shown in FIG. 25A, capacitor Cq formed by conductive layer 13*a* corresponding to the word line, interlayer insulating film 26*a* and conductive layer 25*a* corresponding to the bit line is further connected between electrode nodes VA and VB, as can be seen from an electrically equivalent circuit shown in FIG. 25B. Therefore, the capacitance value of the capacitance element is increased by the capacitance value of capacitor Cq.

[Capacitance Element 7]

Figure 26:
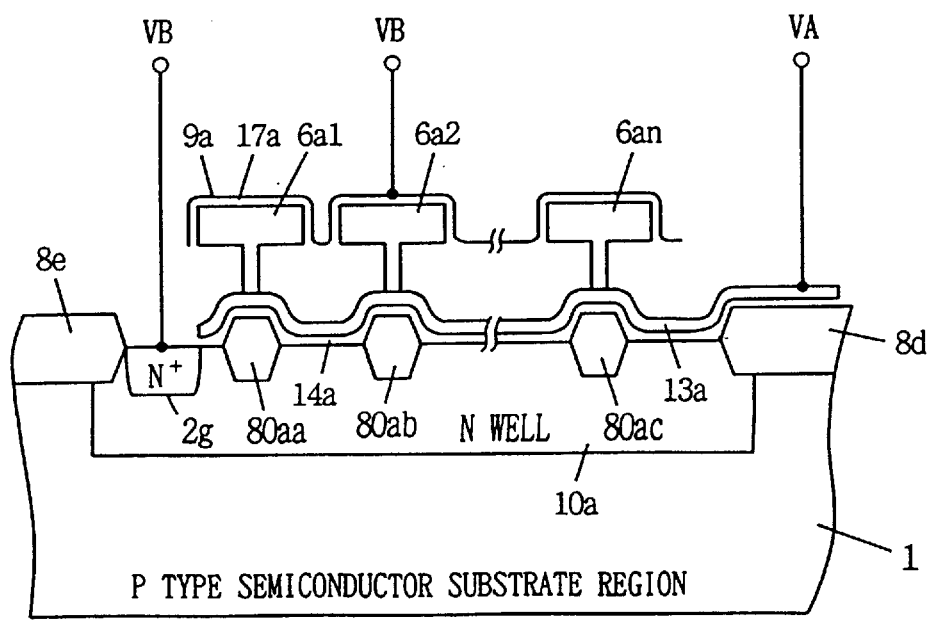
FIG. 26 shows a schematic sectional structure of a seventh modification of the embodiment 2 of the invention.

FIG. 26 schematically shows a structure of a seventh capacitance element of the embodiment 2 of the invention. In this capacitance element shown in FIG. 26, field insulating films 80*aa*, 80*ab* and 80*ac* are formed at portions of the surface region of N-well 10*a* below the portions of electrical connections which are formed between conductive layers 6*a*1–6*an* corresponding to the storage nodes and the conductive layer 13*a* corresponding to the word line. Structures other than the above are the same as those shown in FIG. 20, and corresponding parts and portions bear the same reference numbers.

In the structure of the capacitance element shown in FIG. 26, field insulating layers 80*aa*–80*ac* can prevent short-circuit between electrode nodes VA and VB due to short-circuit between conductive layers 6*a*1–6*an* and N-well 10*a*, which may occur if conductive layer 13*a* is excessively etched in the process of forming contact holes for electrical connection between conductive layers 6*a*1–6*an* and conductive layer 13*a*. In such a structure where conductive layer 13*a* corresponding to the word line is formed on the surface of N-well 10*a* with thin gate insulating film 10*a* therebetween, and conductive layer 13*a* thus formed is utilized as one of the electrode nodes, it is possible to prevent such a situation that conductive layers 6*a*1–6*an* corresponding to the storage nodes extend through conductive layer 13 and are electrically connected to the surface of N-well 10*a*. Therefore, the capacitance element can have a high reliability.

Field insulating films 8*d* and 8*e* are formed by the same manufacturing process as that of forming element isolating films for isolating the memory cells from each other in the memory cell array region. Therefore, formation of field insulating films 80*aa*–80*ac* do not increase the number of steps in the manufacturing process. Formation of field insulating films 80*aa*–80*ac* requires a mask defining the region at which field insulating films are to be formed. This mask can be the same as that for forming the field insulating films at the memory cell array region. Therefore, the number of mask does not increases.

This structure in which the field insulating films are arranged at the portions of N-well surface region below the portions of the connections between conductive layers 6*a*1–6*an* and conductive layer 13*a* can be utilized also as the structure for the MOS capacitor shown in FIGS. 22A and 24A. In this case, a region for channel stopper is not formed under field insulating films 80*aa*–80*ac*, so that the channel regions formed at the well region surface are connected together through portions under the field insulating films, and the field insulating films do not interrupt the connection between the channel regions of MOS capacitors, so that the capacitance element can operate stably.

In the structure shown in FIGS. 21 and 26, N-well 10*a* and N-type heavily doped impurity region 2*g* may be changed into P-type regions, in which case a similar effect can be achieved.

According to the embodiment 2 of the invention, as described above, the capacitance is formed between the conductive layer corresponding to the word line and the well region serving as the semiconductor substrate region, and, above this capacitance, a plurality of parallel-arranged capacitances of the same structures as the memory cell capacitor are electrically connected in a hierarchical manner. Therefore, the capacitance elements can have a good area efficiency.

[Embodiment 3]

[Capacitance Element 1]

Figure 27A:
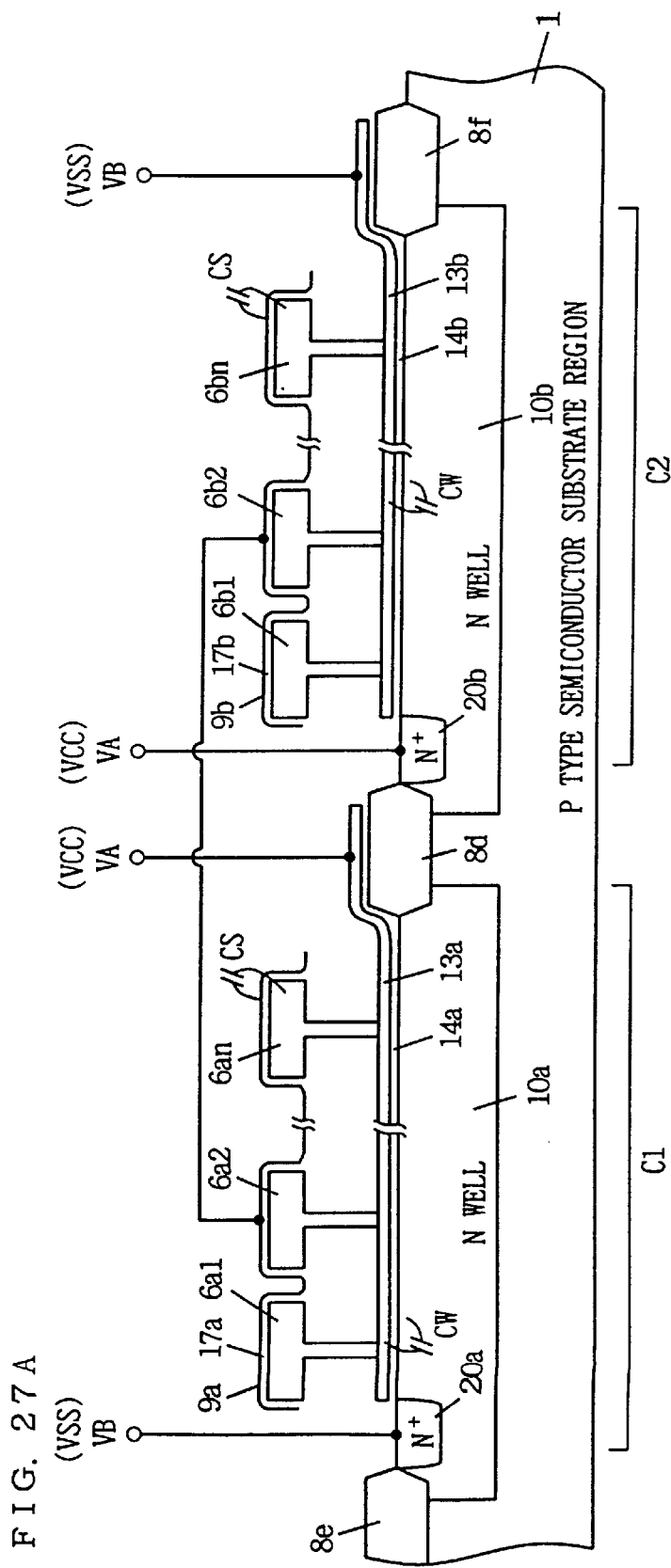
FIGS. 27A and 27B show a schematic sectional structure and an electrically equivalent circuit of an embodiment 3 of the invention, respectively.

FIG. 27A schematically shows a structure of a first capacitance element of an embodiment 3 of the invention. The structure shown in FIG. 27A uses two capacitance elements C1 and C2. Capacitance elements C1 and C2 each have the same structure as the first capacitance element of the embodiment 2. More specifically, capacitance elements C1 and C2 are formed at N-wells 10*a* and 10*b* which are formed at P-type semiconductor substrate 1 and are spaced from each other by field insulating film 8*d*. Conductive layer 13*a* corresponding to the word line is formed on the substantially whole surface of N-well 10*a* with gate insulating film 14*a* therebetween. Conductive layer 13*a* may have a composite structure made of polycrystalline silicon and metal having a high melting point such as tungsten or molybdenum. Alternatively, it may have high melting point metal silicide structure. Conductive layers 6*a*1–61*n* corresponding to the storage nodes are formed on conductive layer 13*a*.

Conductive layers 6*a*1–6*an* are electrically and commonly connected to conductive layer 13*a*. Conductive layer 9*a* corresponding to the cell plate is formed on conductive layers 6*a*1–6*an* with insulating film 17*a* therebetween. The surfaces of conductive layers 6*a*1–6*an* are opposed to the conductive layer 9*a*. Conductive layers 6*a*1–6*an* each have a T-shaped section similarly to the embodiment 2. N-well 10*a* is electrically connected to electrode node VB through heavily doped impurity region 20*a* formed at the periphery thereof.

A conductive layer 13*b* corresponding to the word line is formed over the substantially whole surface of N-well 10*b* with a gate insulating film 14*b* therebetween. Conductive layers 6*b*1–6*bn* corresponding to the storage nodes are formed on conductive layer 13*b*. Conductive layers 6*b*1–6*bn* are commonly and electrically connected to conductive layer 13*b*. A conductive layer 9*b* corresponding to the cell plate is opposed to the surfaces of conductive layers 6*b*1–6*bn* with an insulating film 17*b* therebetween. N-well 10*b* is electrically connected to electrode node VA through a heavily doped N-type impurity region 20*b*. Field insulating films 8*a* and 8*f* are formed at the outer peripheries of N-well 10*a* and 10*b*.

Figure 27B:
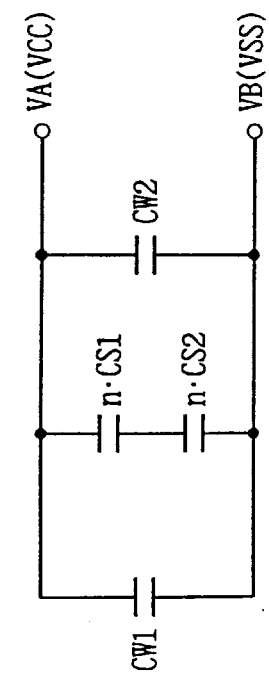

Conductive layers 13a and 13b are electrically connected to electrode nodes VA and VB, respectively. Conductive layers 9a and 9b are connected together. In the connection structure shown in FIG. 27A, a capacitance CW1 formed of conductive layer 13a, gate insulating film 14a and N-well 10a is connected between electrode nodes VA and VB, as can be seen from an electrically equivalent circuit shown in FIG. 27B. A capacitance CW2 formed by conductive layer 13b, gate insulating film 14b and N-well 10b is connected between electrode nodes VA and VB.

Since conductive layers 9a and 9b are connected together, the capacitance n·CS1, which is formed by conductive layer 9a, insulating film 17a and conductive layers 6a1–6an, and the capacitance n·CS2, which is formed by conductive layer 9b, insulating film 17b and conductive layers 6b1–6bn, are electrically connected in series between electrode nodes VA and VB.

Conductive layers 6a1–6an and 6b1–6bn correspond to the storage nodes of memory cell capacitors, and conductive layers 9a and 9b correspond to the cell plates of memory cell capacitors. Therefore, each breakdown voltage of these capacitances is a half of power supply voltage VCC. The capacitance of breakdown voltage VCC can be implemented by connecting these capacitances in series. Conductive layers 13a and 13b correspond to the word line, and therefore the breakdown voltages of capacitances CW1 and CW2 are larger than power supply voltage VCC.

According to the structure of capacitance element shown in FIG. 27A, therefore, dielectric breakdown does not occur even when power supply voltage VCC is applied to electrode node VA and ground voltage VSS is applied to other electrode node VB. Therefore, the (composite) capacitance element shown in FIG. 27A may be connected between nodes between which a voltage difference equal to power supply voltage VCC appears, whereby it is possible to provide a stabilizing capacitance for stabilizing voltages on these nodes or a decoupling capacitance. In particular, each of capacitance elements C1 and C2 has the structure similar to that of the first capacitance element of the embodiment 2, and therefore has a good area efficiency. By utilizing the capacitance shown in FIG. 27A, therefore, it is possible to provide the capacitance which has a good area efficiency and has a breakdown voltage of power supply voltage VCC level.

In the structure shown in FIG. 27A, conductive layers 9a and 9b are isolated from each other. Alternatively, conductive layers 9a and 9b may be made of the same conductive layer. More specifically, common conductive layer 9 may extend over the whole surfaces of regions at which capacitance elements C1 and C2 are formed.

[Capacitance Element 2]

Figures 28A, 28B:
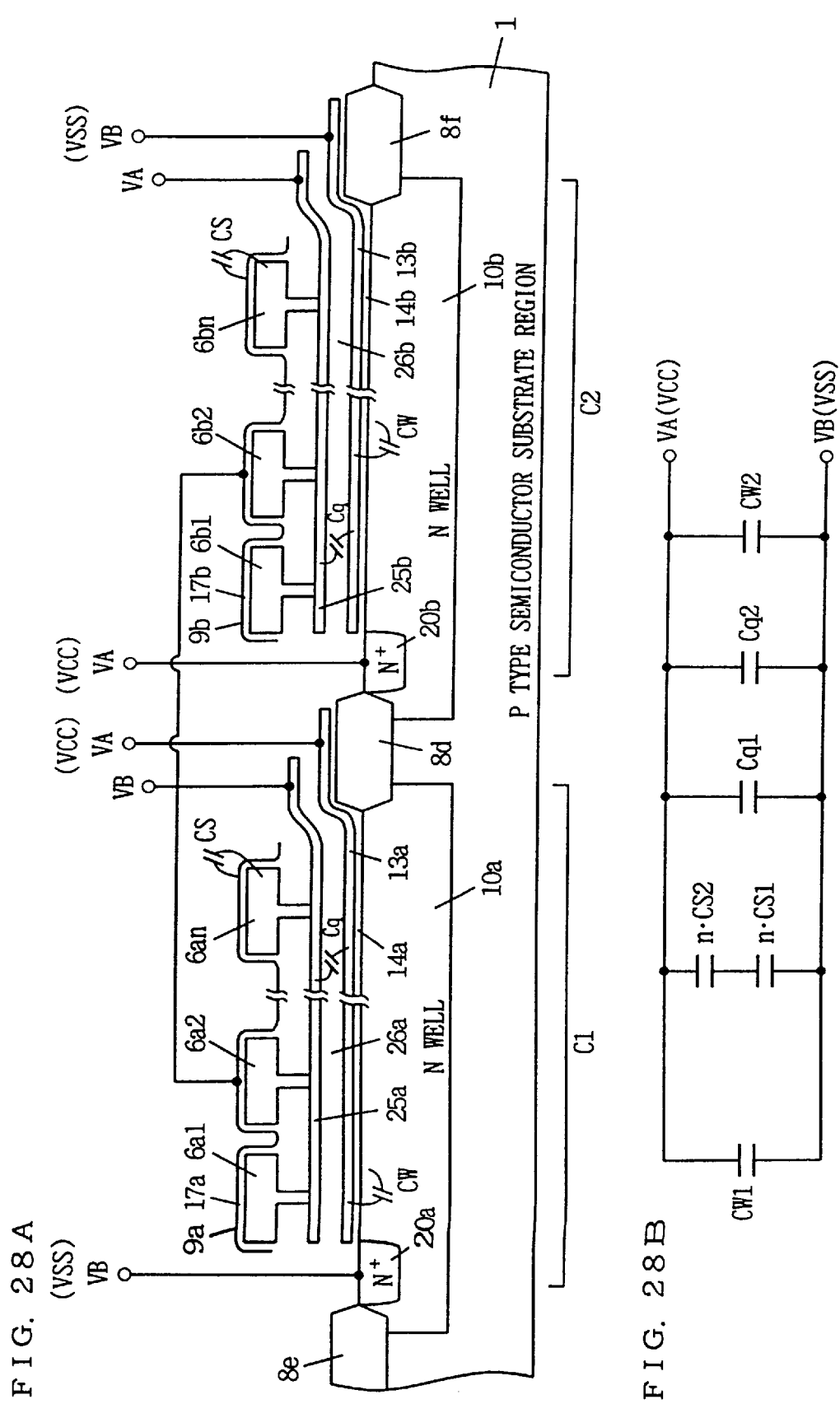
FIGS. 28A and 28B show a schematic sectional structure and an electrically equivalent circuit of a first modification of the embodiment 3 of the invention, respectively.

FIG. 28A shows a structure of a second capacitance element of the embodiment 3 of the invention. The capacitance element shown in FIG. 28A utilizes two capacitance elements, each of which is the same as that shown in FIG. 21A. The structure of capacitance element shown in FIG. 28A differs from the capacitance element in FIG. 27A in the following point. In capacitance element C1, conductive layer 25a corresponding to the bit line is formed on conductive layer 13a with interlayer insulating film 26a therebetween. Conductive layers 6a1–6an corresponding to the storage nodes are electrically and commonly connected to conductive layer 25a. Conductive layer 25a is electrically connected to electrode node VB.

In capacitance element C2, a conductive layer 25b corresponding to the bit line is formed on conductive layer 13b with an interlayer insulating film 26b therebetween. Conductive layers 6b1–6bn corresponding to the storage nodes are electrically connected to conductive layer 25b. Conductive layer 25b is electrically connected to electrode node VA. Structures other than the above are the same as those shown in FIG. 27A. Corresponding parts and portions bear the same reference characters.

In the structure of capacitance element shown in FIG. 28A, a capacitance Cq1 is formed between conductive layers 25a and 13a, and capacitance Cq2 is formed between conductive layers 25b and 13b. As can be seen from an electrically equivalent circuit shown in FIG. 28B, capacitances Cq1 and Cq2 are connected in parallel between electrode nodes VA and VB. Similarly to the structure shown in FIG. 27A, capacitances CW1 and CW2 are electrically connected in parallel between electrode nodes VA and VB. Further, capacitances n·CS1 and n·CS2 are connected in series between electrode nodes VA and VB.

Interlayer insulating films 26a and 26b have thicknesses sufficiently larger than those of gate insulating films 14a and 14b. Therefore, capacitances Cq1 and Cq2 each have a breakdown voltage of power supply voltage VCC or more. By utilizing the capacitance element shown in FIG. 28A, therefore, it is possible to provide a stabilizing capacitance or a decoupling capacitance, which has a further improve area efficiency and a breakdown voltage at the power supply voltage level.

[Capacitance Element 3]

Figure 29A:
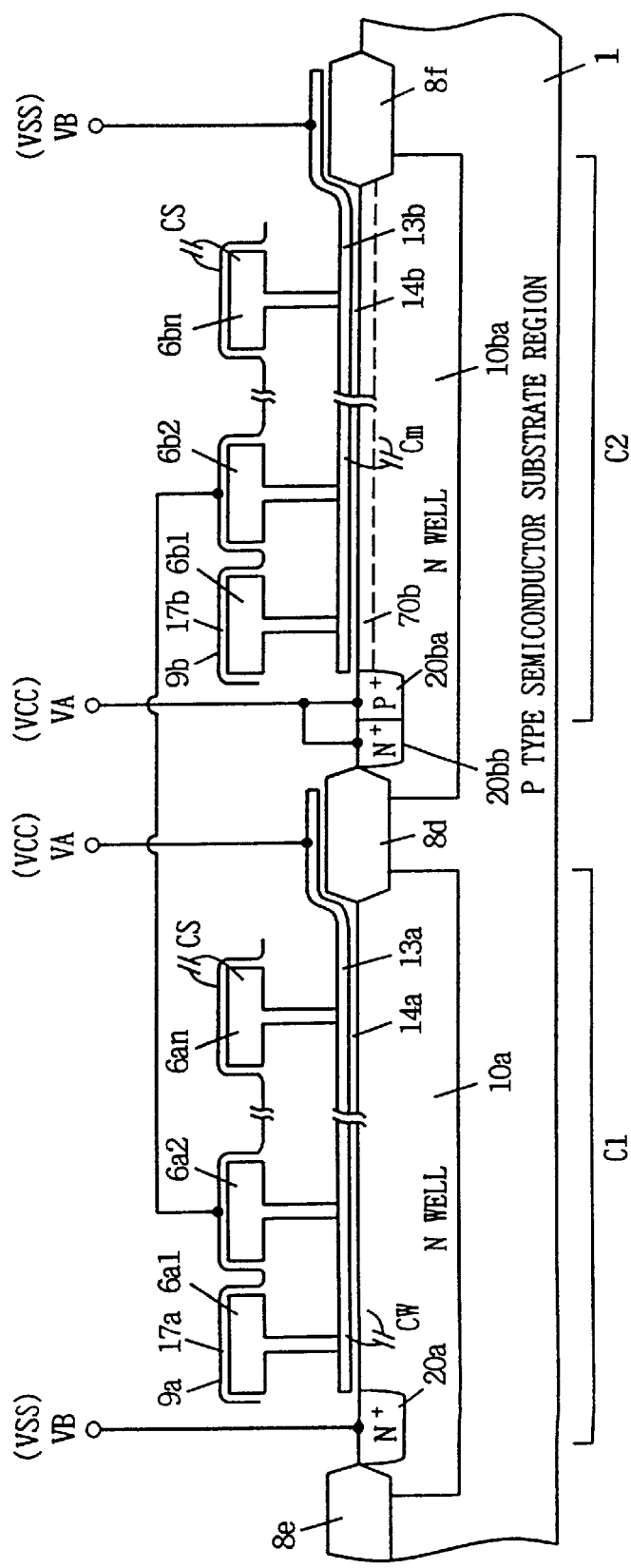
FIGS. 29A and 29B show a schematic sectional structure and an electrically equivalent circuit of a second modification of the embodiment 3 of the invention, respectively.

FIG. 29 shows a structure of a third capacitance element of an embodiment 3 of the invention. The capacitance element shown in FIG. 29A differs from the capacitance element shown in FIG. 27A in the following point. In capacitance element C2, an N-well 10ba serving as a semiconductor substrate region has a surface impurity concentration lower than that of N-well 10b shown in FIG. 28A. A heavily doped P-type impurity region 20ba is arranged at the periphery of N-well 10ba, and a heavily doped N-type impurity region 20bb is arranged outside impurity region 20ba. Impurity regions 20ba and 20bb are commonly connected to electrode node VA. Structures other than the above are the same as those shown in FIG. 27A, and corresponding parts and portions bear the same reference characters.

In the structure shown in FIG. 29A, conductive layer 13b which is formed on the surface of N-well 10ba with gate insulating film 14b therebetween is electrically connected to electrode node VB receiving ground voltage VSS. Impurity regions 20ba and 20bb formed at N-well 10ba are electrically connected to electrode node VA receiving power supply voltage VCC. In this structure, therefore, a channel region 70b is formed at the surface portion of N-well 10ba under conductive layer 13b. Therefore, conductive layer 13b, gate insulating film 14b, channel region 70b and impurity region 20ba form MOS capacitor Cm.

Figure 29B:
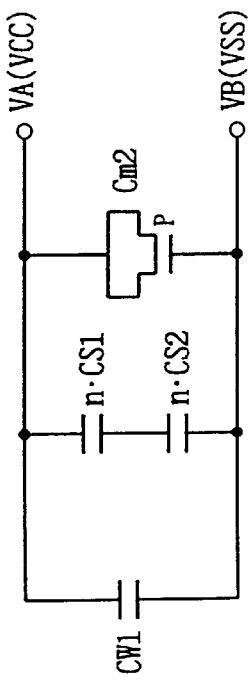

In this structure, the MOS capacitor is formed of the p-channel MOS transistor, in which gate electrode is electrically connected to electrode node VB and source/drain regions are electrically connected to electrode node VA, as can be seen from an electrically equivalent circuit shown in FIG. 29B. The MOS capacitor can have a larger capacitance value than a conventional parallel plane electrode type capacitor. In this case, therefore, the capacitance can have a good area efficiency. Although impurity region 20bb is formed at N-well 10ba, power supply voltage VCC is applied to N-well 10ba to prevent a substrate effect by rendering the substrate potential of the p-channel MOS transistor forming the MOS capacitor equal to its source potential, so that the substrate effect of this MOS capacitor is prevented. Thereby, the MOS transistor has a constant threshold voltage, and thus the capacitance value of MOS capacitor is stably held (constant depletion layer capacitance is held).

[Capacitance Element 4]

FIG. 30A schematically shows a structure of a fourth capacitance element of the embodiment 3 of the invention. The capacitance element shown in FIG. 30A differs from the capacitance element shown in FIG. 29A in the following point. In capacitance elements C1 and C2, conductive layers 25a and 25b corresponding to the bit lines are formed on conductive layers 13a and 13b corresponding to the word lines with interlayer insulating films 26a and 26b therebetween, respectively. Conductive layer 25a corresponding to the bit line is electrically connected commonly to conductive layers 61a–6an corresponding to the storage nodes. Conductive layer 25b corresponding to the bit line is electrically connected to electrode node VA and is also electrically connected commonly to conductive layers 6b1–6bn. Structures other than the above are the same as those shown in FIG. 29A, and corresponding parts and portions bear the same reference characters.

In the structure shown in FIG. 30A, capacitance Cq is formed between conductive layers 25a and 13a of capacitance element C1, and another capacitance Cq is formed between conductive layers 25b and 13b of capacitance element C2. Therefore, the electrically equivalent circuit shown in FIG. 30A additionally includes capacitances Cq1 and Cq2 connected between electrode nodes VA and VB compared with the electrically equivalent circuit shown in FIG. 29B. In the structure shown in FIG. 30A, the capacitance value of the capacitance element can be further increased by the capacitance values of capacitances (Cq1 and Cq2) formed of conductive layers 25a and 25b corresponding to the bit lines, conductive layers 13a and 13b corresponding to the word lines and interlayer insulating films 26a and 26b.

[Capacitance Element 5]

FIG. 31A shows a structure of a fifth capacitance element of the embodiment 3 of the invention. The structure shown in FIG. 31A differs from the structure shown in FIG. 29A in the following point. Capacitance element C1 is formed at P-well 10ab, which is formed at the surface of N-well 80a formed at the surface of P-type semiconductor substrate 1.

P-well 10ab has a lower surface impurity concentration. A heavily doped N-type impurity region 20aa is formed at the periphery of P-well 10ab, and a heavily doped P-type impurity region 20ab is formed immediately outside impurity region 20aa. Impurity regions 20aa and 20ab are electrically connected commonly to electrode node VB. N-well 80a is connected to electrode node VA through heavily doped N-type impurity region 20g. N-well 80a is provided for preventing an influence on the substrate potential of memory cell (substrate potential of the access transistor) of the memory cell array formed at another region of P-type semiconductor substrate region 1. Structures other than the above are the same as those shown in FIG. 29A, and corresponding parts and portions bear the same reference characters.

In the capacitance element C1, P-well 10ab has a relatively low surface impurity concentration, which provides a structure equivalent to MOS transistor. Conductive layer 13a is electrically connected to electrode node VA, which receives power supply voltage VCC. Electrode node VB receives ground voltage VSS. Therefore, channel 72a is formed at the surface of P-well 10ab, and serves as an electrode of the capacitance. Thus, an MOS capacitor using a p-channel MOS transistor is formed at P-well 10ab.

As can be seen from FIG. 31B showing an electrically equivalent circuit, the MOS capacitor formed of n-channel MOS transistor is connected between electrode nodes VA and VB instead of capacitor CW, and additionally, junction capacitance Cj between P-well 10ab and N-well 80a is connected between nodes VA and VB. By utilizing this MOS capacitor of a triple well structure as capacitance C1, the capacitance of capacitance element can be increased, and the capacitance element can have an improved area efficiency.

[Capacitance Element 6]

Figure 32A:
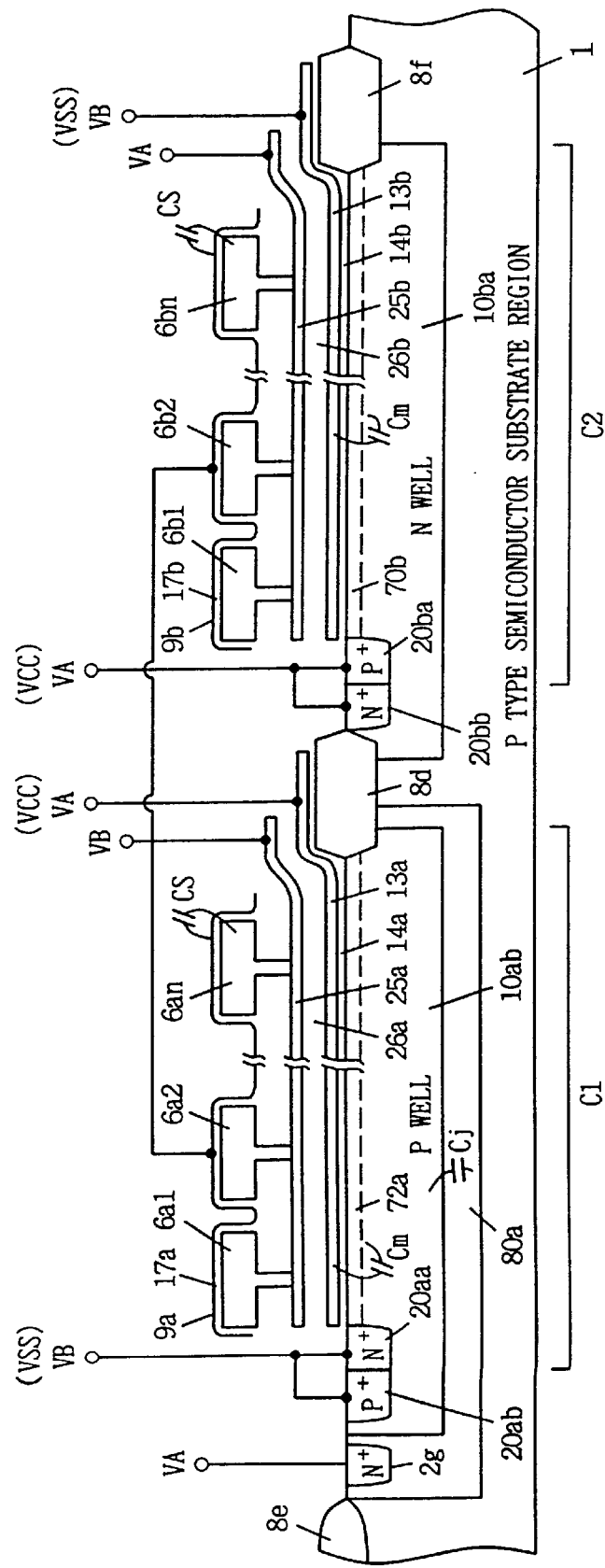
FIGS. 32A and 32B show a schematic sectional structure and an electrically equivalent circuit of a fifth modification of the embodiment 3 of the invention, respectively.

FIG. 32A shows a structure of a sixth capacitance element of the embodiment 3 of the invention. The capacitance element shown in FIG. 32A differs from the capacitance element shown in FIG. 31A in the following point. In capacitance element C1, conductive layer 25a corresponding to the bit line is formed on conductive layer 13a corresponding to the word line with interlayer insulating film 26a therebetween. Conductive layers 6a1–6an corresponding to the storage node are electrically connected commonly to conductive layer 25a. Conductive layer 25a is electrically connected to electrode node VB.

In capacitance element C2, conductive layer 25b corresponding to the bit line is formed on conductive layer 13b corresponding to the word line with interlayer insulating film 26b therebetween. Conductive layers 6b1–6bn corresponding to the storage nodes are formed on conductive layer 25b, and are electrically and commonly connected to conductive layer 25b. Conductive layer 25b is electrically connected to electrode node VA. Structures other than the above are the same as that of the capacitance element shown in FIG. 31A. Corresponding parts and portions bear the same reference characters.

Figure 32B:
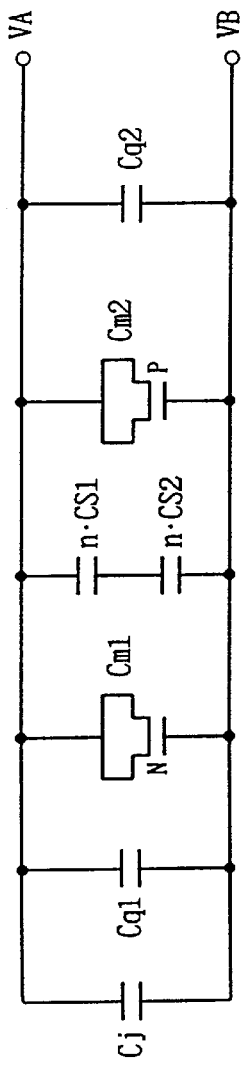

In the structure shown in FIG. 32A, capacitance Cq is formed by conductive layer 25a, interlayer insulating film 26a and conductive layer 13a. Likewise, capacitance Cq is formed by conductive layer 25b, interlayer insulating film 26b and conductive layer 13b. Therefore, as can be seen from FIG. 32B showing an electrically equivalent circuit, capacitance Cq1 formed by conductive layer 13a, interlayer insulating film 26a and conductive layer 25a is connected between electrode nodes VA and VB. Capacitance Cq2 formed by conductive layer 13b, interlayer insulating film 26b and conductive layer 25b is electrically connected between electrode nodes VA and VB. Therefore, the capacitance element shown in FIG. 32A has the capacitance value which is larger by the capacitance values of capacitances Cq1 and Cq2 than that of capacitance element shown in FIG. 31A, and thus can have a good area efficiency.

[Capacitance Element 7]

FIG. 33 schematically shows a structure of a seventh capacitance element of the embodiment 3 of the invention. The structure of the capacitance element shown in FIG. 33 differs from that of the capacitance element shown in FIG. 27A in the following point. In capacitance element C1, field insulating films 80aa, 80ab and 80ac are formed at surface portions of N-well 10a under the portions of electrical connections between conductive layer 13a and conductive layers 6a. The structure of capacitance element C1 is the same as that of the capacitance element shown in FIG. 26 merely except for connection of the electrode nodes. In the capacitance element C2, field insulating films 80ba, 80bb and 80bc are formed at surface portions of N-well 10b under the portion of electrical connections between conductive layer 13a and conductive layers 6b1–6bn. Structures other than the above are the same as those shown in FIG. 27A. Corresponding parts and portions bear the same reference characters.

According to the structure of capacitance element shown in FIG. 33, it is possible to prevent electrical connection of conductive layers 6a1–6an and 6b1–6bn to N-wells 10a and 10b, respectively, similarly to the structure of capacitance element shown in FIG. 26, even if conductive layers 13a and 13b are excessively removed by etching in the process of forming contacts providing electrically connections between conductive layers 6a1–6an and conductive layer 13a and electrical connections between conductive layers 6b1–6bn and conductive layer 13b. Thereby, the reliability of capacitance element can be improved.

The structure having field insulating films 80aa–80ac and 80ba–80bc shown in FIG. 33 can be applied to the structure shown in FIG. 31A. In the structure shown in FIG. 31A, the field insulating film is formed at the N-well, but an impurity region serving as a channel stopper is not formed in the N-well, so that channels are continuously formed at the surface of N-well, and thus no adverse effect is exerted on the function as the MOS capacitor.

According to the embodiment 3 of the invention, as described above, the conductive layer is formed on the surface of semiconductor substrate region with the thin gate insulating film therebetween, and a plurality of capacitances of the same structures as the memory cell capacitor are arranged in parallel above the conductive layer, so that the capacitance element having a required capacitance value can be implemented with a small occupying area. In particular, a large junction capacitance is formed between N-well and P-type semiconductor substrate, although not shown in the electrically equivalent circuit of the embodiment 3. This junction capacitance is not connected between the electrode nodes, but functions as a large parasitic capacitance connected to one of electrode nodes. Therefore, in the structure where this capacitance element is used as a stabilizing capacitance or a decoupling capacitance, the capacitance value can be increased owing to the large parasitic capacitance, and thus the stabilizing or decoupling function can be achieved more reliably.

The embodiment 3 has been described in connection with the case where the capacitance element is formed at the N-well. However, similar operation and effect can be achieved even if the capacitance element is formed at the P-well.

In the embodiment 3, since the capacitors corresponding to the memory cell capacitors are connected in series, the breakdown voltage can be increased to power supply voltage VCC level, so that functions as the stabilizing capacitance and the decoupling capacitance can be fully achieved even if the capacitance element is connected between the nodes across which the voltage at the power supply voltage level is applied.

[Embodiment 4]
[Capacitance Element 1]

FIG. 34A schematically shows a structure of a first capacitance element of an embodiment 4 of the invention. In FIG. 34A, a field insulating film 80 corresponding to an element isolating film for memory cell isolation is formed at the surface of P-type semiconductor substrate region 1. Insulating film 14 corresponding to the gate insulating film is formed on field insulating film 80. Conductive layer 13 corresponding to the word line is formed on gate insulating film 14. Conductive layers 6a1–6an and 6b1–6bn corresponding to the storage nodes are formed on conductive layer 13 with a space between each other. Conductive layers 6a1–6an and 6b1–6bn may be arranged in a matrix form (see FIGS. 18 and 19).

Conductive layer 9a corresponding to the cell plate is formed on conductive layers 6a1–6an with insulating film 17a corresponding to the memory cell capacitor insulating film therebetween. Conductive layer 9b is formed on conductive layers 6b1–6bn with insulating film 17b corresponding to the capacitor insulating film therebetween. Conductive layers 9a and 9b are electrically connected to electrode nodes VA and VB, respectively. Electrode nodes VA and VB are not supplied with a constant voltage but are supplied with signals.

In the structure of capacitance element shown in FIG. 34A, two capacitance elements C1 and C2 are electrically connected in series between electrode nodes VA and VB. Each of capacitance elements C1 and C2 is equivalent to the structure including a plurality of parallel-connected unit capacitance elements corresponding to memory cell capacitors.

In the structure where the N-well is formed at the surface of P-type semiconductor substrate region 1, and conductive layer 13 is formed on the N-well with gate insulating film 14 therebetween, a large junction capacitance is formed between the N-well and the p-type semiconductor substrate region. In FIG. 34B, this parasitic capacitance is shows as a capacitance Cpr represented by broken line. A PN-junction capacitance is formed between conductive layer 13 and the semiconductor substrate region. A major portion of the PN junction is implemented by this depletion layer capacitance. Field insulating film 80 has a thickness sufficiently larger than the width (thickness) of this depletion layer. Therefore, the capacitance value of parasitic capacitance Cpr formed by conductive layer 13, gate insulating film 14, field insulating film 80 and P-type semiconductor substrate region 1 is sufficiently smaller than the capacitance value of the PN-junction capacitance formed by the N-well and the P-type semiconductor substrate region. When the signal potentials on electrode nodes VA and VB rapidly change, parasitic capacitance Cpr associated with conductive layer 13 can therefore be sufficiently reduced, and therefore, potential change on one of the electrodes (conductive layers 9a and 9b) can be rapidly transmitted to the other electrode, and thus the capacitance element can have good frequency characteristics. When used as the coupling capacitance, electric charges can be transmitted between the electrode nodes without dispersing charges to the parasitic capacitance, so that the coupling capacitance can have a good charge transmitting efficiency.

[Capacitance Element 2]

Figure 35A:
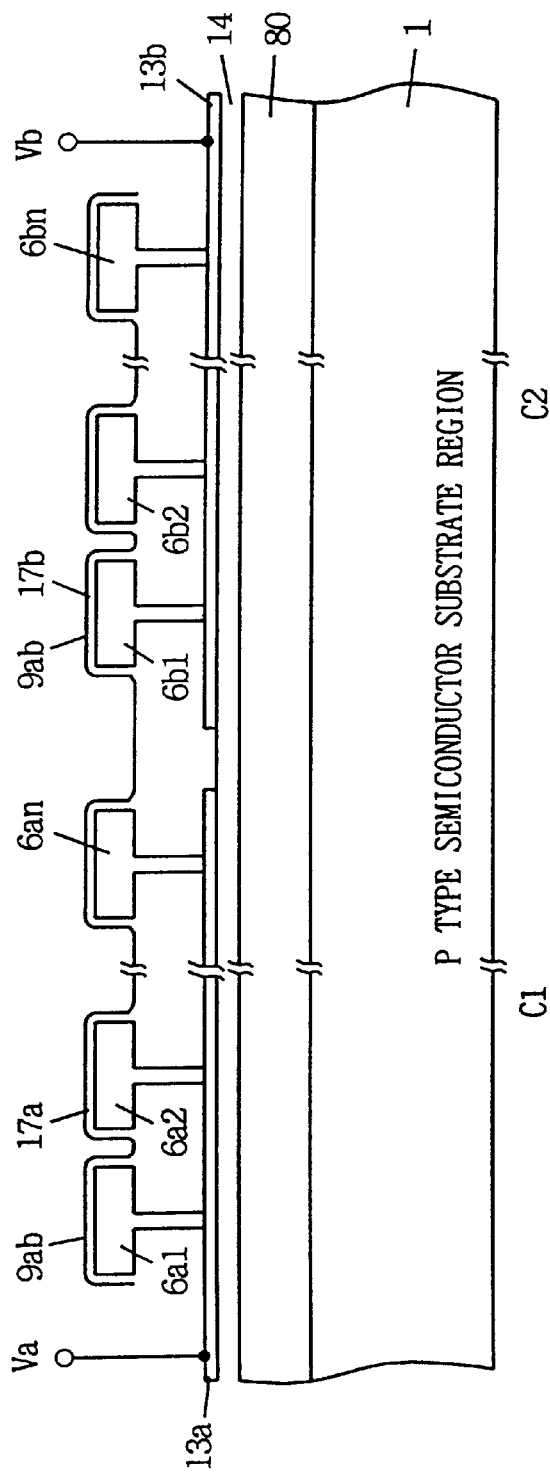
FIGS. 35A and 35B show a schematic sectional structure and an electrically equivalent circuit of a first modification of the embodiment 4 of the invention, respectively.
Figure 35B:
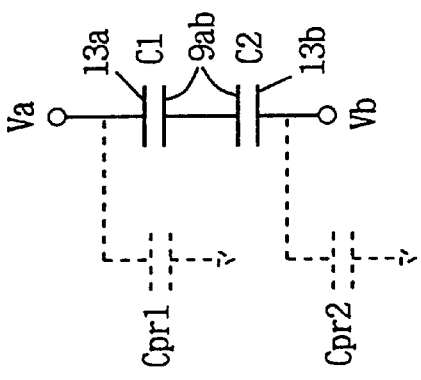

FIG. 35A shows a structure of a second capacitance element of the embodiment 4 of the invention. In the structure shown in FIG. 35A, a conductive layer 9ab corresponding to the cell plate is provided commonly to conductive layers 6a1–6an and 6b1–6bn corresponding to the storage nodes, and is arranged over conductive layers 6a1–6an and 6b1–6bn with gate insulating films 17a and 17b therebetween, respectively. A conductive layer corresponding to the word line and formed on field insulating film 80 with gate insulating film 14 therebetween is divided into conductive layer 13a provided for conductive layers 6a1–6an and conductive layer 13b provided for conductive layers 6ba–6bn. Conductive layers 13a and 13b are electrically connected to electrode nodes VA and VB, respectively. In the structure of capacitance element shown in FIG. 35A, a parasitic capacitance Cpr1 formed between conductive layer 13a and P-type semiconductor substrate region 1 is connected between electrode node Va and the substrate region, and a parasitic capacitance Cpr2 formed between conductive layer 13b and semiconductor substrate region 1 is connected to electrode node Vb, as can be seen from FIG. 35B showing an electrically equivalent circuit. Parasitic capacitances Cpr1 and Cpr2 have sufficiently small capacitance values owing to thick field insulating film 80. Therefore, signals on electrode nodes Va and Vb change rapidly, so that the capacitance element can have good frequency characteristics.

Since two capacitance elements C1 and C2 are connected in series between electrode nodes Va and Vb, it is possible to provide the capacitance element having a breakdown voltage of the power supply voltage level even in the capacitance element which includes a plurality of parallel-connected unit capacitance elements corresponding to the memory cell capacitors.

[Capacitance Element 3]

Figure 36A:
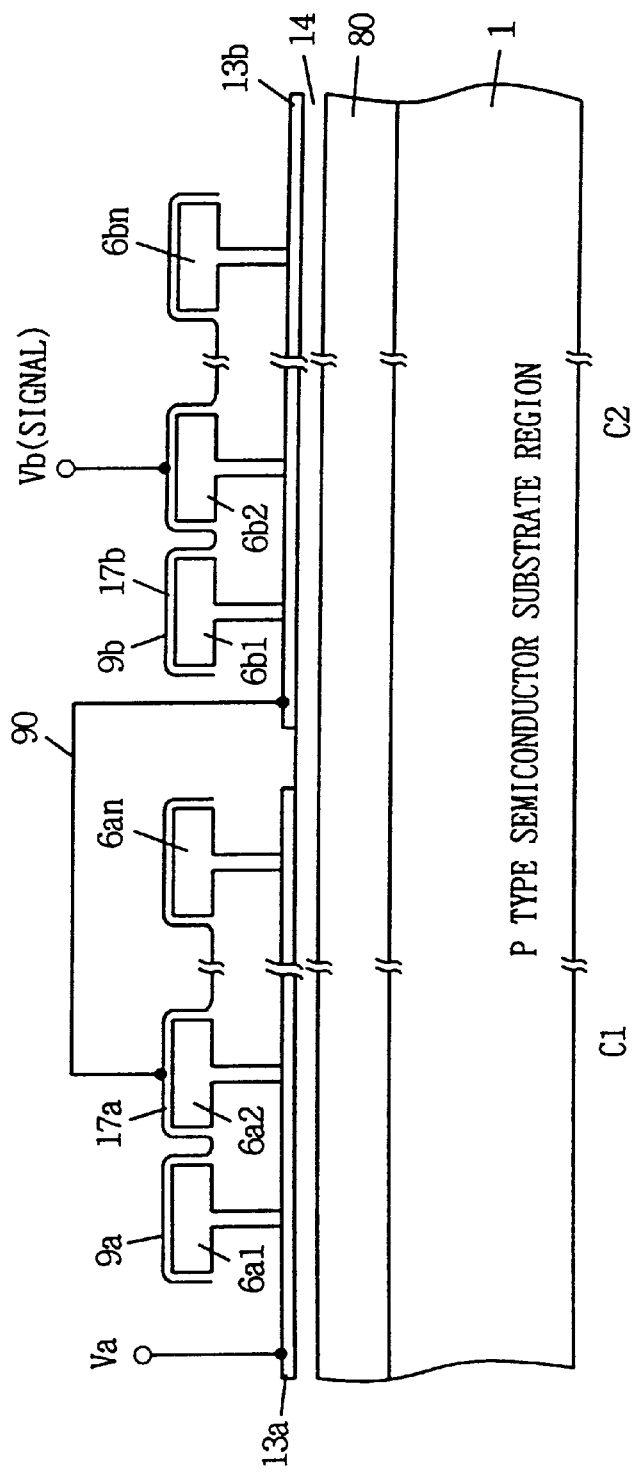
FIGS. 36A and 36B show a schematic sectional structure and an electrically equivalent circuit of a second modification of the embodiment 4 of the invention, respectively.
Figure 36B:
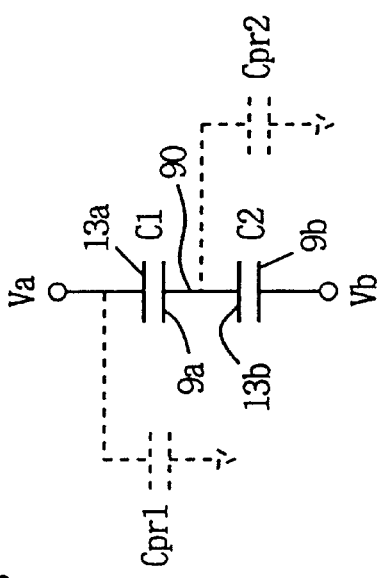

FIG. 36A shows a structure of a third capacitance element of the embodiment 4 of the invention. In the capacitance element shown in FIG. 36A, a conductive layer corresponding to the word line and formed on field insulating film 80 and gate insulating film 14 is divided into conductive layer 13a provided for conductive layers 6a1–6an corresponding to the storage nodes and conductive layer 13b provided for conductive layers 6b1–6bn corresponding to the storage nodes. Likewise, conductive layer 9a corresponding to the cell plate is formed over conductive layers 6a1–6an with insulating film 17a therebetween. Conductive layer 9b is formed over conductive layers 6b1–6bn with insulating film 17b therebetween. Conductive layers 9a and 9b are isolated from each other. Conductive layer 9a is electrically connected to conductive layer 13b through an interconnection 90 of a low resistance. Conductive layer 13a is electrically connected to electrode node Va, and conductive layer 9b is electrically connected to electrode node Vb.

In the structure of capacitance element shown in FIG. 36A, parasitic capacitances Cpr1 and Cpr2 formed between conductive layers 13a and 13b and semiconductor substrate region 1, respectively, are connected to electrode node Va and internal node (low resistance interconnection 90), respectively, as can be seen from FIG. 36A showing an electrically equivalent circuit. However, these parasitic capacitances Cpr1 and Cpr2 have sufficiently small capacitance values owing to thick field insulating film 80. Capacitance element C1 having electrodes formed of conductive layers 13a and 9a and capacitance element C2 having electrodes formed of conductive layers 9b and 13b are electrically connected in series between electrode nodes VA and VB.

In this case, since the capacitance values of parasitic capacitances Cpr1 and Cpr2 are sufficiently small, a signal supplied to electrode node Va is transmitted to capacitance element C2 through low resistance interconnection 90, and is further transmitted through capacitance element C2 to electrode node Vb. Meanwhile, a signal supplied to electrode node Vb is transmitted to electrode node Va via low resistance interconnection 90 and capacitance element C1. Therefore, the capacitance element can have good frequency characteristics. Each of capacitance elements C1 and C2 is formed of a plurality of parallel-connected unit capacitance elements corresponding to the memory cell capacitors, so that they have good area efficiencies, and therefore the capacitance element can achieve hood frequency response characteristics with a small occupying area.

Since capacitance elements C1 and C2 are connected in series between electrode nodes Va and Vb, a voltage difference between electrode nodes Va and Vb can be at power supply voltage VCC level. Therefore, this capacitance element can be used also as the coupling capacitor for signals at the MOS level.

[Capacitance Element 4]

Figure 37A:
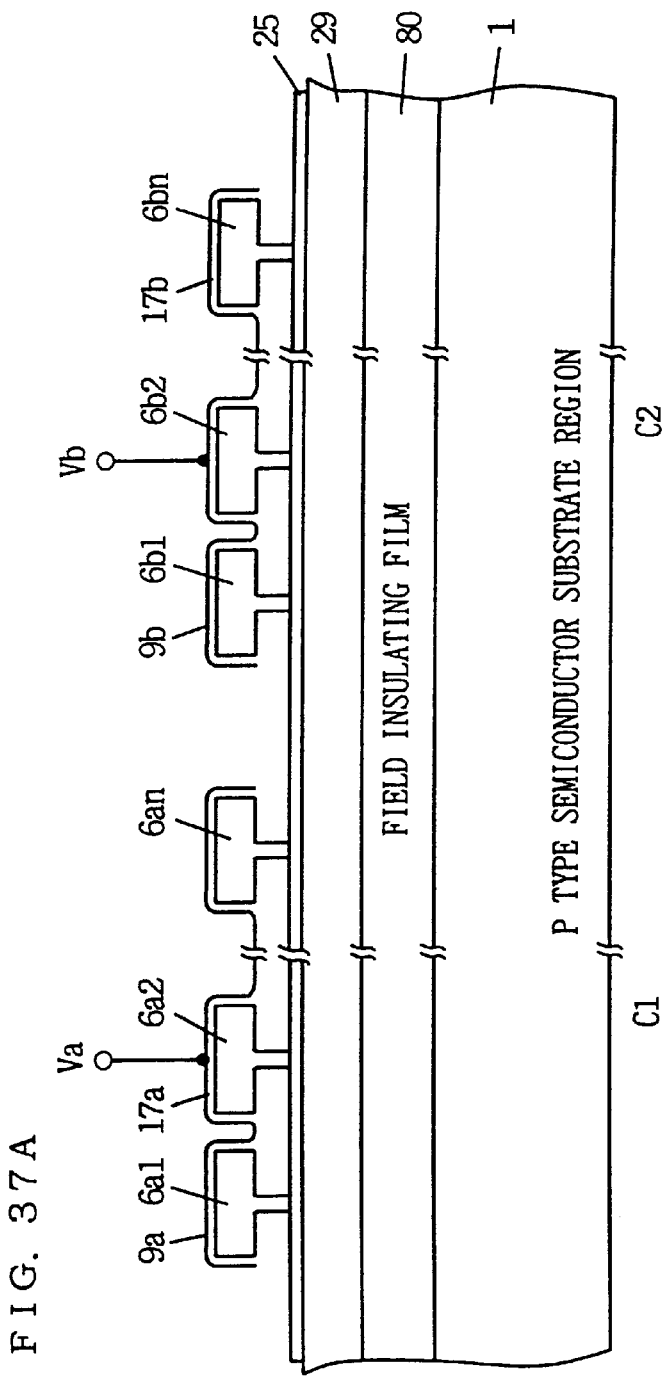
FIGS. 37A and 37B show a schematic sectional structure and an electrically equivalent circuit of a fifth modification of the embodiment 4 of the invention, respectively.
Figure 37B:
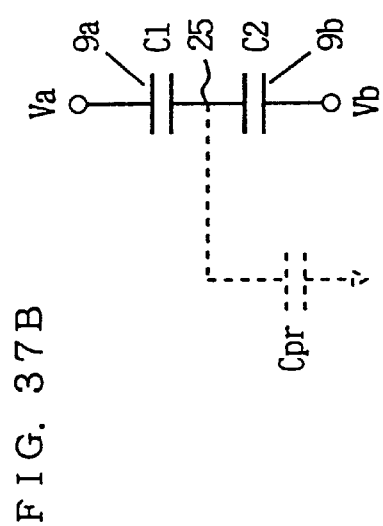

FIG. 37A shows a structure of a fourth capacitance element of the embodiment 4 of the invention. The structure shown in FIG. 37A includes a relatively thick insulating film 29 including a gate insulating film and an interlayer insulating film. Conductive layer 25 corresponding to the bit line is arranged on insulating film 29. Conductive layers 6a1–6an and 6b1–6bn, which correspond to the storage nodes of the memory cell capacitors and are isolated from each other, are formed on conductive layer 25. Conductive layers 6a1–6an and 6b1–6bn are commonly connected to conductive layer 25. Conductive layer 9a corresponding to the cell plate is formed on conductive layers 6a1–6an with insulating film 17a therebetween, and conductive layer 9b corresponding to the cell plate of memory cell capacitor is formed on conductive layers 6b1–6bn with insulating film 17b therebetween. Conductive layers 9a and 9b are isolated from each other. Conductive layer 9a is connected to electrode node Va, and conductive layer 9b is connected to electrode node Vb.

The structure of capacitance element shown in FIG. 37A is equivalent to such a structure that conductive layer 13a corresponding to the word line is replaced with conductive layer 25 corresponding to the bit line in the structure shown in FIG. 34A. The bit line is formed at a higher level than the word line. Therefore, insulating film 29 between conductive layer 25 and field insulating film 80 can be sufficiently thicker than the gate insulating film, because it includes the interlayer insulating film.

Figure 38A:
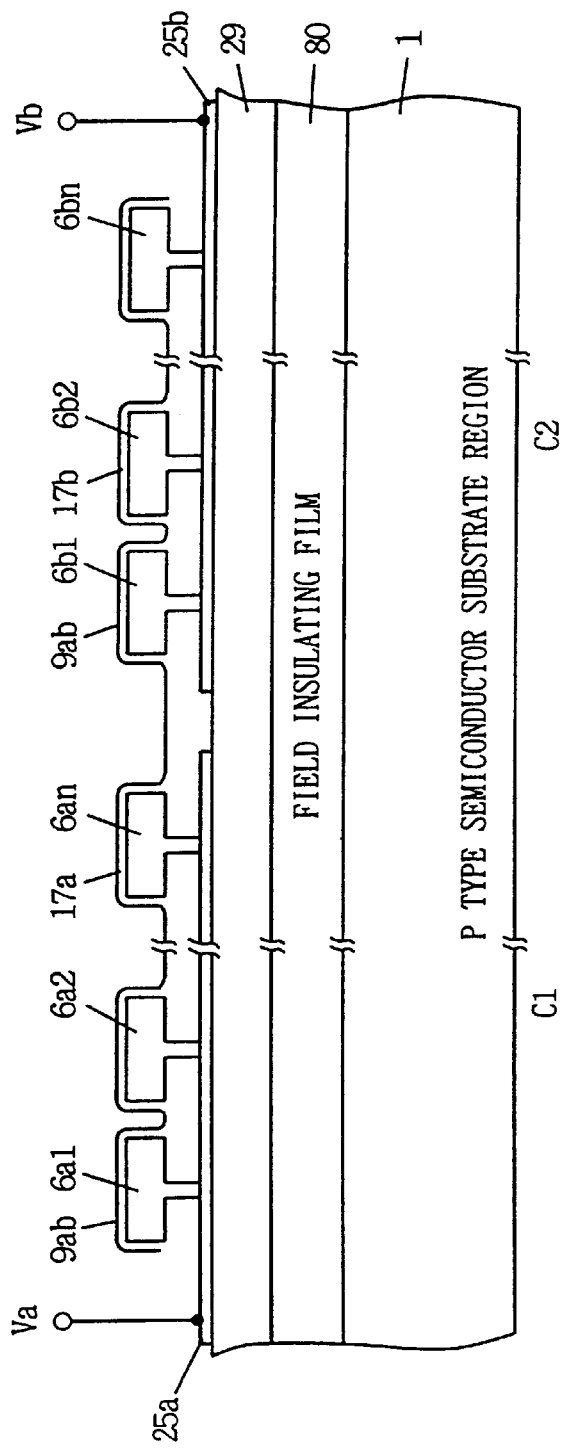
FIGS. 38A and 38B show a schematic sectional structure and an electrically equivalent circuit of a sixth modification of the embodiment 4 of the invention, respectively.
Figure 38B:
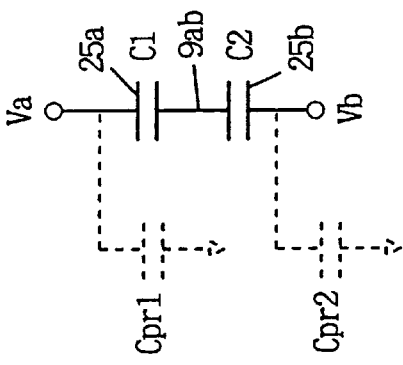

In an electrically equivalent circuit shown in FIG. 38B, therefore, the capacitance value of parasitic capacitance Cpr formed between conductive layer 25 and P-type semiconductor substrate region 1 can be sufficiently smaller than that of the parasitic capacitance of the capacitance element shown in FIG. 34. Thereby, the capacitance element can have good frequency characteristics. In this structure, capacitance element C1 is formed of conductive layer 9a, insulating film 17a and conductive layer 25, and capacitance element C2 is formed of conductive layer 25, conductive layers 6b1–6bn and conductive layer 9b.

[Capacitance Element 5]

FIG. 38A shows a structure of a fifth capacitance element of the embodiment 4 of the invention. In the structure of capacitance element shown in FIG. 38A, a conductive layer is divided into conductive layer 25a provided for conductive layers 6a1–6an corresponding to the storage nodes, and conductive layer 25b provided for conductive layers 6b1–6bn corresponding to the storage nodes. Conductive layer 9ab corresponding to the cell plate is formed commonly for conductive layers 6a1–6an and 6b1–6bn with insulating film 17ab therebetween. Conductive layer 25a is electrically connected to electrode node Va, and conductive layer 25b is electrically connected to electrode node Vb. Structures other than the above are the same as those shown in FIG. 37A.

In the structure of capacitance element shown in FIG. 38A, the parasitic capacitance includes parasitic capacitance Cpr1 formed between conductive layer 25a and semiconductor substrate region 1 and parasitic capacitance Cpr2 formed between conductive layer 25b and semiconductor substrate region 1, as can be seen from FIG. 38 showing an electrically equivalent circuit. The parasitic capacitance Cpr1 is connected to electrode node Va, and parasitic capacitance Cpr2 is connected to electrode node Vb. The capacitance values of parasitic capacitances Cpr1 and Cpr2 are sufficiently small owing to field insulating film 80 and thick insulating film 29, and the capacitance values of parasitic capacitances present at electrode nodes Va and Vb can be sufficiently small, so that the potentials on electrode nodes Va and Vb can change rapidly, and therefore the capacitance element can have good frequency response characteristics.

[Capacitance Element 6]

Figure 39A:
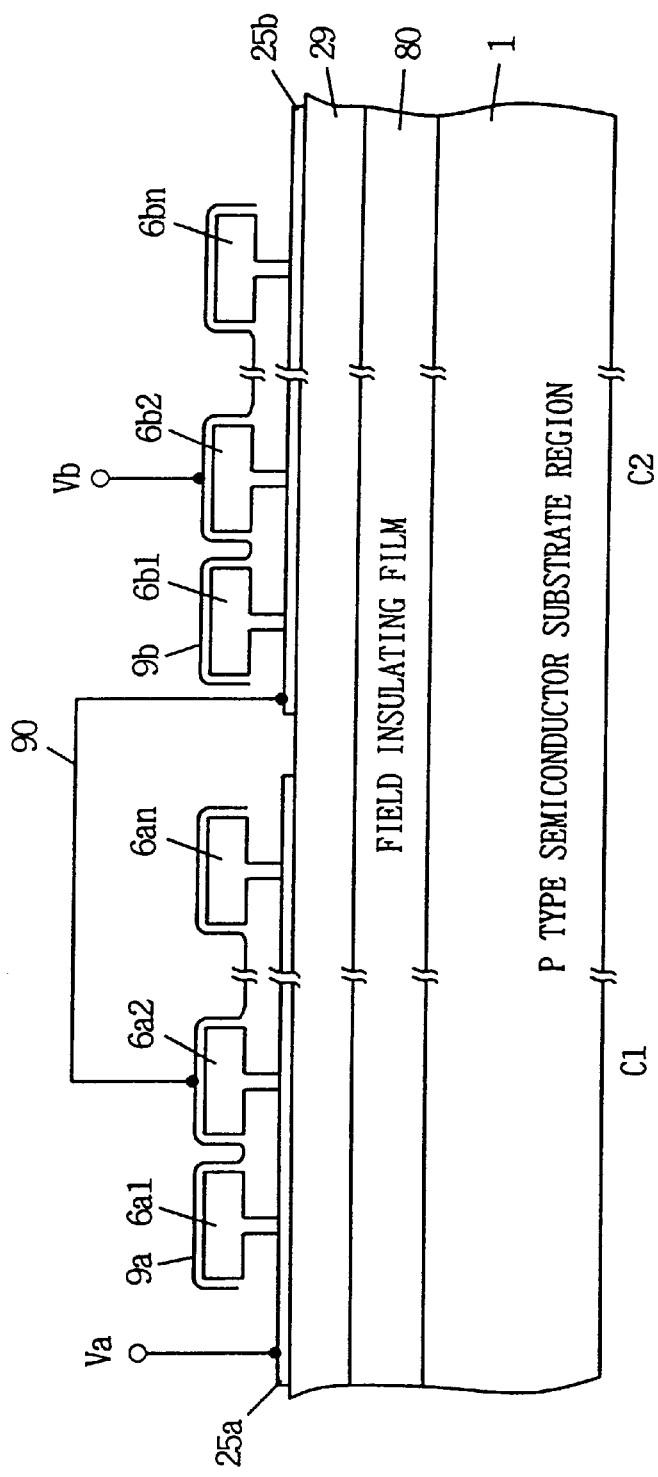
FIGS. 39A and 39B show a schematic sectional structure and an electrically equivalent circuit of a seventh modification of the embodiment 4 of the invention, respectively.

FIG. 39A shows a structure of a sixth capacitance element of the embodiment 4 of the invention. In the structure of capacitance element shown in FIG. 39A, conductive layer 25 is divided into conductive layer 25a provided for conductive layers 6a1–6an corresponding to the storage nodes, and conductive layer 25b provided for conductive layers 6b1–6bn. Conductive layer 9a which corresponds to the cell plate and in provided for conductive layers 6a1–6an corresponding to the storage nodes is electrically connected to conductive layer 25b via low resistance interconnection 90. Conductive layer 9b corresponding to the cell plate is formed for conductive layers 6b1–6bn corresponding to the storage nodes. Conductive layer 25a is electrically connected to electrode node Va, and conductive layer 9b in electrically connected to electrode node Vb.

Figure 39B:
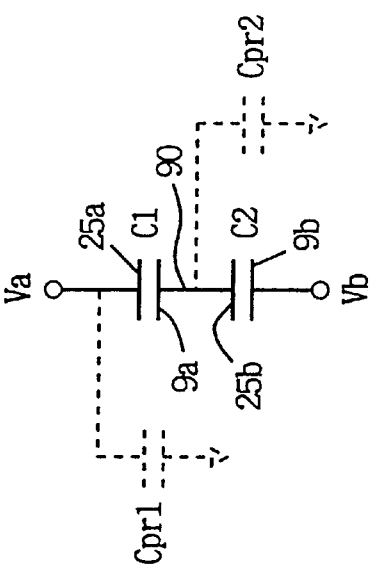

In the structure of capacitance element shown in FIG. 39A, two capacitance elements C1 and C2 are connected in series between electrode nodes Va and Vb, as can be seen from FIG. 39B showing an electrically equivalent circuit. Parasitic capacitance Cpr1 formed between conductive layer a and semiconductor substrate region 1 is connected to electrode node Va and parasitic capacitance Cpr2 formed between conductive layer 25b and substrate region 1 is equivalently connected to internal interconnection 90. Similarly to the structure already described, thick field insulating film 90 and insulating film 29 are formed between conductive layer 25b and semiconductor substrate region 1, so that the capacitance values of parasitic capacitances Cpr1 and Cpr2 can be sufficiently small. In this case, therefore, the capacitance element can have good frequency response characteristics similarly to the foregoing structures.

In the embodiment 4, field insulating film 80 is formed on P-type semiconductor substrate region 1. However, P-type semiconductor substrate region 1 may be an N-type semiconductor substrate region.

[Application Examples of Capacitance Element of Embodiment 4]

[Application Example 1]

Figure 40A:
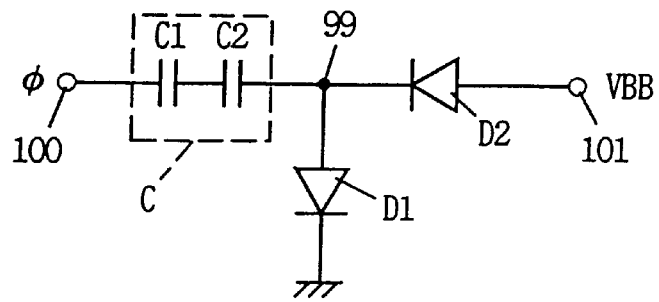
FIGS. 40A and 40B show a schematic structure of a semiconductor device provided with the capacitance element of the embodiment 4 of the invention and its operation waveforms, respectively.
Figure 40B:
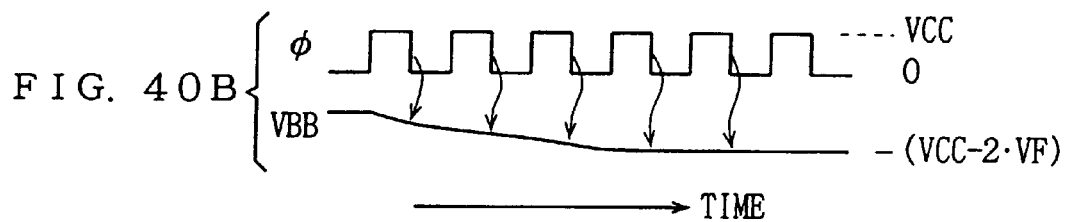

FIG. 40A shows a structure of a semiconductor device according to the invention, and FIG. 40B is a signal waveform diagram representing an operation of the semiconductor device shown in FIG. 40A. The semiconductor device utilizes a capacitance element including capacitance elements of the embodiment 4 of the invention, which are connected in series and corresponding to memory cell capacitors. In FIG. 40A, the semiconductor device includes a capacitance C connected between an input node 100 and an internal node 99, a diode D1 connected between internal node 99 and a ground node, and a diode D2 connected between internal node 99 and an output node 101. Capacitance C is formed by a plurality of capacitance elements C1 and C2 which are connected in series and each have a structure similar to that of memory cell capacitor. Each of capacitance elements C1 and C2 is the same as that already described in connection with the embodiment 4. Diode D1 has an anode connected to internal node 99, and a cathode connected to the ground node. Diode D2 has a cathode connected to internal node 99, and an anode connected to output node 101. An operation of this semiconductor device will be described below with reference to an operation waveform diagram of FIG. 40B.

A clock signal φ supplied from a signal source (not shown) to input node 100 varies between ground voltage VSS and power supply voltage VCC with a predetermined pulse width and a predetermined frequency. When clock signal φ rises to the high level, the potential on internal node 99 rises owing to a charge pump operation of capacitance C. The potential on internal node 99 rises above the potential on output node 101, and diode D2 is reversely biased and turned off. Meanwhile, diode D1 is turned on to lower the potential on internal node 99 to a voltage level of VF. VF represents a forward voltage drop of diodes D1 and D2.

When clock signal φ lowers to the low level of 0 V, voltage VF on internal node 99 lowers to the voltage level of VF-VCC owing to the charge pump operation of capacitance C. In this state, diode D2 is turned on, and positive charges flow from output node 101 to internal node 99, so that voltage VBB on output node 101 lowers. When the potential difference between output node 101 and internal node 99 goes to VF, diode D2 is turned off. Again, clock signal φ rises to the high level and the potential on internal node 99 rises, so that diode D1 clamps the potential on internal node 99 at the voltage level of VF. By repeating this operation, a voltage VBB supplied from output node 101 lowers to a voltage level of −VCC+2·VF.

Voltage VBB is a negative voltage. Negative voltage VBB is utilized as the bias voltage applied to the substrate region of memory cell array of the DRAM. In order to prevent erroneous selection of the word line, such a structure may be employed that negative voltage VBB is transmitted onto non-selected word lines. Such a negative voltage generating circuit is arranged on-chip in the DRAM, and it is desired to minimize an area occupied thereby. A charge pump rate, i.e., an injection amount of charges of capacitance C is proportional to its capacitance value. By utilizing the capacitance (composite capacitance element) having a good area efficiency as described in the embodiments 3 and 4, therefore, it is possible to implement a negative voltage generating circuit which efficiently produces negative voltage VBB at a desired voltage level with a low occupying area.

Particularly in this embodiment 4, a value of the parasitic capacitance connected to the electrode node is small, and the charge pump operation can be performed efficiently in response to clock signal φ, so that negative voltage VBB at a desired voltage level can be rapidly produced. If the parasitic capacitance were large, charges supplied by the charge pump operation would be dispersed into the parasitic capacitance.

[Application Example 2]

Figure 41A:
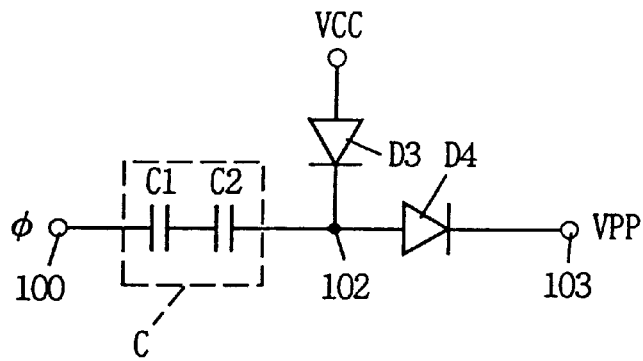
FIGS. 41A and 41B show another structure of a semiconductor device provided with the capacitance element of the embodiment 4 of the invention and its operation waveform, respectively.
Figure 41B:
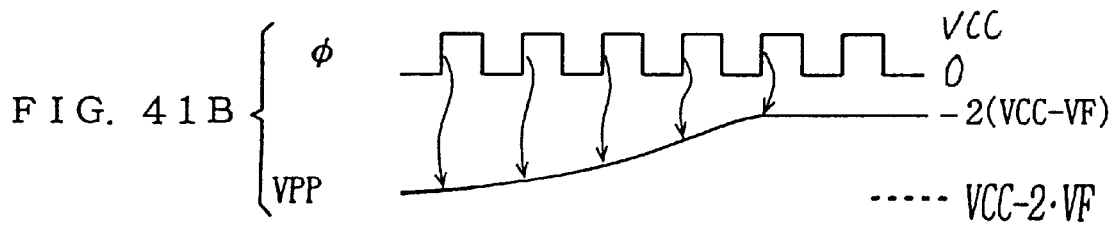

FIG. 41A shows a structure of a semiconductor device according to the invention. FIG. 41B shows an operation waveform of the semiconductor device shown in FIG. 41A. In FIG. 41A, capacitance C is connected between input node 100 and internal node 102, and a diode D3 is connected between power supply node VCC and internal node 102. A diode D4 is connected between internal node 102 and an output node 103. Input node 100 is supplied with clock signal φ. Diode D3 has an anode connected to power supply node VCC, and a cathode connected to internal node 102. Diode D4 has an anode connected to internal node 102, and a cathode connected to output node 103. Capacitance C includes capacitance elements C1 and C2 connected in series. Capacitance elements C1 and C2 are the same as those already described in connection with the embodiment 4. An operation of the semiconductor device shown in FIG. 41A will be described below with reference to an operation waveform diagram of FIG. 41B.

When clock signal φ is at the low level, the potential on internal node 102 lowers to the low level. At this time, diode D3 is turned on, and internal node 102 is clamped at the voltage level of VCC−VF by diode D3. Here, VF represents a forward voltage drop of diodes D3 and D4. In this state, the voltage level of internal node 102 is lower than the voltage level of voltage VPP on output node 103, so that diode D4 is off. When clock signal φ rises to the high level, the voltage level on internal node 102 rises to the voltage level of 2·VCC−VF, and diode D4 is turned on. Thereby, positive charges flow from internal node 102 to output node 103, so that the voltage level of voltage VPP rises. When the voltage level on internal node 102 attains VPP+VF, diode D4 is turned off.

When clock signal φ attains the low level again, the charge pump operation of capacitance C lowers the potential level on node 102, so that diode D3 is turned on, and internal node 102 is precharged to the voltage level of VCC−VF. When the voltage level of clock signal φ rises again, the charge pump operation of capacitance C raises the voltage level on internal node 102. By repeating this operation, the voltage VPP supplied from the output node rises to the voltage level of 2·VCC−2·VF.

This voltage VPP is at a voltage level higher than power supply voltage VCC, and is utilized for forming a word line drive signal transmitted to the selected word line in the DRAM (see FIG. 5A). High voltage VPP is also utilized, for example, for producing a connection control signal for connecting a bit line pair in a selected block to a sense amplifier in the shared sense amplifier structure.

A circuit for producing high voltage VPP is arranged on-chip. Therefore, the high voltage generating circuit occupying a small area is required. The high voltage generating circuit utilizes the charge pump operation of capacitance C, similarly to the negative voltage generating circuit. The quantity of charges which are supplied in one cycle of clock signal φ is proportional to the capacitance value of capacitance C. The charges supplied to internal node 102 is held by the capacitance connected to internal node 102. In order to generate a high voltage by efficiently utilizing charges, therefore, it is desired to minimize the parasitic capacitance of internal node 102. By utilizing the capacitance element of the embodiment 4, the charges can be supplied efficiently, so that it is possible to provide the high voltage generating circuit which occupies a small area and can rapidly and stably produce high voltage VPP.

[Application Example 3]

Figure 42A:
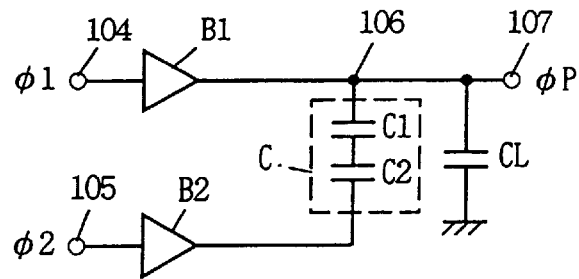
FIGS. 42A and 42B show still another structure of a semiconductor device provided with the capacitance element of the embodiment 4 of the invention and its operation waveform, respectively.
Figure 42B:
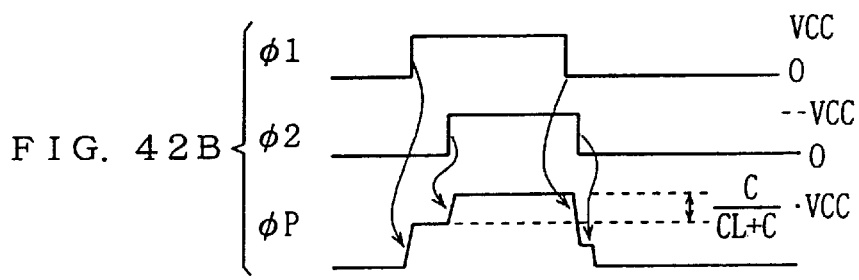

FIG. 42A shows a structure of a semiconductor device utilizing a capacitance element of the embodiment 4 of the invention, and FIG. 42B is a signal waveform diagram representing an operation of the semiconductor device shown in FIG. 42A. In FIG. 42A, the semiconductor device includes a buffer B1 which buffers a control signal (clock signal φ1) applied to a signal input node 104 for transmissions to an internal node 106, a buffer B2 which buffers a control signal (clock signal φ2) applied to a signal input node 105 for transmission to internal node 106, and a load capacitance CL connected between an output node 107 and a ground node. Capacitance C includes capacitance elements C1 and C2 connected in series. An operation of the semiconductor device shown in FIG. 42A will now be described below with reference to a signal waveform diagram of FIG. 42B.

When control signal φ1 applied to signal input node 104 rises to the high level equal to power supply voltage VCC level, buffer B1 raises the potential on node 106, and load capacitance CL is charged to power supply voltage VCC level. At this time, control signal φ2 is still at the low level. When control signal φ2 subsequently rises to the high level, buffer B2 generates a signal at power supply voltage VCC level to capacitance C. In accordance with this signal at the high level from buffer B2, capacitance C performs the charge pump operation to raise the potential on node 106. Charges supplied from capacitance C are supplied to load capacitance CL. Thereby, the voltage level of a signal φP at output node 107 further rises above power supply voltage VCC level. This voltage level can be calculated from the formula described below.

Capacitance C supplies charges of C·VCC to node 106. The capacitance of node 106 (node 107) is equal to (C+CL). Therefore, charges C·VCC thus supplied raise the potential on node 106 (i.e., output node 107) by ΔV represented by the following formula in accordance with the charge conservation rule:

$$C \cdot VCC = \Delta V \cdot (CL+C)$$

and therefore, $$\Delta V = C \cdot VCC/(CL+C)$$

When control signals φ1 and φ2 fall to the low level, the potential on output node 107 lowers to the low level of the ground potential level. Signal UP from output node 107 is used, for example, as a word line boosting signal, which raises further the word line potential when the voltage level of the selected word line attains the high level. The boosted voltage level increases in accordance with increase in capacitance value of capacitance C and in accordance with decrease in the parasitic capacitance. Even in the circuit producing control signal φP, as described above, the parasitic capacitance value of internal node 106 can be reduced by utilizing the capacitance element of the embodiment 4 as capacitor C. Thereby, it is possible to provide rapidly the booster circuit producing control signal φP at an intended voltage level.

[Application Example 4]

Figure 43A:
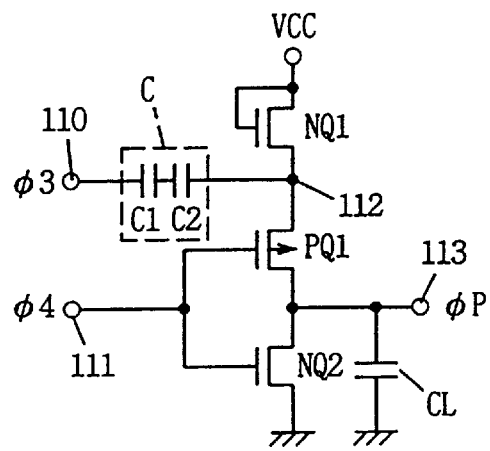
FIGS. 43A and 43B show yet another structure of a semiconductor device provided with the capacitance element of the embodiment 4 of the invention and its operation waveform, respectively.
Figure 43B:
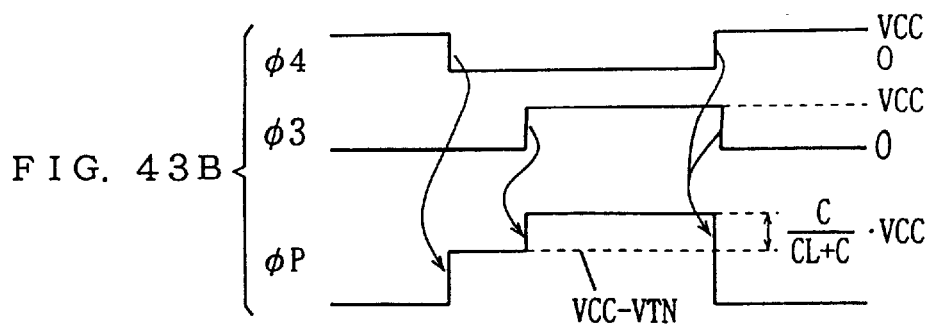

FIG. 43A shows a structure of a semiconductor device utilizing the capacitance element of the embodiment 4 of the invention. FIG. 43B is a signal waveform diagram representing an operation of this semiconductor device shown in FIG. 43A. In FIG. 43A, the semiconductor device includes capacitance C, which is formed of a series combination of capacitance elements C1 and C2 connected in series between input node 110 receiving control signal φ3 and internal node 112, a diode-coupled n-channel MOS transistor NQ1 connected between power supply node VCC and internal node 112, a p-channel MOS transistor PQ1 which has one conduction node connected to internal node 112, a gate connected to input node 111 receiving control signal φ4 and the other conduction node connected to an output node 113, and an n-channel MOS transistor NQ2 which has one conduction node connected to output node 113, a gate connected to control signal input node 111 and the other conduction node coupled to receive the ground potential. Load capacitance CL is arranged between output node 113 and the ground node. MOS transistor NQ1 receives power supply voltage VCC on its gate and drain. MOS transistors PQ1 and NQ2 form an inverter, and use the voltage on internal node 112 and the ground voltage as the operation power supply voltages. An operation of the semiconductor device shown in FIG. 43A will be described below with reference to an operation waveform diagram of FIG. 43B.

When clock signal φ3 is at the low level, internal node 112 is charged to the voltage level of VCC−VTN by MOS transistor NQ1. VTN represents a threshold voltage of MOS transistor NQ1. When control signal φ4 is at the high level of power supply voltage VCC level, MOS transistor PQ1 is off (VCC>VCC−VTN), and MOS transistor NQ2 is on, so that control signal φP from output node 113 is at the low level.

When the control signal φ4 falls from the high level to the low level, MOS transistor NQ2 is turned off, and MOS transistor PQ1 is turned on. Thereby, output node 113 is charged through MOS transistor PQ1, and control signal φP rises to the voltage level of voltage of (VCC−VTN) on internal node 112. When control signal φ3 subsequently rises to the high level of power supply voltage VCC level, the charge pump operation of capacitance C raises the voltage level on internal node 112 to the voltage level of 2·VCC−VTN. Potential rising on internal node 112 is transmitted to output node 113 through MOS transistor PQ1.

MOS transistor NQ1 is off (because the voltage level on internal node 112 is higher than power supply voltage VCC), and the voltage level of control signal φP at output node 113 is raised by charges which are supplied from internal node 112 through MOS transistor PQ1. The rise of voltage level of control signal φP depends on the capacitance values of load capacitance CL and capacitance C. Therefore, the charged potential of load capacitance CL, i.e., the voltage level of control signal φP rises by the voltage level of C·VCC/(CL+C) in accordance with clock signal φ3.

When control signal φ4 rises to power supply voltage VCC level, MOS transistor NQ2 is turned on, so that the charged potential of load capacitance CL is discharged, and control signal φP falls to the low level of the ground potential level. At this time, the control signal φ3 may be still at the high level, in which case MOS transistor PQ1 is turned on if the voltage level on internal node 112 is higher than power supply voltage VCC. In this case, charges are discharged from internal node 112 to the ground node through MOS transistors PQ1 and NQ2, so that the voltage level on internal node 112 lowers. When control signal φ3 falls to the low level of the ground potential level, the voltage level on internal node 112 lowers to the ground potential level, so that MOS transistor PQ1 is completely turned off. At this time, internal node 112 is charged to the voltage level of (VCC−VTN) by MOS transistor NQ1.

The semiconductor device shown in FIG. 43A is used in a circuit generating a control signal which attains a boosted level, i.e., high level only for a predetermined period in accordance with control signals φ3 and φ4. Capacitance C includes a series combination of capacitance elements C1 and C2. Therefore, control signal φP can be changed rapidly in accordance with control signals φ3 and φ4. Control signal φP is used to generate a word line drive signal or a control signal for making connection between the bit line and the sense amplifier in the shared sense amplifier structure.

In the semiconductor device shown in FIG. 43A, the voltage level of internal node 112 is raised by the charge pump operation of capacitance C. The voltage level on internal node 112 depends on capacitance C and the capacitance of parasitic capacitor present in internal node 112. Capacitance C in the embodiment 4 has a sufficiently reduced parasitic capacitance. Therefore, charges can be efficiently supplied into internal node 112, and therefore, capacitance C can have a good charge supply efficiency. In capacitance C, a parasitic capacitance component connected to internal node 112 is small. Therefore, charges supplied to internal node 112 can be transmitted to output node 113 through MOS transistor PQ1, so that control signal φP can be rapidly changed to an intended voltage level.

Capacitance C utilizes capacitance elements C1 and C2 used in the embodiment 4, and therefore has a good area efficiency, so that it is possible to achieve the booster circuit which occupies a small area and generates the boosted control signal capable of making a rapid change to an intended voltage level.

[Application Example 5]

Figure 44:
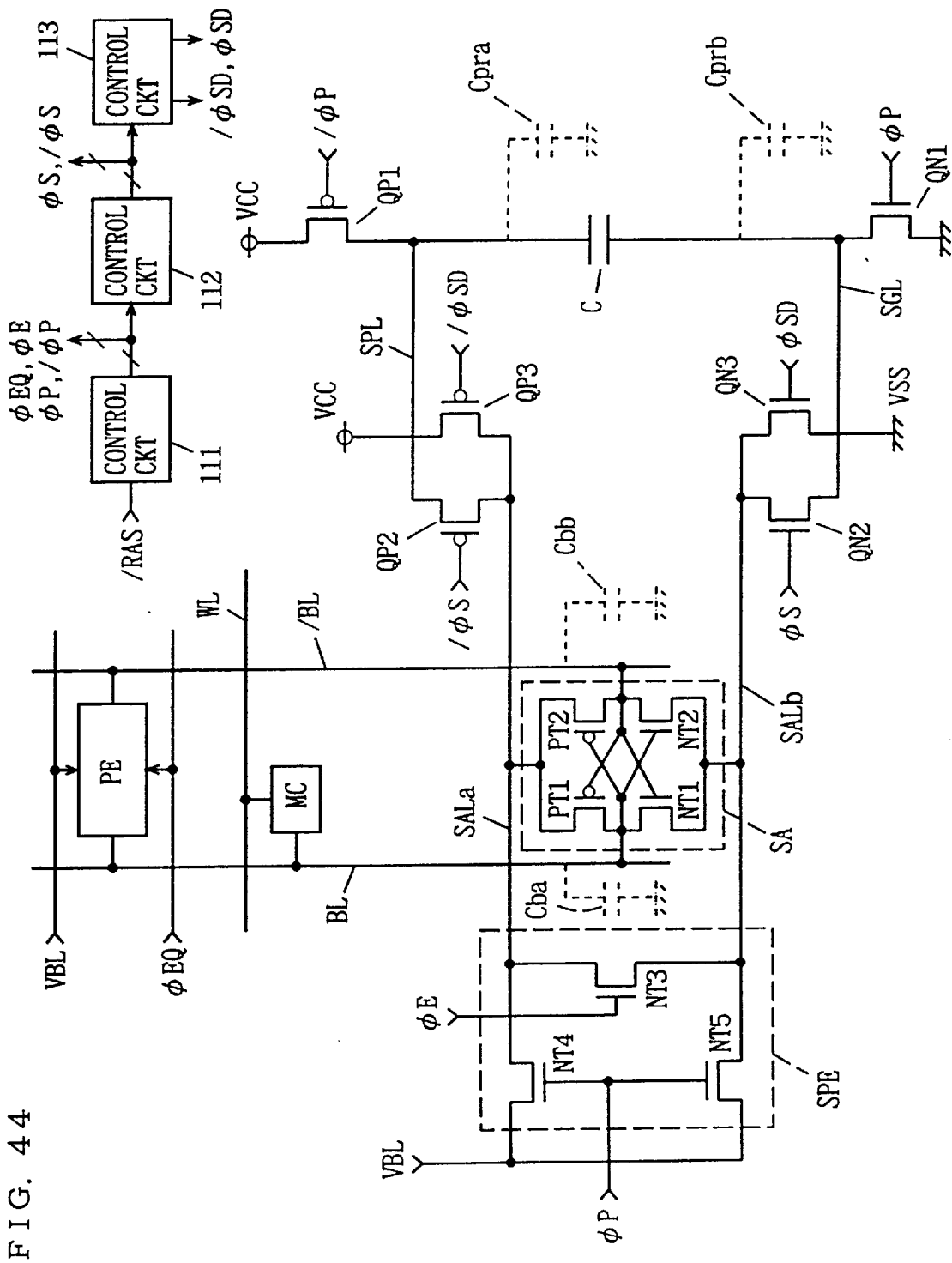
FIG. 44 shows further another structure of a semiconductor device of the embodiment 4 of the invention.

FIG. 44 shows a structure of a fifth application example of the embodiment 4 of the invention. FIG. 44 shows structures of a sense amplifier and a sense amplifier drive portion in a DRAM.

In FIG. 44, memory cell MC is arranged corresponding to the crossing between bit lines BL and /BL and word line WL. As already described, memory cell MC has a memory cell structure of 1-transistor and 1-capacitor type, and this capacitor has a stacked capacitor structure.

For bit lines BL and /BL, there is arranged a bit line precharge/equalize circuit PE, which is activated in response to a precharge/equalize instructing signal φEQ to precharge and equalize bit lines BL and /BL to a predetermined intermediate potential VBL. The structure of this portion is the same as the foregoing structure in FIG. 6.

For bit lines BL and /BL, there is arrange sense amplifier SA amplifying a potential difference between bit lines BL and /BL. Sense amplifier SA includes a P-sense amplifier portion, which is activated when a signal on a first signal line, i.e., sense amplifier activating signal line SALa is active, to drive a bit line at a higher potential between bit lines BL and /BL to power supply voltage VCC level, and an N-sense amplifier portion, which is activated when a signal on a second signal line, i.e., sense amplifier activating signal line SALb is active, to drive a bit line at a lower potential between bit lines BL and /BL to the ground potential level.

The P-sense amplifier portion includes a p-channel MOS transistor PT1, which is connected between sense amplifier activating signal line SALa and bit line BL, and has a gate connected to bit line /BL, and a p-channel MOS transistor PT2, which is connected between sense amplifier activating signal line SALa and bit line /BL, and has a gate connected to bit line BL.

The N-sense amplifier portion includes an n-channel MOS transistor NT1, which is connected between sense amplifier activating signal line SALb and bit line BL, and has a gate connected to bit line /BL, and an n-channel MOS transistor NT2, which is connected between sense amplifier activating signal line SALb and bit line /BL, and has a gate connected to bit line BL. FIG. 44 representatively shows only sense amplifier SA for bit line pair BL and /BL. Sense amplifier activating signal lines SALa and SALb are provided commonly for sense amplifiers which are provided for bit line pairs crossing this word line WL.

For sense amplifier activating signal lines SALa and SALb, there is further arranged a sense amplifier precharge/equalize circuit SPE, which is activated in response to an equalize instructing signal φE and a precharge instructing signal φP, to precharge and equalize sense amplifier activating signal lines SALa and SALb to intermediate voltage VBL.

Precharge/equalize circuit SPE includes an n-channel MOS transistor NT3, which is turned on in response to equalize instructing signal φE, to electrically short-circuit sense amplifier activating signal lines SALa and SALb, and n-channel MOS transistors NY4 and NY5, which are turned on in response to precharge instructing signal φP, to transmit intermediate voltage VBL to sense amplifier activating signal lines SALa and SALb, respectively. Equalize instructing signal φE and precharge instructing signal φP are essentially the same signal, and are equivalent to bit line precharge/equalize instructing signal φEQ.

In order to activate signals on sense amplifier activating signal lines SALa and SALb, there are arranged a p-channel MOS transistor QR1, which is turned on in response to precharge instructing signal /φP to transmit power supply voltage VCC to sense amplifier power supply line SPL, an n-channel MOS transistor QN1, which is turned on in response to precharge instructing signal φP to discharge sense amplifier ground line SGL to the ground potential level, and capacitance C connected between sense amplifier power supply line SPL and sense amplifier ground line SGL. This capacitance C is a composite capacitance element formed of the capacitance element of the embodiment 4. Precharge instructing signal /φP is an inverted signal of precharge instructing signal φP. MOS transistors QP1 and QN1 correspond to first and second switching transistors, respectively.

The sense amplifier drive portion further includes a p-channel MOS transistor QP2, which is turned on in response to a sense amplifier activating signal /φS, to electrically connect sense amplifier power supply line SPL to sense amplifier activating signal line SALa, a p-channel MOS transistor QP3, which is turned on in response to a delayed sense amplifier activating signal /φSD, to transmit power supply voltage VCC to sense amplifier activating signal line SALa, an n-channel MOS transistor QN1, which is turned on in response to activation of sense amplifier activating signal φS, to electrically connect sense amplifier activating signal line SALb to sense amplifier ground line SGL, and an n-channel MOS transistor QN3, which is turned on in response to activation of delayed sense amplifier activating signal φSD, to electrically connect sense amplifier activating signal line SALb to ground node VSS.

The control signal generating portion includes a control circuit 111, which is responsive to a memory cell selection start instructing signal, i.e., signal /RAS to generate precharge/equalize instructing signals φP, /φP, φE and φEQ, a control circuit 112 which is responsive to an output signal of control circuit 111 to generate sense amplifier activating signals φS and /φS, and a control circuit 113 which delays activation of sense amplifier activating signals φS and /φS to generate delayed sense amplifier activating signals φSD and /φSD, respectively.

Figure 45:
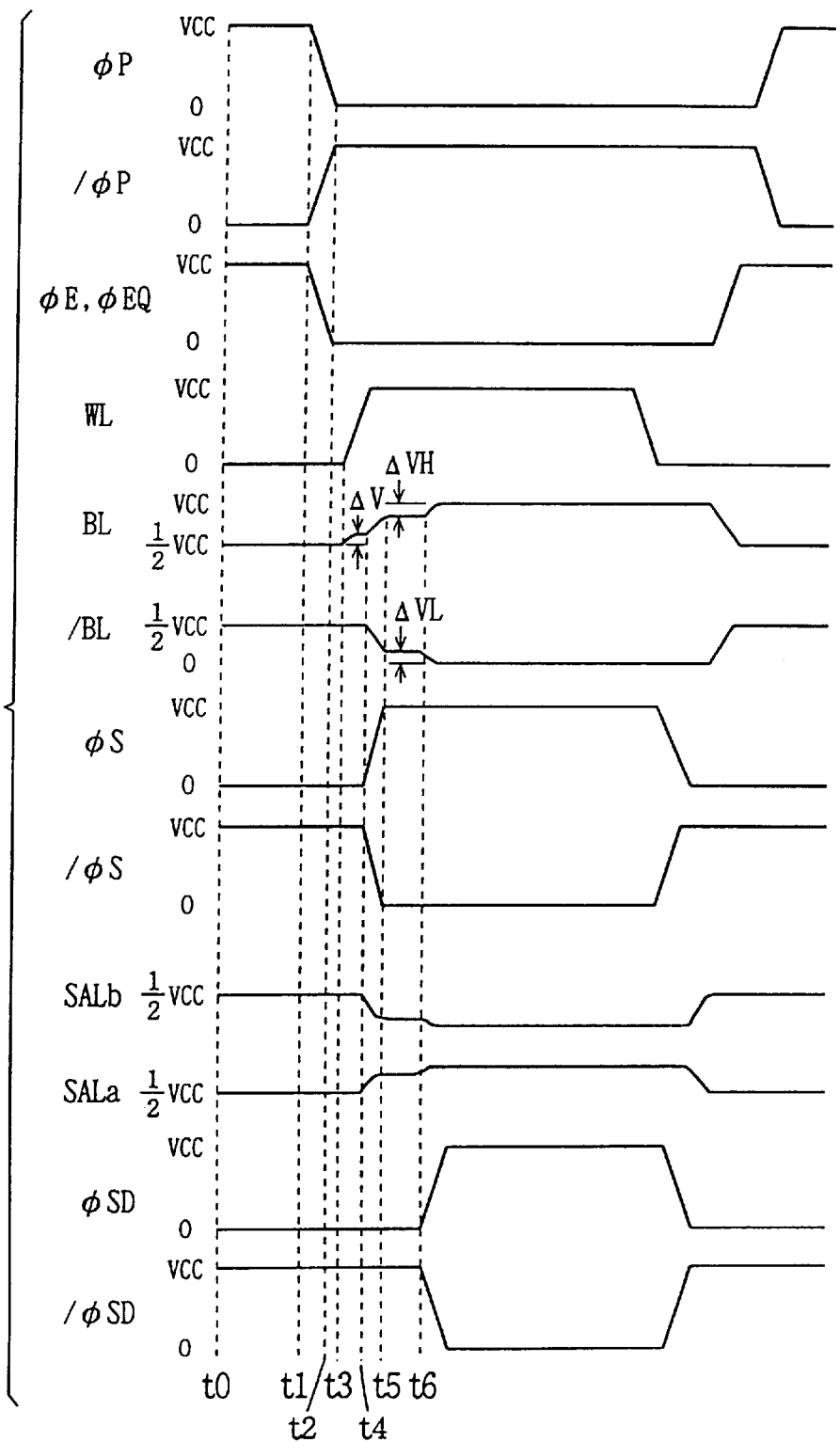
FIG. 45 is a signal waveform diagram showing an operation of the semiconductor device shown in FIG. 44.

A sense operation of the DRAM shown in FIG. 44 will be described below with reference to an operation waveform diagram of FIG. 45. FIG. 45 represents a data read operation in the case where memory cell MC has stored information at H-level.

Between times t0 and t1, the DRAM is on standby. In this state, precharge instructing signal φP and equalize instructing signals φE and φEQ are active at H-level. Therefore, bit line precharge/equalize circuit PE is activated, and bit lines BL and /BL are precharged and equalized to intermediate voltage VBL. In sense amplifier precharge/equalize circuit SPE, n-channel MOS transistors NY3–NT5 are on, and sense amplifier activating signal lines SALa and SALb are precharged and equalized to intermediate voltage VBL. MOS transistors QP1 and QN1 are on, so that sense amplifier power supply line SPL is precharged to power supply voltage VCC level, and sense amplifier ground line SGL is precharged to ground voltage VSS level. In sense amplifier SA, each of MOS transistors PT1, PT2, NT1 and NT2 has source, drain and gate voltages being equal, and maintains an off state.

At time t1, row address strobe signal /RAS (not shown) is activated to start the memory cycle. Then, precharge instructing signal φP and equalize instructing signals φE and φEQ fall to L-level at time t2, and precharge instructing signal /φP rises to H-level. Thereby, precharge/equalize circuits PE and SPE are deactivated, and bit lines BL and /BL and sense amplifier activating signal lines SALa and SALb are electrically floated at intermediate voltage VBL level. MOS transistors QP1 and QN1 are turned off, and sense amplifier power supply line SPL and sense amplifier ground line SGL are electrically floated at power supply voltage VCC level and ground voltage VSS level, respectively.

Then, row selection is performed in accordance with the address signal, so that the potential on selected word line WL rises at time t3, and information of memory cell MC connected to this word line WL is read onto bit line BL. Memory cell MC has stored information at H-level, so that the potential on bit line BL rises. When the potential on bit line BL rises, charges contained in the memory cell capacitor included in memory cell MC move to parasitic capacitance Cba of bit line BL, so that the storage node potential of memory cell capacitor becomes equal to the charged potential of parasitic capacitance Cba. A read voltage ΔV appearing on bit line BL depends on the capacitance value of the memory cell capacitor of memory cell MC, the capacitance value of parasitic capacitance Cba of bit line BL and a value of power supply voltage VCC, and satisfies a formula of ΔV=VCC·CS/2·CB, where CS represents the capacitance value of memory cell capacitor, and CB represents the capacitance value of bit line BL, i.e., the capacitance value of parasitic capacitance Cba.

Since bit line /BL is not connected to the memory cell, bit line /BL maintains the voltage level of intermediate voltage VBL.

At time t4, sense amplifier activating signals φS and /φS are activated, and MOS transistors QP2 and QN2 are turned on, so that sense amplifier activating signals SALa and SALb are electrically connected to sense amplifier power supply line SPL and sense amplifier ground line SGL, respectively. Thereby, sense amplifier SA is activated, and the potential difference between bit lines BL and /BL is amplified.

When sense amplifier SA is activated, MOS transistor NT2 having a larger conductance than MOS transistor NT1 and MOS transistor PT1 having a larger conductance than MOS transistor PT2 are strongly turned on. Therefore, during the sense operation of sense amplifier SA, charges stored by parasitic capacitance Cbb of bit line /BL are transmitted to sense amplifier ground line SGL at the ground voltage level through MOS transistor NT2, sense amplifier activating signal line SALb and MOS transistor QN2. MOS transistor QN1 is off, and charges transmitted to sense amplifier ground line SGL are transmitted to sense amplifier power supply line SPL through capacitance C owing to the capacitance coupling. The charges transmitted to sense amplifier power supply line SPL through capacitance C are transmitted to parasitic capacitance Cba of bit line BL through MOS transistor QP2, sense amplifier activating signal line SALa and MOS transistor PT2. The charges thus transmitted and the charges on precharged signal line SALa raise the potential of parasitic capacitance Cba.

Discharging of charges from parasitic capacitance Cbb causes lowering of the potential on bit line /BL. This movement of charges occurs during a transition period of sense amplifier activating signals φS and /φS between times t4 and t5. When sense amplifier activating signals φS and /φS are fixed at power supply voltage VCC level and ground voltage VSS level, respectively, sense amplifier activating signal lines SALa and SALb attain substantially constant voltage levels.

When charges move as described above, charges are transmitted from sense amplifier ground line SGL to sense amplifier power supply line SPL through capacitance C. Sense amplifier power supply line SPL and sense amplifier ground line SGL are connected to parasitic capacitances Cpra and Cprb, respectively. By using the capacitance element of the embodiment 4 as capacitance C, parasitic capacitances Cpra and Cprb can be sufficiently reduced. It is therefore possible to reduce significantly the quantity of charges accumulated in parasitic capacitances Cpra and Cprb during this charge transmission. Therefore, charges transmitted from bit line parasitic capacitance Cbb can be efficiently transmitted to bit line parasitic capacitance Cba. When charges accumulated in parasitic capacitance Cbb are entirely transmitted to the other parasitic capacitance Cba in this charge transmitting stage, the charged potential of parasitic capacitance Cbb attains the ground voltage level, and the charged potential of the other parasitic capacitance Cba attains power supply voltage VCC level. In the actual operation, however, loss of charges occurs due to factors such as parasitic capacitances of other interconnections, so that the potential attained at bit line BL is lower by $\Delta VH$ than power supply voltage VCC, and the potential attained by bit line /BL is higher by $\Delta VL$ than ground voltage VSS.

At time t6, delayed sense amplifier activating signals/$\phi$SD and $\phi$SD attain L- and H-levels, respectively, and MOS transistors QP3 and QN3 are turned on. Thereby, sense amplifier activating signal line SALa is electrically connected to power supply voltage VCC, and sense amplifier activating signal line SALb is electrically connected to ground node VSS. Thereby, the potential levels on bit lines BL and /BL are driven to power supply voltage VCC and ground voltage VSS. When delayed sense amplifier activating signals $\phi$SD and /$\phi$SD are active, currents corresponding to voltages $\Delta VH$ and $\Delta VL$ flow through power supply node VCC and ground node VSS, respectively, but values of these currents are extremely small. In particular, the parasitic capacitance present at the electrode node of capacitance C is small, and values of parasitic capacitances Cpra and Cprb can be extremely small, so that values of voltages $\Delta VH$ and $\Delta VL$ can be sufficiently small.

Accordingly, during the operation of sense amplifier, currents flowing through the power supply line and ground line can be sufficiently small, and voltage noises at the power supply line and ground line can be suppressed, so that it is possible to prevent a malfunction of circuits during operation of the sense amplifier, and it is possible to provide a DRAM stably performing the sense operation.

In the structure shown in FIG. 44, MOS transistors QP1–QP3 may be formed of n-channel MOS transistors, in which case they use control signals of opposite polarities, and the H-level is set to a voltage level higher by at least threshold voltage VTN than power supply voltage VCC. Likewise, MOS transistors QN1–QN3 may be formed of p-channel MOS transistors by appropriately selecting the voltage levels and polarities of control signals $\phi$S, UP and $\phi$SD.

In the structure shown in FIG. 44, transistors QP1–QP3 and QN1–QN3 as well as capacitance C are commonly provided for sense amplifiers SA which are provided for the bit lines crossing one word line WL. Alternatively, MOS transistors QP2 and QN2 as well as capacitance C may be provided for each sense amplifier. The capacitance of the embodiment 3 may be used in the application examples 1 to 5.

According to the embodiment 4 of the invention, the thick insulating film is formed between the conductive layer forming one electrode and the semiconductor substrate, and two parallel combinations of capacitances, each of which includes a plurality of parallel-connected unit capacitance elements each having the same structure as the memory cell capacitor, are arranged on the conductive layer, and are connected in series. Therefore, it is possible to provide the capacitance element, which has a breakdown voltage at power supply voltage VCC level, a good area efficiency and good frequency characteristics, and has the electrode having a small parasitic capacitance.

The capacitance element of the embodiment 4 having good frequency characteristics can be naturally utilized as a stabilizing capacitance for stabilizing the power supply voltage or the like at a constant voltage.

[Comparison between Embodiments 1 to 3]

Figure 46:
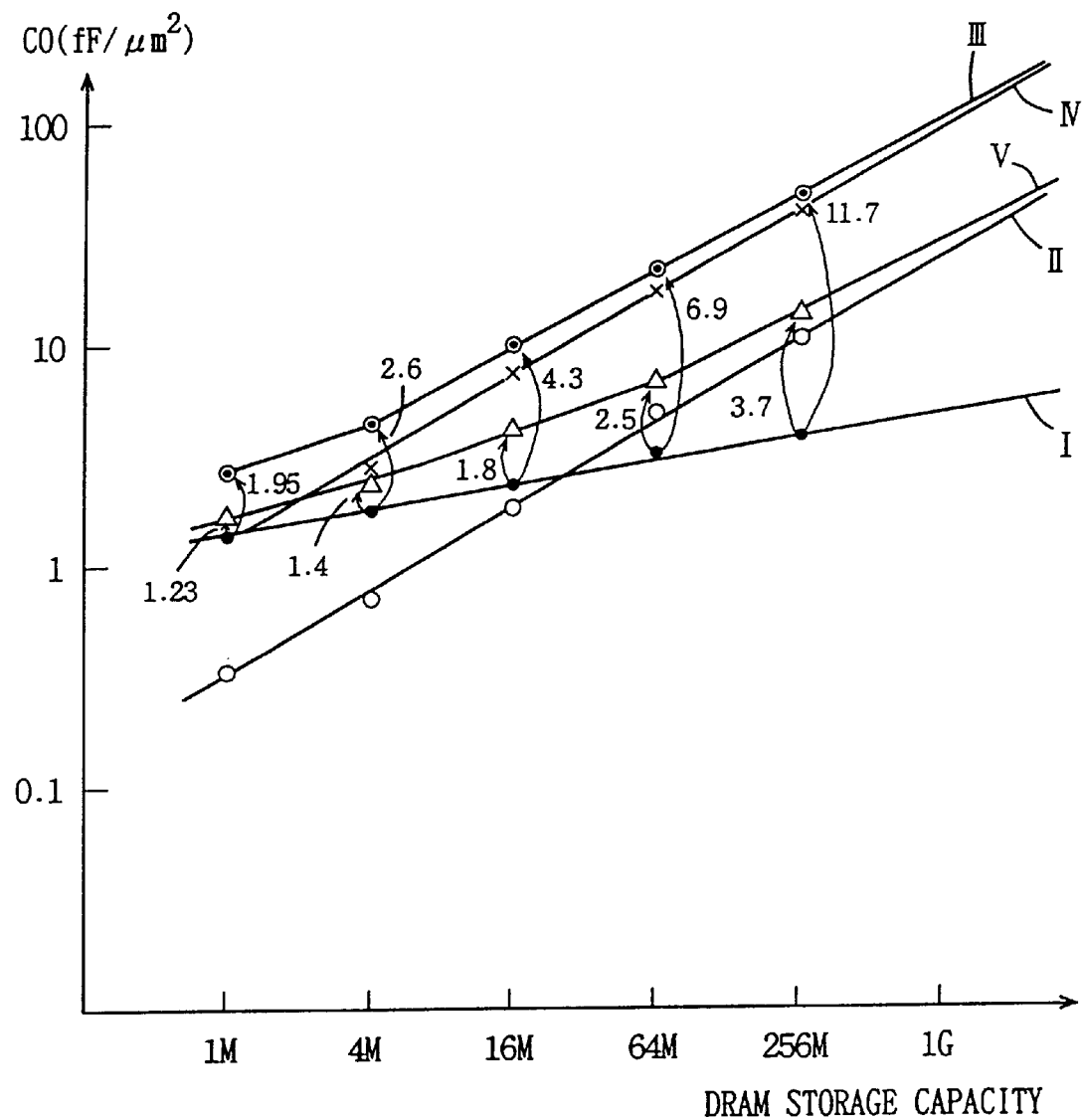
FIG. 46 shows relationships between capacitances per unit area of the capacitance elements of the embodiments 1 to 3 of the invention and storage capacities of the DRAM.

FIG. 46 is a graph showing capacitance values per unit area of the capacitance elements of the embodiments 1 to 3 of the invention. In FIG. 46, curve I represents a capacitance value per unit area of a capacitor (gate capacitor) having electrodes formed of a gate electrode layer and a substrate region of a conventional access transistor. Curve II represents a capacitance value per unit area of a memory cell capacitor, and specifically shows a capacitance value per unit area of the capacitance element of the embodiment 1. Curve III represents a capacitance value of a capacitance element using both the memory cell capacitor and the gate capacitor of the embodiment 2. Curve IV represents a memory cell capacitance. This curve IV is obtained from such a structure that two memory cell capacitors are connected in series, and each capacitance element has a doubled electrode area in order to attain the capacitance value corresponding to the capacitance value of a gate capacitor and attain the breakdown voltage at the power supply voltage level. Therefore, curve IV is obtained from the structure having the capacitance value which is four times as large as the capacitance value per unit area of the memory cell capacitor represented by curve II. Curve V represents the capacitance value per unit area of the capacitance element using both the gate capacitor and the series combination of capacitance elements of the embodiment 3.

In FIG. 46, as the storage capacity of DRAM increases to 1 Mbit, 4 Mbits, 16 Mbits, 64 Mbits and 256 Mbits, the capacitance element (curve II) of the embodiment 2 attains the capacitance value of 1.95, 2.6, 4.3, 6.9 and 11.7 times as large as the capacitance value of the gate capacitor represented by curve I. In the case of embodiment 3, as the storage capacity of DRAM increases to 1 Mbit, 4 Mbits, 16 Mbits, 64 Mbits and 265 Mbits, the capacitance value per unit increases 1.23, 1.4, 1.8, 2.5 and 3.7 times as large.

In the case of the embodiment 1, and particularly, in DRAMs having a storage capacity of 64 Mbits or more, the capacitance value per unit area of the capacitance element exceeds that of the gate capacitor. Therefore, as can be seen from the graph of FIG. 46, the embodiments 2 and 3 can implement the capacitance element having an area efficiency superior to the gate capacitor. According to the design level of DRAM of 64 Mbits or more, the embodiment 1 implements the capacitance element having an area efficiency superior to the gate capacitor.

[Embodiment 5]

Figure 47A:
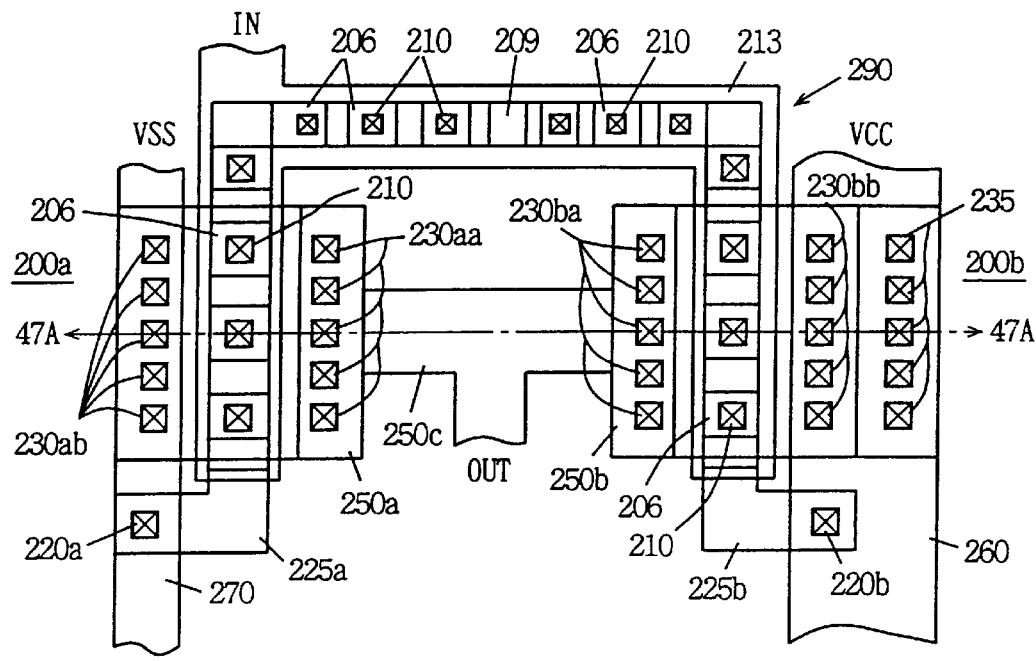
FIGS. 47A, 47B and 47C show a plane layout, a sectional structure and an electrically equivalent circuit of a capacitance element of an embodiment 5 of the invention, respectively.
Figure 47B:
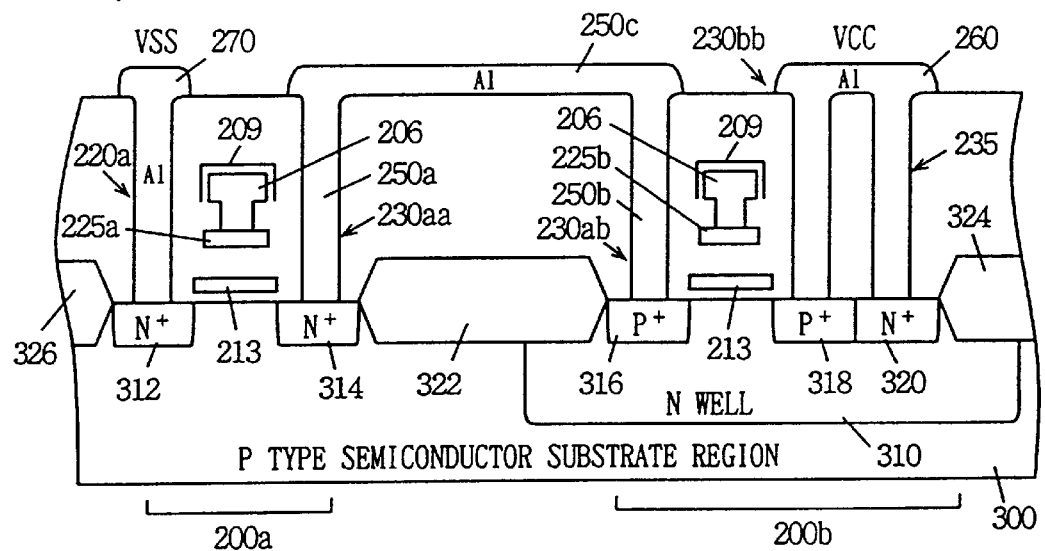
Figure 47C:
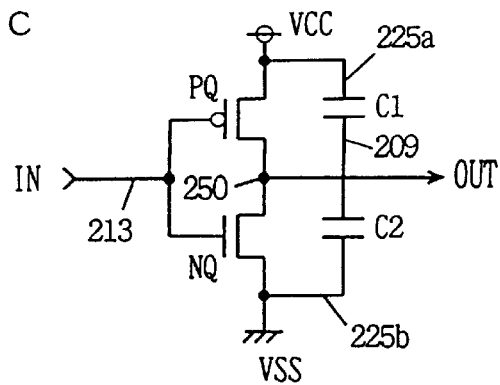

FIG. 47 shows a plane layout of the semiconductor device according to the embodiment 5 of the invention. FIG. 47B shows a sectional structure taken along line 47A—47A in FIG. 47A. FIG. 47C shows an electrically equivalent circuit of the semiconductor device shown in FIGS. 47A and 47B.

In FIG. 47A, the semiconductor device includes an n-channel MOS transistor formation region 200a and a p-channel MOS transistor formation region 200b. N-channel MOS transistor formation region 200a includes an impurity region which is connected through contact holes 230ab to a horizontally arranged ground line 270 transmitting the ground voltage, a gate electrode layer 213 which is formed of, e.g., a first level polycrystalline silicon interconnection layer transmitting input signal IN, and an impurity region which is opposed to the region provided with contact holes 230ab with gate electrode interconnection layer 213 therebetween and is connected to an electrode interconnection layer 250a through contact holes 230aa. Electrode interconnection layer 250a is formed at an output interconnection layer 250c.

In transistor formation region 200a, conductive layer 225a formed at the same interconnection layer as the bit line is formed on and parallel to the gate electrode interconnection layer 213. Conductive layer 225a is connected to ground line 270 through a contact hole 220a. Conductive layer 225a is parallel to gate electrode interconnection layer 213 transmitting input signal IN, and has a laterally inverted L-shaped form in the figure. Conductive layers 206 which are formed at the same interconnection layer as the storage node of memory cell capacitor are located on conductive layer 225a. Each conductive layer 206 is electrically connected to conductive layer 225a through a contact hole 210. A conductive layer 209 corresponding to the cell plate of memory cell capacitor (i.e., formed of the same interconnection layer) is arranged such that conductive layer 209 is opposed to conductive layer 206 formed on conductive layer 225a, and thus is parallel to conductive layer 225a corresponding to the bit line. Conductive layer 209 corresponding to the cell plate extends to p-channel MOS transistor formation region 200b. Therefore, conductive layer 209 formed of the same interconnection layer as the cell plate, i.e., corresponding to the cell plate has a substantially C-shaped or laid U-shaped form.

At p-channel MOS transistor formation region 200b, there are formed an impurity region which is connected to an electrode interconnection layer 250b through contact holes 230bb, a gate electrode interconnection layer 213 transmitting input signal IN, an impurity region which is provided for gate electrode interconnection layer 213, is opposed to the impurity region connected to contact holes 230ba with respect to the layer 213 and is connected to a power supply line 260 transmitting power supply voltage VCC through contact holes 230bb, and an impurity region coupled to the power supply line through contact holes 235 and is provided for applying power supply voltage VCC to the substrate regions of the p-channel MOS transistors.

Gate electrode interconnection layer 213 transmitting input signal IN continuously extends from n-channel MOS transistor formation region 200a to p-channel MOS transistor formation region 200b. Therefore, gate electrode interconnection layer 213 has a substantially C-shaped or laid U-shaped form similarly to conductive layer 209. A circuit portion (not shown) receiving input signal IN is connected to gate electrode interconnection layer 213.

In p-channel MOS transistor formation region 200b, conductive layer 225b, which is parallel to gate electrode interconnection layer 213 and is formed at the same interconnection layer as the bit line, is formed on gate electrode interconnection layer 213. Conductive layer 225b corresponding to the bit line has a laterally inverted L-shaped form, and is parallel to gate electrode interconnection layer 213. However, conductive layer 225b is isolated from conductive layer 225a.

Conductive layers 206 formed of the same layer as storage nodes of memory cell capacitors are formed on conductive layer 225b with a predetermined space between each other. Conductive layers 206 are connected to conductive layer 225b through contact holes 210. Conductive layer 209 corresponding to the cell plate and parallel to conductive layer 213 is arranged on conductive layers 206. Conductive layer 225b is connected to power supply line 260 through a contact hole 220b. Electrode interconnection layers 250a and 250b are mutually connected by an output signal interconnection layer 250c.

In FIG. 47B, n-channel MOS transistor formation region 200a includes heavily doped N-type impurity regions 312 and 314 formed at a surface of a p-type semiconductor substrate 300. Impurity region 312 is electrically connected to ground line 270 via an electrode interconnection of a low resistance such as an aluminum interconnection layer formed at contact hole 220a. Impurity region 314 is connected to an output interconnection layer 250c formed at an upper layer through electrode interconnection layer 250a formed at contact hole 230aa.

On a region between impurity regions 312 and 314, gate electrode interconnection layer 213 is formed with a gate insulating film therebetween. Conductive layer 225a formed of the same interconnection layer as the bit line is formed on gate electrode interconnection layer 213 with an interlayer insulating film (not shown) therebetween. Conductive layer 206 corresponding to the storage node (i.e., formed of the same interconnection layer as the storage node) is formed at conductive layer 225a, and conductive layers 206 and 225a are electrically connected together. Conductive layer 209 formed of the same interconnection layer as the cell plate is formed on conductive layer 206.

P-channel MOS transistor formation region 200b is formed at N-well 310 formed at the surface of p-type semiconductor substrate region 300. P-channel MOS transistor formation region 200a and N-well 310 are isolated from each other by a field insulating film 322. At the other end of N-well region 310, there is formed a field insulating film 324, whereby the region of N-well 310 is defined. Heavily doped P-type impurity regions 316 and 318 are formed at the surface of N-well 310 with a space between each other. Impurity region 316 is electrically connected to output signal interconnection layer 250c through electrode interconnection layer 250b and contact hole 230ab.

Impurity region 318 is electrically connected to power supply line 260 via an electrode interconnection of a low resistance such as an aluminum interconnection layer which is formed at contact hole 230bb. Gate electrode interconnection layer 213 is formed on the surface of N-well region 310 between impurity regions 316 and 318 with a gate insulating film (not shown) therebetween.

Conductive layer 225b formed of the same interconnection layer as the bit line is formed on this gate electrode interconnection layer 213 with an interlayer insulating film therebetween. Conductive layers 206 corresponding to the storage node are formed on n conductive layer 225b, and are electrically connected to conductive layer 225b through contact holes 210. Conductive layer 209 corresponding to the cell plate is formed on conductive layer 206 with an insulating film therebetween and is opposed to the surface of conductive layer 206. Gate electrode interconnection layers 213 arranged at regions 200a and 200b are formed of the same interconnection layer, and extend continuously. Conductive layer 209 corresponding to the cell plate extends continuously over regions 200a and 200b. Meanwhile, conductive layers 225a and 225b are isolated from each other by a field insulating film region 290 as shown in FIG. 47A.

N-well 310 further includes a heavily doped N-type impurity region 320 for applying power supply voltage VCC to N-well 310. N-type impurity region 320 is electrically connected to power supply interconnection layers 260 through an electrode interconnection formed at contact hole 235.

As shown in FIG. 47C, this semiconductor device has a structure of a CMOS inverter which is formed of a p-channel MOS transistor PQ and an n-channel MOS transistor NQ. Drains of MOS transistors PQ and NQ are commonly connected via interconnection layers 250 (250a, 250c and 250b) to form an output node. A source of MOS transistor PQ is electrically connected to power supply node VCC, and a source of MOS transistor NQ is connected to ground voltage VSS. MOS transistors PQ and NQ receive input signal IN on their gates via interconnection layer 213.

Capacitance elements C1 and C2 are connected in series between power supply node VCC and ground node VSS. Capacitance element C1 is formed between conductive layers 225a and 209 which are formed of the same interconnection layers as the bit line and cell plate, respectively. Capacitance element C2 is formed between conductive layers 209 and 225b which are formed of the same interconnection layers as the cell plate and bit line, respectively. Capacitance elements C1 and C2 have functions as decoupling capacitances for stabilizing power supply voltage VCC and ground voltage VSS.

When MOS transistor PQ is turned on and a current flows from power supply node VCC to the output node (output interconnection layer 250), the output node is supplied with charges from capacitance element C1 through conductive layer 225a in addition to the current from power supply node VCC. This prevents rapid lowering of power supply voltage VCC. Meanwhile, when MOS transistor NQ is turned on to flow a current to ground node VSS, capacitance element C2 absorbs this current via conductive layer 225b. This suppresses rising of ground voltage VSS. Capacitance elements C1 and C2 each have the same breakdown voltage characteristics as the memory cell capacitor, and are connected in series between power supply node VCC and ground node VSS, whereby they function as a stabilizing capacitance for stabilizing power supply voltage VCC and ground voltage VSS.

In particular, by forming the capacitance element corresponding to the memory cell capacitor on the gate electrode interconnection layer at the MOS transistor formation region, it is possible to suppress increase in area required for forming the capacitance element. Further, capacitance values of capacitance elements C1 and C2 can be increased by the structure wherein the capacitance element having the same structure as the memory cell capacitor is arranged at the end of the MOS transistor formation region and is formed on the gate electrode interconnection layer 290 (i.e., region provided with the field insulating film) transmitting the input signal. Also, in field region 290, capacitance elements are formed on gate electrode interconnection layer 213. Therefore, it is possible to provide the capacitance element having a required capacitance value without increasing an area.

In the sectional structure shown in FIG. 47B, ground interconnection layer 270, power supply interconnection layer 260 and output interconnection layer 250c are formed of aluminum interconnection layers of a low resistance. In the figure, these interconnection layers are electrically and directly connected to the impurity regions formed at the surface of semiconductor substrate region. However, in view of an aspect ratio of the contact holes, such a two-stage structure may be employed that electrical contact of the impurity regions is established with an intermediate conductive layers of the same interconnection layer as the bit line, and another electrical contact is established between the intermediate conductive layers and interconnection layers 260, 250c and 270.

Conductive layers 225a and 225b of the same interconnection layer as the bit line are electrically connected to power supply node VCC (power supply interconnection layer 260) and ground node VSS (or ground interconnection layer 270), respectively. This structure is employed for reducing interconnection resistance associated with power supply node VCC and ground node VSS and thereby allowing rapid absorbing and discharging of charges.

[Modification]

Figure 48A:
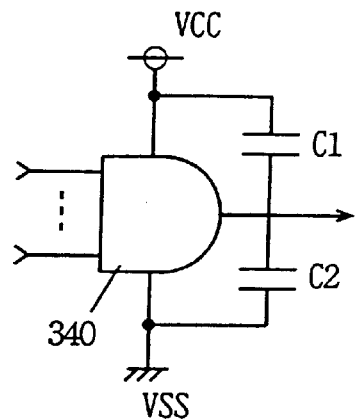
FIGS. 48A and 48B show another structure of a semiconductor device of the embodiment 5.
Figure 48B:
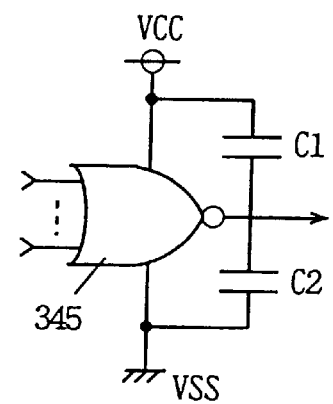

FIGS. 48A and 48B show modified structures of the embodiment 5 of the invention. In FIG. 48A, capacitance elements C1 and C2 are connected in series between power supply node VCC and ground node VSS of an NAND circuit 340. In FIG. 48B, capacitance elements C1 and C2 are connected in series between power supply node VCC and ground node VSS of an NOR circuit 345. In the structures of multi-input logic circuits shown in FIGS. 48A and 48B, individual MOS transistors are larger in number than the MOS inverter shown in FIG. 47C. Therefore, capacitance elements are hierarchically formed on the MOS transistor formation region, whereby more unit capacitance elements (capacitance elements corresponding to the memory cell capacitors) can be formed, and therefore it is possible to provide the stabilizing capacitance having a sufficiently large capacitance value.

[Modification 2]

Figure 49:
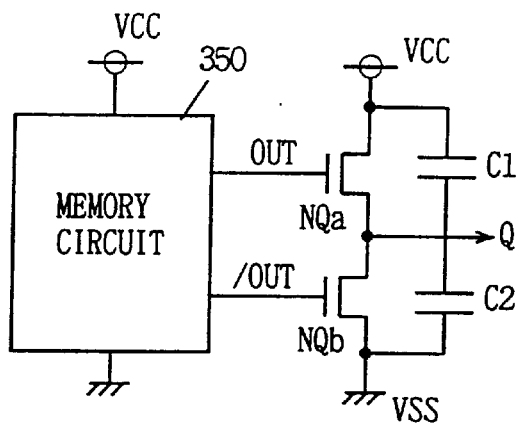
FIG. 49 shows still another structure of the semiconductor device of the embodiment 5 of the invention.

FIG. 49 shows a structure of a second modification of the embodiment 5 of the invention. In FIG. 49, a semiconductor device includes an output circuit for producing external read data Q in accordance with output signals OUT and /OUT which are generated from a memory circuit 350 including a memory cell array, a peripheral circuitry and an internal data read circuit. This output circuit includes an n-channel MOS transistor NQa, which is turned on in response to an output signal OUT from memory circuit 350 to produce read data Q at power supply voltage VCC level, and an n-channel MOS transistor NQb, which is turned on in response to output signal /OUT from memory circuit 350 to produces external read data Q at ground voltage VSS level. Capacitance elements C1 and C2 are connected in series between power supply node VCC and ground node VSS of the output circuit formed of MOS transistors NQa and NQb. Capacitance elements C1 and C2 are the same as those in the equivalent circuit shown in FIG. 47C.

The output nodes of the output circuit formed of MOS transistors NQa and NQb are connected to an external signal line via a pad and a pin terminal. Therefore, a relatively large load capacitance is present at the output node of this output circuit (MOS transistors NQa and NQb). This load capacitance has a capacitance value between about 50 pF and about 100 pF. Since the output circuit is required to charge and discharge rapidly the load capacitance, the current drivability of MOS transistors NQa and NQb are relatively large. Therefore, when MOS transistors NQa and NQb operate in accordance with output signals OUT and /OUT from memory circuit 350, a relatively large charge/discharge current flows, so that voltage noises are generated at power supply node VCC or ground node VSS. In order to suppress these voltage noises, appropriate counter are taken and, for example, independent power supply lines are employed for the output circuit and internal memory circuit 350, respectively.

In the structure shown in FIG. 49, capacitance elements C1 and C2 are connected in series between power supply node VCC and ground node VSS. MOS transistors NQa and NQb have sufficiently large gate widths W of, e.g., several hundreds of micrometers. In the structure where capacitance elements C1 and C2 are hierarchically arranged above MOS transistors NQa and NQb, therefore, the unit capacitance elements are arranged in parallel above the gate electrode interconnections of output MOS transistors NQa and NQb as shown in FIGS. 47A and 47B, so that the capacitance of a required capacitance value can be formed, and it is possible to implement the stabilizing capacitance for stabilizing power supply voltage VCC and ground voltage VSS without increasing an area.

[Modification 3]

Figure 50:
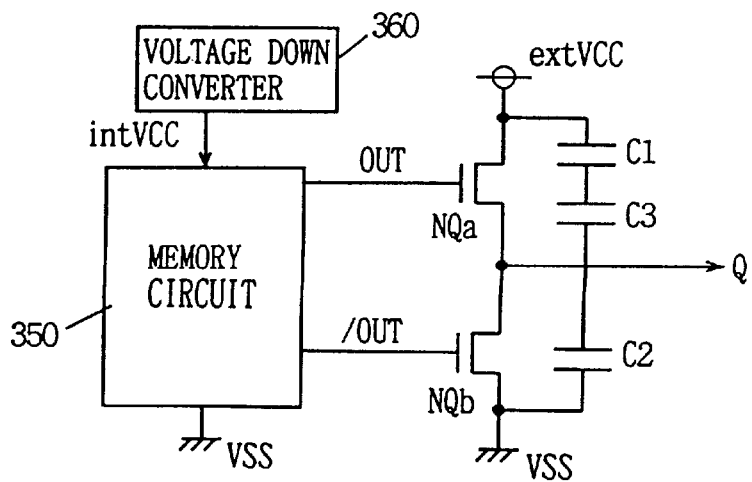
FIG. 50 shows yet another structure of the semiconductor device of the embodiment 5 of the invention.

FIG. 50 shows a structure of a third modification of the embodiment 5 of the invention. In the structure shown in FIG. 50, memory circuit 350 which is an internal circuit operates with operation power supply voltages formed of ground voltage VSS and an internal power supply voltage intVCC supplied from a voltage down-converting circuit 360 for down-converting an external power supply voltage extVCC.

The output circuit operates using an external power supply voltage extVCC and ground voltage VSS as its operation power supply voltages for establishing an external interface and performing rapid charging/discharging of the output node. External power supply voltage extVCC is usually at the voltage level 1.5 times greater than that of internal power supply voltage intVCC. In the structure shown in FIG. 50, therefore, three capacitance elements C1, C2 and C3 are connected in series between a power supply node extVCC of the output circuit and ground node VSS. Capacitance elements C1, C2 and C3 have arrangement as shown in FIGS. 47A and 47B. Each of capacitance elements C1 to C3 is supplied with a voltage equal to a half of internal power supply voltage intVCC, so that breakdown voltage characteristics are ensured.

The connection form of capacitance elements C1 and C2 is the same as that of capacitance elements C1 and C2 shown in FIG. 47C. Additional capacitance element C3 has a conductive layer of the same interconnection layer as the cell plate, and this conductive layer is electrically connected to a conductive layer corresponding to the cell plate of the capacitance element C1. The conductive layer of the same interconnection layer as the bit line of capacitance element C3 is electrically connected to the conductive layer corresponding to the cell plate of capacitance element C2. In this manner, capacitance elements C1, C3 and C2 are connected in series between power supply node extVCC and ground node VSS.

The capacitance element formed at field region 290 shown in FIG. 47A may be utilized as capacitance element C3, whereby the structure including three capacitance elements connected in series can be easily implemented without increasing an area.

[Modification 4]

Figure 51A:
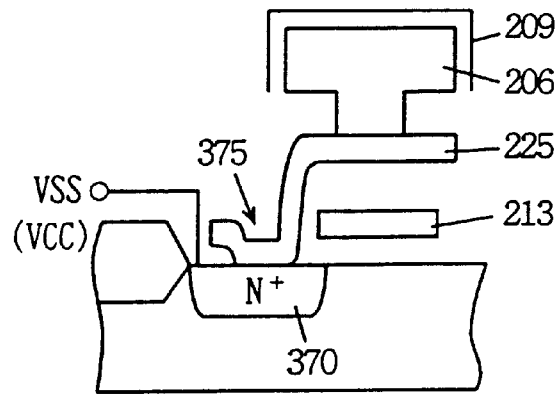
FIGS. 51A and 51B show a modification of a structure of the embodiment 5 of the invention.
Figure 51B:
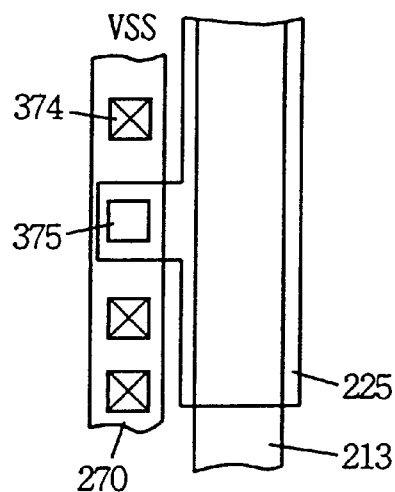

FIG. 51A shows a cross sectional structure of a fourth modification of the embodiment 5 of the invention, and FIG. 51B shows a plane layout thereof. In FIG. 51A, conductive layer 225 formed of the same interconnection layer as the bit line is electrically connected to a heavily doped N-type impurity region 370 which is formed at the vicinity of conductive layer 225 and receives ground voltage VSS. Gate electrode interconnection layer 213 is formed under conductive layer 225. Conductive layer 206 corresponding to the storage node is formed above conductive layer 225, and is electrically connected to conductive layer 225. Conductive layer 209 corresponding to the cell plate is formed on conductive layer 206 with a capacitor insulating film (not shown) therebetween.

In the structure shown in FIG. 51B, in which gate electrode interconnection layer 213 is arranged parallel to impurity region 370, there is formed ground interconnection layer 270 which is parallel to impurity region 370 and transmits ground voltage VSS. Ground interconnection layer 270 transmitting ground voltage VSS is electrically connected to impurity region 370 through a contact hole 374. Ground interconnection layer 270 is located at a higher level than conductive layer 225. Thus, the impurity region receiving the ground voltage is formed at the vicinity of conductive layer 225, so that conductive layer 225 is electrically and directly connected to impurity region 370 at a contact region 375 in the process of forming the interconnections.

Owing to the direct contact not using a contact hole, conductive layer 225 is connected at its relatively long portion extending lengthwise to impurity region 370, so that a contact resistance is minimized, and the potential on conductive layer 225 is surely held at the ground potential level. Thereby, a distance between conductive layer 225 and the ground interconnection layer transmitting the ground potential is reduced. When the structure is used as a stabilizing capacitance, it is possible to reduce a distance between the conductive layer corresponding to the bit line and the ground node, and it is possible to reduce equivalently a distance between the electrode node of this stabilizing capacitance and the ground node, so that the interconnection resistance can be sufficiently reduced, and charges can be moved rapidly.

In FIG. 51A, conductive layer 225 corresponding to the bit line is electrically connected to the heavily doped N-type impurity region. Therefore, this corresponds to the structure of conductive layer 225 forming capacitance element C2. In the structure corresponding to capacitance element C1, impurity region 370 is connected to receive power supply voltage VCC.

In the structure shown in FIGS. 51A and 51B, conductive layer 225 is electrically connected to impurity region 370. Conductive layer 225 may be electrically connected to either ground interconnection layer 270 or power supply interconnection layer at a higher level. Thus, in the structure where the ground interconnection layer at the uppermost layer is in electrical contact with impurity region 370, the contact region has a two-layer structure. Thus, in order to improve an aspect ratio of the contact hole, a first electrode interconnection layer is employed to establish an electrical connection with impurity region 370. Then, an electrical connection is established between this first electrode interconnection layer and the ground or power supply interconnection layer. The first electrode interconnection layer and the conductive layer corresponding to the bit line may be electrically connected together so that conductive layer 225 corresponding to this bit line is electrically connected equivalently to the ground interconnection layer or power supply interconnection layer at a region other than the region of connection to the first electrode interconnection layer.

[Modification 5]

Figure 52:
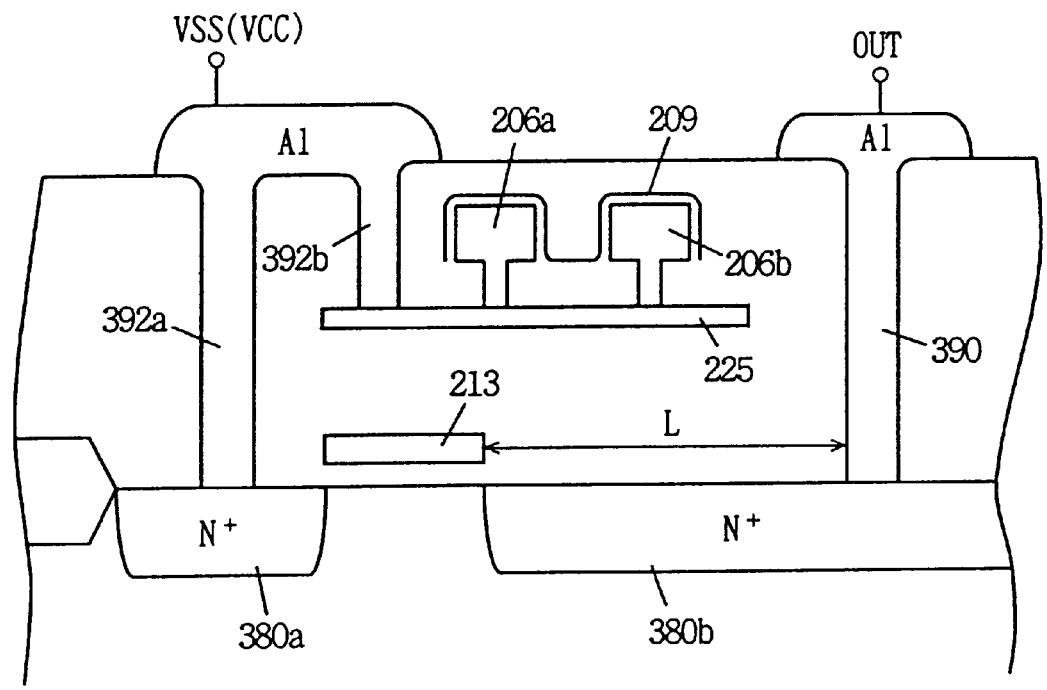
FIG. 52 schematically shows a structure of another modification of the embodiment 5 of the invention.

FIG. 52 shows a structure of a fifth modification of the embodiment 5 of the invention. FIG. 52 representatively shows one of MOS transistors NQa and NQb and one of capacitance elements in the output circuit shown in FIGS. 49 and 50. In FIG. 52, the MOS transistor includes heavily doped N-type impurity regions 380a and 380b formed at the surface of semiconductor substrate region, and gate electrode interconnection layer 213 formed between these regions with a gate insulating film (not shown) therebetween. Impurity region 380b is electrically connected to output node OUT via electrode interconnection layer 390. Impurity region 380a is electrically connected to ground node VSS (or power supply node VCC) through electrode interconnection layer 392a. Each of electrode interconnection layers 390 and 392a is connected to corresponding impurity region 380b or 380a through one contact hole. Alternatively, each of electrode interconnection layer 390 and 392a may be electrically connected to corresponding impurity region 380b or 380a via electrode interconnection layers at two levels.

In the output circuit, gate electrode interconnection layer 213 is spaced by a sufficiently large distance L from electrode interconnection layer 390 connected to output node OUT in order to prevent breakdown due to static electricity generated at the output terminal. The specific purpose of this arrangement is to maximize the quantity of static electricity absorbed by impurity region 380b, and to prevent such a state the a large electric field is applied across impurity region 380b and gate electrode layer 213 to break the gate insulating film. Therefore, distance L between gate electrode interconnection layer 213 and electrode interconnection layer 390 on impurity region 380b is sufficiently large, and conductive layer 225 is formed on the region above gate electrode interconnection layer 213 and impurity region 380b with the interlayer insulating film therebetween.

Conductive layers 206a and 206b which correspond to the storage nodes of memory cell capacitors are formed on conductive layer 225 with a space between each other. Conductive layer 209 corresponding to the cell plate is formed on conductive layers 206a and 206b with a capacitor insulating film (not shown) therebetween. Conductive layer 225 is electrically connected to an electrode interconnection layer 392a via electrode interconnection layer 392b. Electrode interconnection layers 390, 392a and 392b are formed of aluminum interconnections of a low resistance. Conductive layer 225 located above gate electrode interconnection layer 213 extends over an empty region on impurity region 380b, whereby it is possible to ensure an area of the capacitance element formation region, and the capacitance element can have a large capacitance value.

The electrode interconnection 392b is formed of an aluminum interconnection layer of a low resistance, and the conductive layer 225 is electrically connected to ground node VSS (or power supply node VCC). Thereby, the electrode of capacitance element can have a small resistance value, and therefore it is possible to provide a stabilizing capacitance which can rapidly absorb and discharge charges, and has good response characteristics and a large capacitance value. In particular, the low resistance interconnection layer such as an aluminum interconnection layer is used for direct connection from the end of conductive layer 225 to the ground interconnection layer or power supply interconnection layer transmitting ground voltage VSS or power supply voltage VCC, whereby the resistance value can be smaller than that in the structure where conductive layer 225 is extended for electrical connection with electrode interconnection layer 392a.

[Modification 6]

Figure 53:
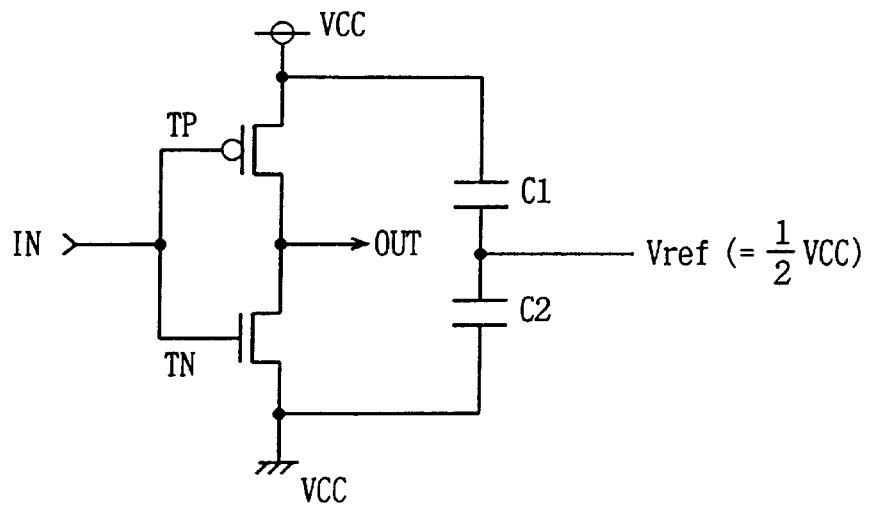
FIG. 53 schematically shows a structure of still another modification of the embodiment 5 of the invention.

FIG. 53 shows a structure of a sixth modification of the embodiment 5 of the invention. In FIG. 53, a semiconductor device includes a CMOS inverter, which operates using voltage VCC on power supply node VCC and voltage VSS on ground node VSS as its operation power supply voltages, and inverts input signal IN to produce output signal OUT. The CMOS inverter includes a p-channel MOS transistor TP and an n-channel MOS transistor TN. Capacitance elements C1 and C2 are further connected in series between power supply node VCC and ground node VSS. Reference voltage Vref (=VCC/2) is supplied to a connection point between capacitance elements C1 and C2. Capacitance elements C1 and C2 each have a voltage of VCC/2 applied thereacross.

This CMOS inverter does not require a large current drivability compared with the output circuit. Therefore, the possibility that power supply noises at power supply node VCC and ground node VSS are generated during operation of MOS transistors TP and TN is small. Capacitance elements C1 and C2 are hierarchically arranged above MOS transistors TP and TN. Capacitance elements C1 and C2 therefore have relatively large capacitance values, and power supply voltage VCC and ground voltage VSS are stable, so that reference voltage Vref can be maintained stably. Therefore, capacitance elements C1 and C2, which are formed of unit capacitance elements of the same structures as the memory cell capacitors, are arranged at regions of an internal logic circuit and others other than the output circuit, and are connected in series between power supply node VCC and ground node VSS. Further, a connection point between these capacitance elements C1 and C2 is connected to a node receiving the reference voltage. Thereby, reference voltage Vref can be stabilized.

In the structure shown in FIG. 53, only one of capacitance elements C1 and C2 may be employed (similar to the embodiment 1).

According to the embodiment 5 of the invention, as described above, the capacitance element formed of unit capacitance elements having the same structures as the memory cell capacitors are formed at layers above the MOS transistor which is a component of the peripheral circuit. Therefore, it is possible to suppress increase in area for forming the capacitance element and thereby implement easily the capacitance element having a good area efficiency and a required capacitance value.

[Embodiment 6]

Figure 54A:
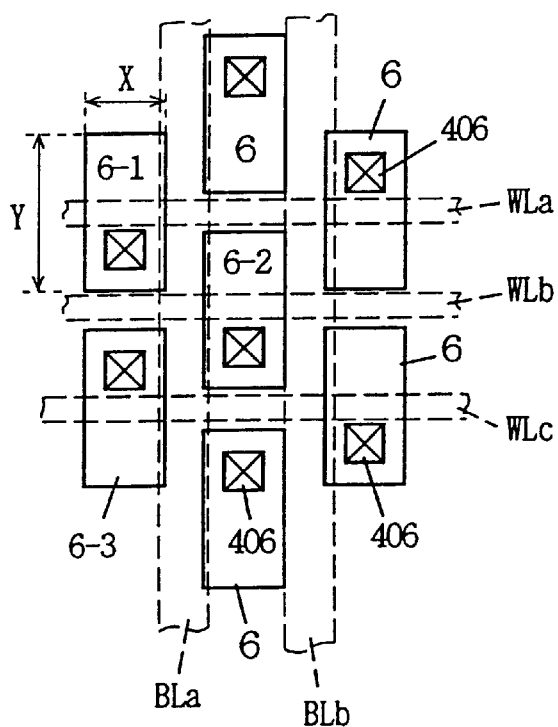
FIGS. 54A, 54B and 54C show a capacitance element of an embodiment 6 of the invention, a layout of one electrode thereof and a storage node of a DRAM memory cell capacitor, and an effect of the embodiment 6, respectively.
Figure 54B:
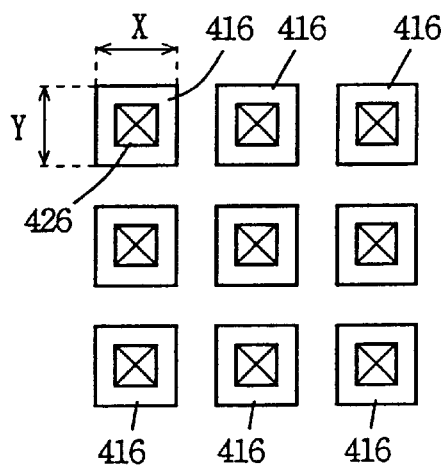
Figure 54C:
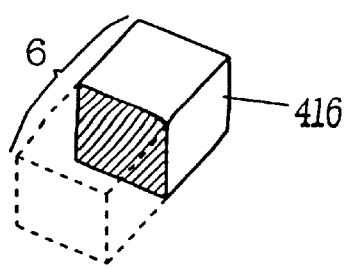

FIGS. 54A–54C show a structure of a main portion of the semiconductor device of the embodiment 6 of the invention. FIG. 54A shows arrangement of storage nodes forming capacitance elements. More specifically, FIG. 54A shows a plane layout of the storage nodes of DRAM memory cell capacitors. FIG. 54B shows a plane layout of conductive layers corresponding to the storage nodes and used in the capacitance elements of the embodiment 6 of the invention.

In FIG. 54A, word lines WLa–WLc are arranged in an X direction with a predetermined space (word line pitch) therebetween. Bit lines BLa and BLb are arranged in a Y direction perpendicular to word lines WLa–WLc with a predetermined space (bit line pitch) therebetween. The memory cell is arranged corresponding to the crossing between each word line and each bit line pair. In the Y direction, therefore, the memory cells are arranged at a pitch equal to double the pitch of word lines. In the X direction, the memory cells are arranged at a pitch equal to that of bit lines. Therefore, the storage nodes provided corresponding to the memory cells each have a length in the X direction which is half the length in the Y-direction.

In the arrangement shown in FIG. 54A, storage information of storage node 6-1 is read onto bit line BLa when word line WLa is selected. When word line WLb is selected, storage information of storage node 6-2 is read onto bit line BLb. When word line TLC is selected, storage information of storage node 6-3 is read onto bit line BLa. These storage nodes 6 are electrically connected to impurity regions (other than impurity regions connected to the bit lines) of the corresponding access transistors through contact holes 406, respectively. Each storage node 6 has a portion extended over and beyond the corresponding word line, whereby an area of a portion of the storage node opposed to the cell plate is maximized (see FIG. 8).

Word lines WLa–WLc and bit lines BLa and BLb are formed at levels lower than the flat portions of storage nodes. In the capacitance element of this invention, there is not restriction due to this arrangement of memory cells.

Specifically, in the capacitance element according to the invention, as shown in FIG. 54B, lengths in the X- and Y-directions of a conductive layer 416 corresponding to the storage node are substantially equal to each other. Since the memory cell capacitor has a stacked structure, conductive layer 416 can have a large side area. The structure shown in FIG. 54B is equivalent to the structure in which each storage node 6 (6-1–6-3) shown in FIG. 54A is divided into two portions, so that new side surfaces of the storage nodes provided by division can be utilized as the electrode surfaces of the capacitance elements. Thus, the area of side surface of conductive layer 416 hatched in FIG. 54C can be used as the additional electrode area of the capacitance element, which is not provided by storage node 6. Therefore, a ratio in length between the X- and Y-directions of conductive layer 416 can be substantially 1, whereby the capacitance value of the unit capacitance element can be significantly increased. Particularly, in the capacitance elements of the embodiments 2 to 5, conductive layer 416 is electrically connected to the conductive layer corresponding to the bit line or the conductive layer corresponding to the word line. Therefore, the lengths in the X- and Y-directions can be easily set to intended values without an influence by arrangement of word lines, bit lines and memory cells in the memory cell array.

The capacitance value of capacitance element can be increased by increasing the number of conductive layers 416 shown in FIG. 54B. Therefore, by minimizing the lengths of conductive layer 416 in the X- and Y-directions, more unit capacitance elements can be arranged in a limited area. By setting the lengths of conductive layer 416 in the X- and Y-directions to acceptable minimum values (minimum widths allowed in design, i.e., levels called design rules), therefore, it is possible to maximize the capacitance value per area of the capacitance element, and therefore the capacitance element having a good area efficiency can be implemented.

In particular, according to the degree of integration of 16-Mbit DRAM, about 10% increase of the capacitance value can be expected. As the storage capacity of this DRAM increases, the capacitance depends on the area of side surfaces of storage nodes 6 more significantly compared with the area of the upper surfaces (because the area of upper surface decreases in accordance with increase in integration degree and density). By employing the layout of conductive layers shown in FIG. 54B, therefore, it is possible to increase the capacitance value of the capacitance element.

According to the embodiment 6 of the invention, as described above, the conductive layer corresponding to the storage node forming the unit capacitance element of the capacitance element has lengths in the X- and Y-directions at a ratio of 1:1, and thus has the minimum design size. Therefore, the capacitance element having a good area efficiency can be easily implemented. As for conductive layer 416 shown in FIG. 54B, any one of the capacitance elements of the embodiments 2 to 5 may be used.

[Embodiment 7]

Figure 55:
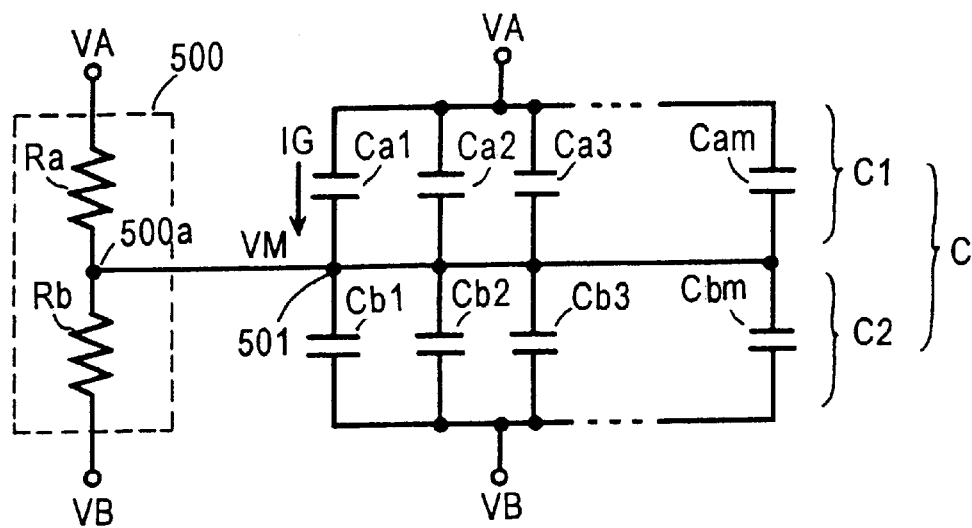
FIG. 55 schematically shows a structure of a capacitance element of an embodiment 7 of the invention.

FIG. 55 schematically shows a structure of a semiconductor device according to the embodiment 7 of the invention. In FIG. 55, capacitance C includes capacitance elements C1 and C2 connected in series between one electrode VA and the other electrode node VB. These capacitance elements C1 and C2 may have structures selected from those of the embodiments 1 to 6. The capacitance element C1 includes unit capacitance elements Ca1–Cam which are connected in parallel between electrode node VA and connection node 501. Capacitance element C2 includes unit capacitance elements Cb1–Cbm which are connected in parallel between connection node 501 and the other electrode node VB.

There is provided an intermediate voltage applying circuit 500 for applying an intermediate voltage VM to connection node 501 between capacitance elements C1 and C2. This intermediate voltage applying circuit 500 includes resistor elements Ra and Rb connected in series between electrode nodes VA and VB. These resistor elements Ra and Rb have large resistance values which are substantially equal to each other. Therefore, intermediate voltage VM supplied from an output node 500a of intermediate voltage applying circuit 500 is at half a level of the voltage applied between nodes VA and VB.

Unit capacitance elements Ca1–Cam included in capacitance elements C1 and C2 are formed utilizing the memory cell capacitor structure. Thus, capacitance elements C1 and C2 are formed by the same manufacturing process as the memory cells. Some memory cells included in the memory cell array may have defects due to particles mixed thereinto during manufacturing. In unit capacitance elements Ca1–Cam and Cb1–Cbm, particles may adhere to capacitor insulating films to cause insulation failure in unit capacitance elements, similarly to the failure in memory cells. In the memory cell capacitor including the capacitor insulating film without a defect, a current of the order of $10^{-12}$ A usually flows through the capacitor insulating film. If the capacitor insulating film has a defect, a leak current, e.g., of the order of $10^{-6}$ A flows. Thus, a large leak current IG flows through the capacitor having a defective insulating film.

In FIG. 55, if unit capacitance element Cal has a defective insulating film, leak current IG flows from electrode node VA to connection node 501. If intermediate voltage applying circuit 500 is not employed, leak current IG raises the potential on connection node 501 (assuming that the potential on node VA is higher than the potential on node VB). In this case, the voltage on connection node 501 rises to voltage VA on electrode node VA (node and voltage applied thereto are denoted by the same reference characters). In this state, voltage VA–VB is applied across the opposing electrodes of each of unit capacitance elements Cb1–Cbm. Capacitance elements C1 and C2 are connected in series, because capacitance elements C1 and C2, i.e., unit capacitance elements Ca1–Cam and Cb1–Cbm have breakdown voltages of (VA–VB)/2.

Therefore, when the voltage of connection node 501 rises to VA level, a voltage larger than the breakdown voltage of these unit capacitance elements Cb1–Cbm is applied across the electrodes of each of these unit capacitance elements Cb1–Cbm, so that the insulating films of unit capacitance elements Cb1–Cbm break down. Thereby, a current larger than leak current IG flows from connection node 501 to the other electrode node VB through the unit capacitance elements in which insulation is broken down, so that the potential on connection node 501 lowers, and insulation breakdown of unit capacitance elements Ca1–Cam occurs, resulting in insulation breakdown of capacitance C.

Owing to provision of intermediate voltage applying circuit 500 for holding the connection node 501 at intermediate voltage VM level, leak current IG, which flows due to insulation failure, e.g., at unit capacitance element Ca1, is absorbed by intermediate voltage applying circuit 500, so that the connection node 501 is held at intermediate voltage VM. Thereby, insulation breakdown of unit capacitance elements Cb1–Cbm is prevented, and thus insulation breakdown of capacitance C is prevented. In this case, the normal unit capacitance elements other than defective unit capacitance element Ca1 can be held in the normal state, so that a yield and a reliability of capacitance C are improved.

In the structure where the resistance elements Ra and Rb have resistance values which are set to be able to drive of a current slightly larger than leak current IG, leak current IG of the order of $10^{-6}$ A can be absorbed by intermediate potential applying circuit 500, so that the voltage level of intermediate voltage VM at connection node 501 can be prevented from changing and can be held at a constant value. When insulation breakdown of the unit capacitance element occurs in capacitance element C1, leak current IG is absorbed by resistance element Rb of intermediate voltage applying circuit 500. When insulation breakdown occurs at the unit capacitance element included in capacitance element C, the leak current is supplied from resistance element Ra.

[Modification 1]

Figure 56:
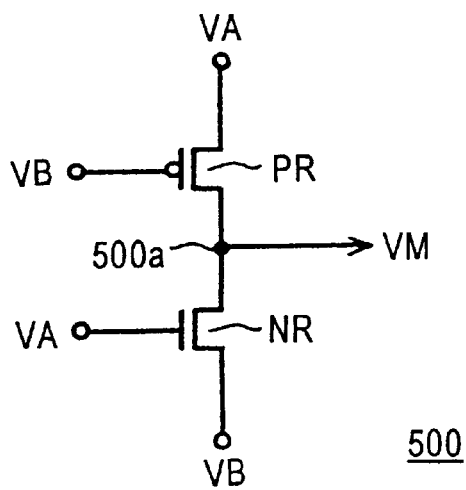
FIG. 56 shows another modification of a structure of an intermediate voltage applying circuit shown in FIG. 55.

FIG. 56 shows a structure of a modification of intermediate voltage applying circuit 500 shown in FIG. 55. In FIG. 56, intermediate voltage applying circuit 500 includes a p-channel MOS transistor PR, which is connected between one electrode node VA and output node 500a and has a gate coupled to the other electrode node VB, and an n-channel MOS transistor NR which is connected between output node 500a and the other electrode node VB and has a gate connected to electrode node VA. MOS transistors PR and NR have substantially equal channel resistances, and also have gate widths causing flow of leak current IG (i.e., current of the order of $10^{-6}$ A). By utilizing MOS transistors PR and NR as resistance elements, an area occupied by intermediate voltage applying circuit 500 can be reduced owing to the large resistances of MOS transistors PQ and NR, compared with the structure using polycrystalline silicon resistance. In FIG. 56, it is assumed that the voltage level on one electrode node VA is higher than the voltage level on the other electrode node VB.

In the structure shown in FIG. 56, resistances may be connected in such a manner that MOS transistors PR and NR each have gate and drain mutually connected in stead of such a manner that MOS transistors PR and NR each receive on its gate a constant voltage.

[Modification 2]

Figure 57:
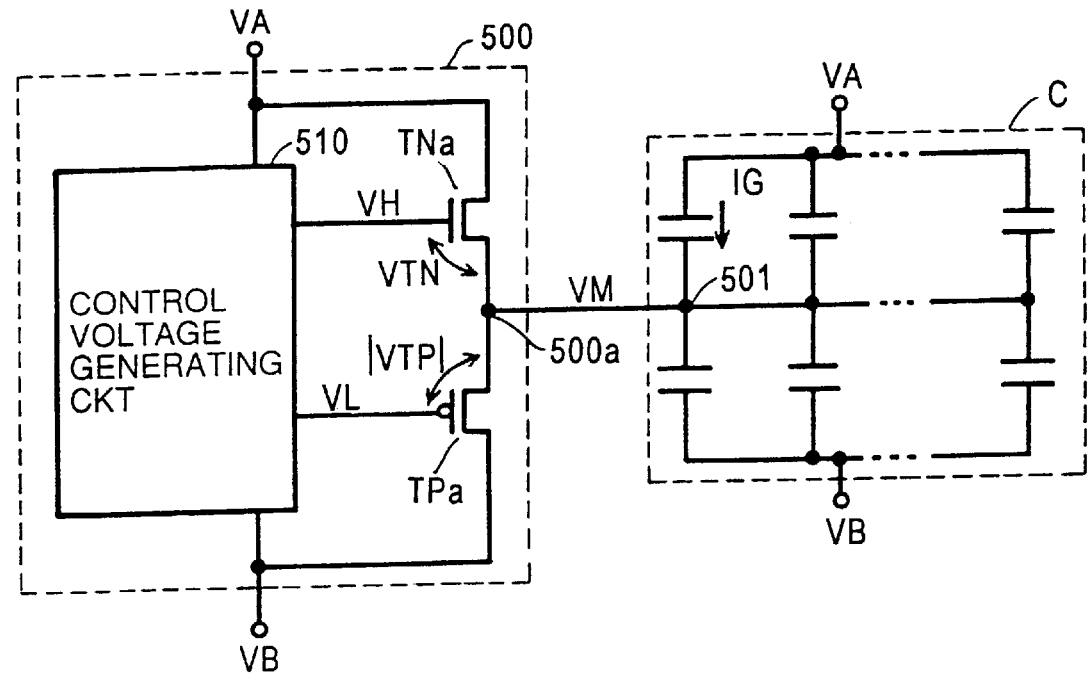
FIG. 57 shows still another structure of the intermediate voltage applying circuit shown in FIG. 55.

FIG. 57 shows a structure of a second modification of the embodiment 7 of the invention. In FIG. 57, the intermediate voltage applying circuit 500 includes a control voltage generating circuit 510, which utilizes voltages on electrode nodes VA and VB to produce control voltages VH and VL between voltages VA and VB, an n-channel MOS transistor TNa which is connected between electrode node VA and output node 500a and receives control voltage VH on its gate, and a p-channel MOS transistor TPa which is connected between output node 500a and electrode node VB and receives control voltage VL on its gate. MOS transistor TNa has a threshold voltage VTN, and MOS transistor TPa has a threshold voltage VTP. Capacitance C includes a series combination of capacitance elements C1 and C2 similarly to the structure shown in FIG. 55, but only the reference characters denoting capacitance C and connection node 501 are shown in FIG. 57.

MOS transistor TNa is turned on when a difference between control voltage VH applied to its gate and intermediate voltage VM on output node 500a exceeds threshold voltage VTN, and supplies a current from electrode node VA to output node 500a. When a difference between control voltage VH and intermediate voltage VM becomes below threshold voltage VTN, MOS transistor TNa is turned off. Thus, MOS transistor TNa is operable to clamp a lower voltage of intermediate voltage VM on output node 500a at (VH−VTN). In other words, MOS transistor TNa operates in a source follower mode to lower voltage VH applied to its gate by threshold voltage VTN for transmission to its source.

MOS transistor TPa is turned on when intermediate voltage VM exceeds control voltage VL by the absolute value |VTP| of its threshold voltage, and flows a current from output node 500a to electrode node VB to lower the voltage level of intermediate voltage VM. When the difference between intermediate voltage VB and control voltage VL becomes below the absolute value |VTP| of threshold voltage, MOS transistor TPa is turned off. This MOS transistor TPa is therefore operable to clamp a higher voltage of intermediate voltage VM at the level of VL+|VTP|. Thus, MOS transistor TPa operates in a source follower mode. Unless otherwise specified bellow, voltage VA on electrode node VA is higher than the voltage on electrode node VB. Therefore, intermediate voltage VM is clamped at a voltage range expressed by the following formula:

$$VH-VTN \leq VM \leq VL+|VTP|$$

When intermediate voltage VM is in this voltage range, both MOS transistors NQa and PQa are off, and a current does not flow in intermediate voltage applying circuit 500 through MOS transistors TNa and TPa. When intermediate voltage VM exceeds the voltage range expressed by the above formula, MOS transistor TPa is turned on, and MOS transistor TNa is turned off. When intermediate voltage VM goes below the voltage range expressed by the above formula, MOS transistor TNa is turned on, and MOS transistor TPa is turned off. Only when the voltage on output node 500a, i.e., the voltage on connection node 501 is not in the voltage range expressed by the above formula, one of MOS transistors TNa and TPa at the output stage of intermediate voltage applying circuit 500 is turned on. Therefore, a current does not regularly flow through MOS transistors TNa and TPa, so that a current consumption is reduced. Control voltages VH and VL are set to values which prevent a push-pull operation of MOS transistors TNa and TPa, and also prevent MOS transistors TNa and TPa from being on simultaneously. More specifically, these control voltages VH and VL are set to values satisfying the following formula:

$$VH-VL=VTN+|VTP|$$

MOS transistors TNa and TPa have sufficiently large gate widths providing such large current drivability, that the voltage value of intermediate voltage VM does not change even when a current of the order of $10^{-3}$ A flows through connection node 501.

Although MOS transistors TNa and TPa have large current drivability, they do not simultaneously attain the on-state. If leak current IG is of the order of $10^{-6}$ A, MOS transistors TNa and TPa rapidly clamp the voltage VM at a predetermined voltage level even when intermediate voltage VM on output node 500a changes, so that MOS transistors TNa and TPa are on only for an extremely short period, and only a significantly small current flows through intermediate voltage applying circuit 500. Therefore, a through current flows through intermediate voltage applying circuit 500 and capacitance C (i.e., a current flows between electrode nodes VA and VB) only for an extremely short period.

Figure 58A:
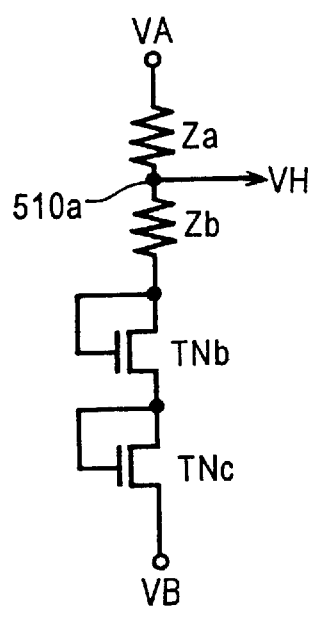
FIGS. 58A and 58B show an internal structure of a control voltage generating circuit shown in FIG. 57.
Figure 58B:
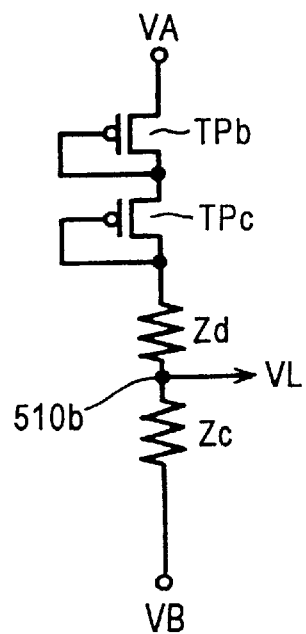

FIGS. 58A and 58B show an example of a structure of control voltage generating circuit 510 shown in FIG. 57. FIG. 58A shows a structure of a control voltage VH generating portion, and FIG. 58B shows a structure of a control voltage VL generating portion.

In FIG. 58A, control voltage VH generating portion includes a resistance element Za of a high resistance connected between electrode node VA and internal output node 510a, a resistance element Zb of a high resistance having one end connected to internal output node 510a, and n-channel MOS transistors NQb and NQc connected in series between high-resistance resistance element Zb and the other electrode node VB. Each of MOS transistors NQb and NQc has a gate and a drain connected together. High-resistance resistance elements Za and Zb have substantially the same resistance value. Each of MOS transistors NQb and NQc operates in a diode mode to cause voltage drop by its threshold voltage VTN. Therefore, a voltage at the node of gate/drain of MOS transistor TNb is 2·VTN+VB. Therefore, control voltage VH supplied from internal output node 510a can be expressed by the following formula:

$$VH = VA - \{VA - (VB + 2 \cdot VTN)\}/2 = VA/2 + VB/2 + VTN$$

In FIG. 58B, the control voltage VL generating portion includes a resistance element Zc of a high resistance connected between the other electrode node VB and internal output node 510b, a resistance element Zd of a high resistance having one end connected to internal output node 510b, and p-channel MOS transistors TPb and TPc connected in series between the one electrode node VA and the other end of resistance element Zd. Each of MOS transistors TPb and TPc has a gate and a drain connected together. High-resistance resistance elements Zc and Zd have substantially the same high resistance values. In this state, each of MOS transistors TPb and TPc operates in a diode mode, and causes voltage drop by the absolute value |VTP| of its threshold voltage. Therefore, control voltage VL supplied from internal output node 510 can be expressed by the following formula, similarly to the control voltage VH:

$$VL = (VA - 2 \cdot |VTP| - VB)/2 + VB = VA/2 + VB/2 - |VTP|$$

From the foregoing two formulas, the following formula is obtained:

$$VH - VL = VTN + |VTP|$$

Therefore, intermediate voltage VM can be determined as follows from the foregoing inequality:

$$VM \approx VA/2 + VB/2$$

Therefore, intermediate voltage VM takes a value substantially intermediate the voltages VA and VB applied to electrode nodes VA and VB, respectively.

MOS transistors TNa and TPa are voltage-driven transistors, so that control voltage generating circuit 510 is required only to generate the voltage for them, and is not required to generate a current. Therefore, the resistance values of resistance elements Za to Zd can be increased sufficiently, and a current flowing between electrode nodes VA and VB in control voltage generating circuit 510 can be reduced sufficiently, so that its current consumption can be negligibly small.

Therefore, by utilizing the structure of the intermediate voltage applying circuit shown in FIGS. 57 and 58, the through current can be sufficiently reduced compared with a structure in which an intermediate voltage is generated by resistance division, so that it is possible to suppress increase in current consumption of the semiconductor device.

[Modification 3]
[Modification 1 of the Control Voltage Generating Circuit]

Figure 59:
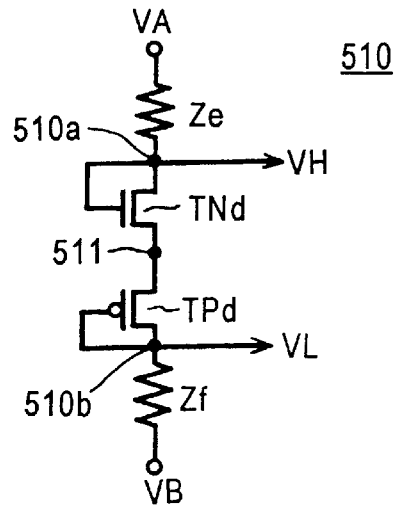
FIG. 59 shows a structure of a modification of a control voltage generating circuit shown in FIG. 57.

FIG. 59 shows a structure of a first modification of the control voltage generating circuit shown in FIG. 57. In FIG. 59, control voltage generating circuit 510 includes a resistance element Ze connected between electrode node VA and internal output node 510a, an n-channel MOS transistor TNd connected between internal output node 510a and an internal node 511, a p-channel MOS transistor TPd connected between internal node 511 and internal output node 510b, and a resistance element Zf of a high resistance connected between internal output node 510b and the other electrode node VB. Each of MOS transistors TNd and TPd has a gate and a drain connected together. High-resistance resistance elements Ze and Zf have sufficiently large resistance values, and MOS transistors TNd and TPd operate in a diode mode.

If high-resistance resistance elements Ze and Zf have substantially the same resistance values, and MOS transistors TNd and TPd have substantially the same channel resistances, the voltage on internal node 511 attains the intermediate voltage level of (VA+VB)/2. Therefore, control voltages VH and VL can be obtained by the following formulas:

$$VH = VA/2 + VB/2 + VTM$$

$$VL = VA/2 + VB/2 - |VTP|$$

In this structure shown in FIG. 59, two control voltages VH and VL can be generated by only one circuit portion, so that the circuit scale can be small. Since a current flows only through resistance elements Ze and Zf in one circuit portion, the current consumption is further reduced. Since the resistance values of high-resistance resistance elements Ze and Zf are sufficiently large, the current consumption is substantially negligibly small.

If this semiconductor device is the DRAM, it internally produces cell plate voltage VCP and bit line precharge voltage BVL at the intermediate voltage level. These voltages VCP and VBL are applied to the cell plate of memory cell capacitors and the bit lines in a standby state, respectively. The circuit portion generating intermediate voltage VCP and VBL must drive a large load, so that it is designed to stabilize its output. Therefore, intermediate voltage VM may be cell plate voltage VCP or bit line precharge voltage VBL.

[Modification 1 of Embodiment 7]

Figure 60:
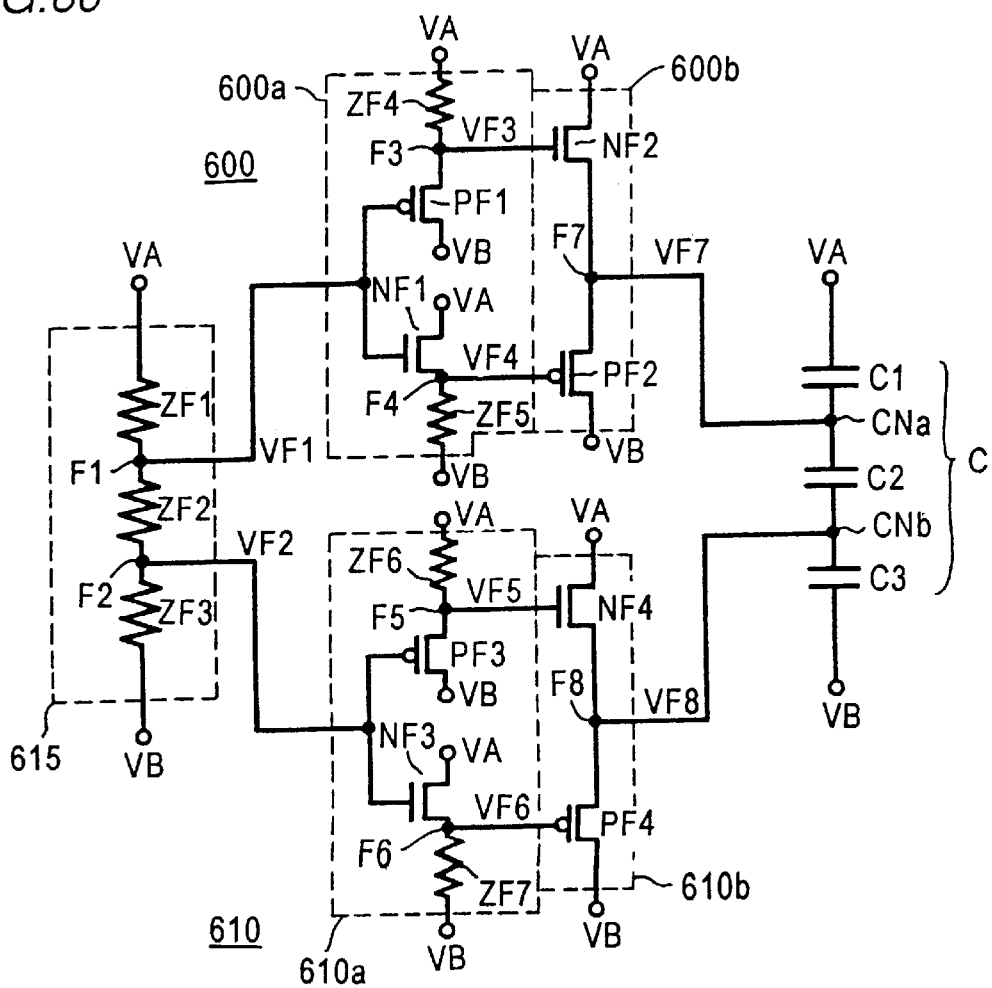
FIG. 60 shows a structure of a modification of the embodiment 7 of the invention.

FIG. 60 shows a structure of a first modification of the embodiment 7 of the invention. In FIG. 60, three capacitance elements C1, C2 and C3 are connected in series between electrode nodes VA and VB. Structures of capacitance elements C1 to C3 are selected from those of the embodiments 1 to 6. Therefore, a voltage of (VA−VB)/3 is applied across the electrodes of each of capacitance elements C1–C3. For example, electrode node VA is supplied with an external power supply voltage or a high voltage VPP.

Intermediate voltage applying circuits 600 and 610 are provided for connection nodes CNa and CNb between capacitance elements C1–C3, respectively. A voltage dividing circuit 615 is arranged commonly to intermediate voltage applying circuits 600 and 610. These voltage dividing circuit 615 includes resistance elements ZF1, ZF2 and ZF3 connected in series between electrode nodes VA and VB. A voltage VF1 is generated from connection node F1 between resistance elements ZF1 and ZF2, and a voltage VF2 is generated from a connection node F2 between resistance elements ZF2 and ZF3. Voltage dividing circuit 615 is required to generate only control voltages VF1 and VF2, and is not required to generate a current, as will be described later. Therefore, high-resistance resistance elements ZF1–ZF3 have high resistances of several mega-ohms or more. Voltages VF1 and VF2 can be expressed by the following formulas, because resistance elements ZF1–ZF3 have the substantially equal resistances, and therefore a substantially equal voltage of (VA–VB)/3 is applied across each of resistance elements ZF1–ZF3.

$$VF1 \approx VA - (VA - VB)/3$$
$$\approx 2 \cdot VA/3 + VB/3$$
$$VF2 \approx VB + (VA - VB)/3$$
$$\approx VA/3 + 2 \cdot VB/3$$

Intermediate voltage applying circuit 600 includes a control voltage generating portion 600a generating control voltages VF3 and VF4 in accordance with voltage VF1, and a voltage generating portion 600b generating from an output node F7 a voltage VF7, which is applied to a connection node CNa, in accordance with control voltages VF3 and VF4 from control voltage generating portion 600a.

Control voltage generating portion 600a includes a resistance element ZF4 which is connected between electrode node VA and internal node F3, a p-channel MOS transistor PF1 which is connected between internal node F3 and electrode node VB for receiving voltage VF1 on its gate, an n-channel MOS transistor NF1 which is connected between electrode node VA and internal node F4 for receiving voltage VF1 on its gate, and a resistance element ZF5 of a high resistance connected between internal node F4 and electrode node VB. Resistance elements ZF4 and ZF5 have sufficiently large resistance values of several mega-ohms or more, similarly to the resistance elements ZF1–ZF3. In this state, MOS transistors PF1 and NF1 operate in a source follower mode, and voltages VF3 and VF4 supplied from internal nodes F3 and F4 are expressed by the following formulas:

$$VF3 = VF1 + |VTP|$$
$$= 2 \cdot VA/3 + VB/3 + |VTP|$$
$$VF4 = VF1 - VTN$$
$$= 2 \cdot VA/3 + VB/3 - VNT$$

Voltage generating portion 600b includes an n-channel MOS transistor NF2, which is connected between electrode node VA and output node F7 and receives control voltage VF3 on its gate, and a p-channel MOS transistor PF2, which is connected between output node F7 and the other electrode node VB and receives control voltage VF4 on its gate. MOS transistors NF2 and PF2 have relatively large current drivability (see FIG. 57). Since MOS transistors NF2 and PF2 operate in a source follower mode, voltage VF7 generated from output node F7 satisfies the following inequalities:

$$VF7 \geq VF3 - VTN$$
$$\geq 2 \cdot VA/3 + VB/3 + |VTP| - VTN$$
$$VF7 \leq VF4 + |VTP|$$
$$\leq 2 \cdot VA/3 + VB/3 - VTN + |VTP|$$

therefore, $$VF7 \approx 2 \cdot VA/3 + VB/3 - VTN + |VTP|$$

Voltage applying circuit 610 for connection node CNb includes a control voltage generating portion 610a which produces control voltages VF5 and VF6 in accordance with voltage VF2, and voltage generating portion 610b which produces voltage VF8 in accordance with control voltages VF5 and VF6 received from control voltage generating portions 600a and 610a, respectively. Control voltage generating portion 610a includes a resistance element ZF6 of a high resistance connected between electrode node VA and internal node F5, a p-channel MOS transistor PF3 connected between internal node F5 and electrode node VB for receiving voltage VF2 on its gate, an n-channel MOS transistor NF3 connected between electrode node VA and internal node F6 for receiving voltage VF2 on its gate, and a resistance element ZF7 of a high resistance connected between internal node F6 and electrode node VB. High-resistance resistance elements ZF6 and ZF7 have high resistance values of, e.g., several mega-ohms. In control voltage generating portion 610a, therefore, MOS transistors PF3 and NF3 operate in a source follower mode, and clamps control voltages VF5 and VF6 at the voltage levels expressed by the following formulas:

$$VF5 = VF2 + |VTP|$$
$$= VA/3 + 2 \cdot VB/3 + |VTP|$$
$$VF6 = VF2 - VTN$$
$$= VA/3 + 2 \cdot VB/3 - VTN$$

Voltage generating portion 610b includes an n-channel MOS transistor NF4 connected between electrode node VA and an output node F8 for receiving control voltage VF5 on its gate, and a p-channel MOS transistor PF4 connected between output node F8 and electrode node VB for receiving control voltage VF6 on its gate. These MOS transistors NF4 and PF4 operate in a source follower mode, similarly to voltage generating portion 600b, and clamp voltage VFB at the voltage level expressed by the following formulas.

$$VF8 \geq VF5 - VTN$$
$$\geq VA/3 + 2 \cdot VB/3 + |VTP| - VTN$$
$$VF8 \leq VF6 + |VTP|$$
$$\leq VA/3 + 2 \cdot VB/3 - VTN + |VTP|$$

Therefore, voltage VF8 can be expressed by the following formula:

$$VF8 \approx VA/3 + 2 \cdot VB/3 - VNT + |VTP|$$

Assuming that absolute values VTN and |VTP| of threshold voltages are nearly equal to each other, voltages VF7 and VF8 applied to connection nodes CNa and CNb can be expressed by the following formulas, respectively:

$$VF=2\cdot VA/3+VB/3$$

$$VF8=VA/3+2\cdot VB/3$$

Therefore, the voltage applied across the electrodes of each of capacitance elements C1–C3 is set to (VA–VB)/3, and thus breakdown voltage characteristics of these capacitance elements C1–C3 are ensured.

In the structure of voltage applying circuit shown in FIG. 60, voltages VF1 and VF2 generated from voltage circuit 615 are applied to gates of MOS transistors PF1, PF3, NF1 and NF3. These voltages VF1 and VF2 are required only to hold their voltage levels, and therefore voltage dividing circuit 615 is not required to produce a current. By providing sufficiently large resistance values to resistance elements ZF1–ZF3 included in voltage dividing circuit 615, a current consumption of voltage dividing circuit 615 can be set to a substantially ignorable value.

Control voltages VF3, VF4, VF5 and VF6 generated from control voltage generating portions 600a and 610a are sent to gates of MOS transistors NF2, PF2, NF4 and PF4 included in voltage generating portions 600b and 610b, respectively. Therefore, these control voltages VF3–VF6 are required only to hold their voltage levels, so that control voltage generating portion 610a is not required to drive the current. Therefore, resistance elements ZF4, ZF5, ZF6 and ZF7 have sufficiently large resistance values, and therefore a current consumption by control voltage generating portions 600a and 610a can be set to a substantially ignorable value.

Each of MOS transistors NF2, PF2, NF4 and PF4 included in voltage generating portions 600b and 610b is required to have a relatively large current drivability for the purpose of compensating for a leak current at connection node CNa or CNb. However, MOS transistors NF2 and PF2 operate in a push-pull manner, and do not simultaneously attain the on-state. Likewise, MOS transistors NF4 and PF4 operate in a push-pull manner, and do not simultaneously attain the on-state. Therefore, no through current flows between electrode nodes VA and VB at voltage generating portions 600b and 610b, and thus a current consumption is small. Only when the voltage level on connection nodes CNa and CNb change, MOS transistors NF2, PF2, NF4 and PF4 are selectively turned on in each of voltage generating portions 600b and 610b. In the structure where MOS transistors NF2, PF2, NF4 and PF4 can drive currents relatively larger than the leak current of capacitance elements C1–C3 included in capacitance C, it is possible to reduce sufficiently a period for which the MOS transistors in voltage generating portions 600b and 610b are on, so that it is possible to reduce sufficiently an average current flowing to the electrode nodes in voltage generating portions 600b and 610b.

[Modification 2 of the Embodiment 7]

Figure 61:
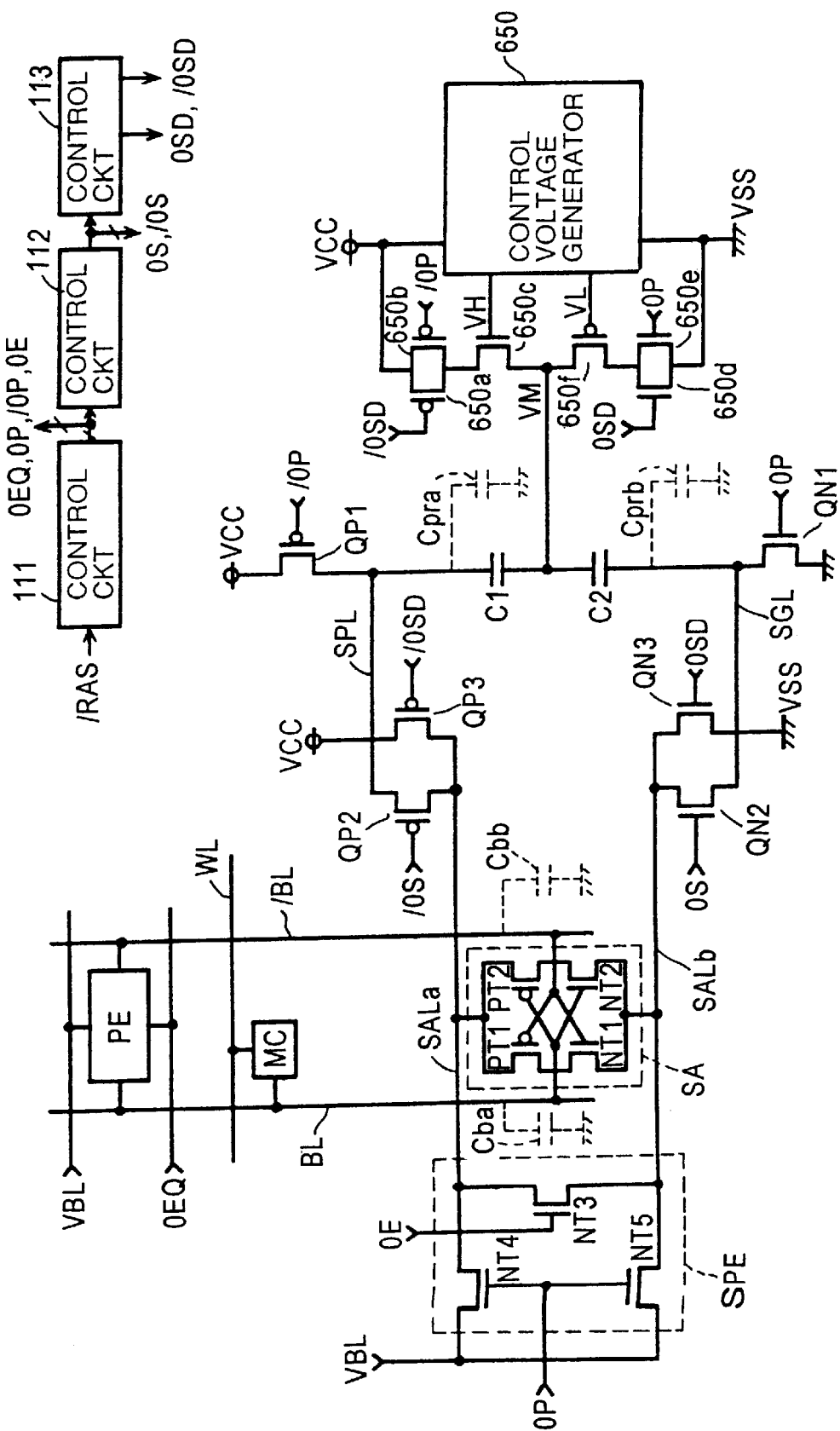
FIG. 61 schematically shows still another structure of the semiconductor device of the embodiment 7 of the invention.

FIG. 61 shows a structure of a second modification of the embodiment 7 of the invention. The structure shown in FIG. 61 differs from the structure of the sense amplifier drive portion shown in FIG. 44 in that intermediate voltage VM is applied to the connection node between capacitance elements C1 and C2 connected between sense amplifier power supply line SPL and sense amplifier ground line SGL. Structures other than the above are the same as those shown in FIG. 44. Corresponding parts and portions bear the same reference characters, and will not be described below. A series combination of capacitance elements C1 and C2 corresponds to capacitance C shown in FIG. 44.

The intermediate voltage generating portion includes control voltage generating circuit 650, which operates using power supply voltage VCC and ground voltage VSS as its operation power supply voltages, and produces control voltages VH and VL, a p-channel MOS transistor 650a, which is turned on to transmit power supply voltage VCC when delayed sense amplifier activating signal /φSD is active, a p-channel MOS transistor 650b, which is turned on to transmit power supply voltage VCC when precharge instructing signal /φp is active, an n-channel MOS transistor 650c, which receives on its gate control voltage VH from control voltage generating circuit 650, and operates in a source follower mode with a current supplied from power supply node VCC through turned-on MOS transistors 650a and 650b, an n-channel MOS transistor 650d which is turned on to transmit ground voltage VSS when delayed sense amplifier activating signal φSD is active, an n-channel MOS transistor φP which is turned on to transmit ground voltage VSS when precharge instructing signal φP is active, and a p-channel MOS transistor 650f which receives control voltage VL from control voltage generating circuit 650 on its gate, and operates in a source follower mode coupled to the ground node VSS through turned-on MOS transistors 650d and 650e for clamping intermediate voltage VM.

Control voltage generating circuit 650 may be either of the structures shown in FIGS. 58 and 59. MOS transistors 650c and 650f correspond to MOS transistors TNa and TPa performing the push-pull operation shown in FIG. 57, respectively. Therefore, MOS transistors 650c and 650f are coupled to power supply node VCC and ground node VSS to operate in a source follower mode, respectively, and perform the push-pull operation, when MOS transistors 650a, 650b, 650d and 650e are turned on.

When all MOS transistors 650a, 650b, 650d and 650e are turned off, MOS transistors 650c and 650f are isolated from power supply node VCC and ground node VSS, respectively, so that the operation of clamping the intermediate voltage VM is inhibited (i.e., stops), and the connection node of capacitance elements C1 and C2 are electrically floated. Then, an operation will be described below.

The operation of sense amplifier drive portion shown in FIG. 61 is the same as that shown in the operation waveform diagram of FIG. 45 already described, and therefore will be described below with reference to the operation waveform diagram of FIG. 45. In the standby state (i.e., when row address strobe signal /RAS is at H-level), signals /φP and φSD are at L-level, and signals φP and /+SD are at H-level. In this state, MOS transistors 650b and 650e are on, and MOS transistors 650c and 650f are connected to power supply node VCC and ground node VSS, respectively, and operate in the source follower mode in accordance with control voltages VH and VL received from control voltage generating circuit 650. Control voltages VH and VL can be obtained by the same structure as control voltage generating circuit shown in FIGS. 58 and 59 except for that voltages VA and VB are replaced with power supply voltage VCC and ground voltage VSS, respectively. Therefore, intermediate voltage VM is held substantially at the voltage level of (VCC+VSS)/2.

At time t1, row address strobe signal /RAS is activated. Thereby, precharge instructing signal φP changes into L-level, and signal /φP changes to H-level, so that MOS transistors 650b and 650e are turned off (at time t2). In this state, signal /φSD is at H-level, and signal φSD is at L-level, so that both MOS transistors 650a and 650d are off. Therefore, MOS transistors 650c and 650f are isolated from power supply node VCC and ground node VSS, respectively, so that the operation of generating intermediate voltage VM (i.e., operation of supplying a current) and, in other words, the clamp operation stops. In this state, therefore, the connection node between capacitance elements C1 and C2 is electrically floated.

At time t3, a word line is selected, so that the potential on selected word line WL rises, and the potential on bit line BL rises by ΔV.

At time t4, sense amplifier activating signals φS and /φS are activated, and MOS transistors QP2 and QN2 are turned on, so that charges stored in parasitic capacitance Cba of bit line BL are transmitted to parasitic capacitance Cbb of bit line /BL through capacitance elements C2 and C1. At this time, since the connection node between capacitance elements C1 and C2 is electrically floated, charges can be surely transferred from sense amplifier ground line SGL to sense amplifier power supply line SPL without any influence by capacitance elements C1 and C2.

At time t5, transfer of charges between bit lines BL and /BL is completed. Then, delayed sense amplifier activating signals φSD and /φSD are activated at time t6. Activation of delayed sense amplifier activating signal φSD and /φSD is performed for compensating for charge absorption by parasitic capacitances Cpra and Cprb at sense amplifier power supply line SPL and sense amplifier ground line SGL, respectively, and these signals φSD and /φSD can be deemed as signals for instructing completion of the sense operation.

In accordance with activation of delayed sense amplifier activating signals φSD and /φSD, MOS transistors QP3 and QN3 are turned on, so that sense amplifier activating signal lines SALa and SALb are driven to power supply voltage VCC and ground voltage VSS, respectively, and bit lines BL and /BL are driven to power supply voltage VCC level and ground voltage VSS level, respectively. Meanwhile, in accordance with activation of delayed sense amplifier activating signals /φSD and φSD, MOS transistors 650a and 650d are turned on, and MOS transistors 650c and 650f are electrically connected to power supply node VCC and ground node VSS, respectively. From this state, therefore, MOS transistors 650c and 650f start the push-pull operation again in accordance with control voltages VH and VL, respectively, and intermediate voltage VM is held at the predetermined voltage level.

When writing or reading of memory cell data is performed, the operation of selecting memory cell is completed, so that the potential on word line WL lowers, and sense amplifier activating signals φS and /φS are deactivated. Also, delayed sense amplifier activating signals φSD and /φSD are deactivated. Thereby, MOS transistors 650a and 650d are deactivated. Then, precharge instructing signals /φP and φP are activated, and MOS transistors 650b and 650e are turned on, so that the source follower operation of MOS transistors 650c and 650f is activated, and intermediate voltage VM is held at the predetermined voltage level.

Therefore, generation (i.e., clamping) of intermediate voltage VM is inhibited for a period between times t2 and t6, i.e., from start of the memory cell selection to completion of the sense operation, and the connection node between capacitance elements C1 and C2 is electrically floated. Since a period for which the connection node between capacitance elements C1 and C2 is electrically floated, i.e., a period between times t2 and t6 is short, change in voltage at the connection node between capacitance elements C1 and C2 is extremely small even when a current of the order of $10^{-6}$ A flows as a result of a leak current at capacitance elements C1 and C2 due to an insulation failure.

In the structure where capacitance elements C1 and C2 have capacitance values of, e.g., 1000 pF, leak current IG is 1 μA and a change ΔVa in voltage between the electrodes of capacitance elements C1 and C2 is 1.65 V, a time Δt required for causing the voltage change of ΔVa=1.65 V is expressed by the following formula:

$$\Delta t = C1 (\text{or } C2) \cdot \Delta Va / IG = 1000 \cdot 10^{-12} \cdot 1.65 / 1 \cdot 10^{-6} = 1.65 \text{ ms}$$

Therefore, Δt is sufficiently longer than the time of 20–30 ns between times t2 and t6, and therefore, it is possible to ignore an influence by leak current IG in capacitance elements C1 and C2 in the operation of charge transfer from sense amplifier ground line SGL to sense amplifier power supply line SPL (i.e., the voltage across the electrodes of capacitance elements C1 and C2 does not substantially change).

Even when no insulation failure occurs at capacitance elements C1 and C2, the potential on the connection node may change due to an influence, e.g., by a leak current in the substrate. Even in this case, the connection node between capacitance elements C1 and C2 can be held at intermediate voltage VM level owing to provision of the intermediate voltage applying circuit, and therefore the charge transfer can be performed stably in accordance with required characteristics.

[Modification 1 of Intermediate Voltage Generating Portion]

Figure 62:
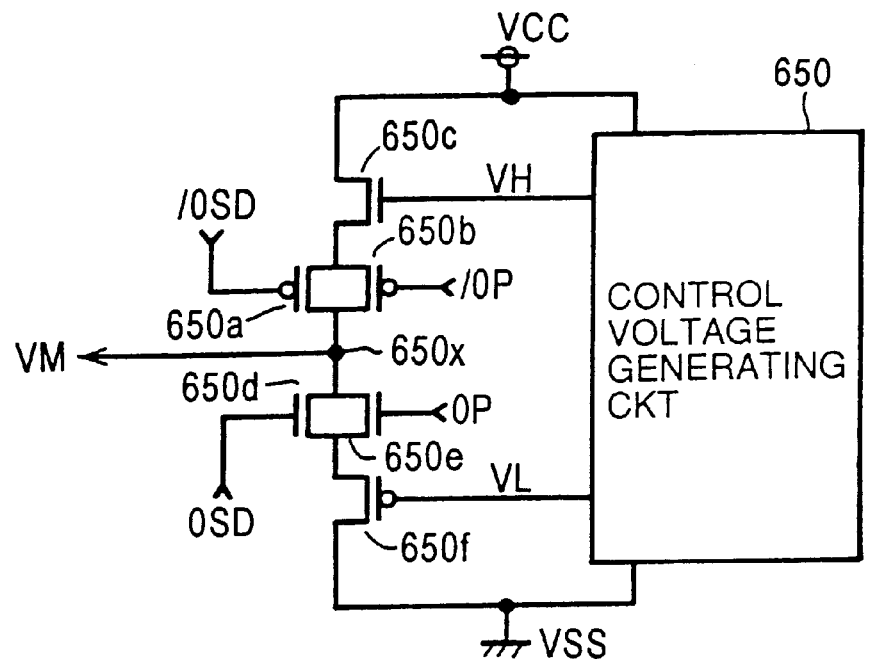
FIG. 62 shows a structure of a modification of an intermediate voltage applying circuit shown in FIG. 61.

FIG. 62 shows a structure of a modification of the intermediate voltage generating portion shown in FIG. 61. In the structure of intermediate voltage generating portion shown in FIG. 62, p-channel MOS transistors 650a and 650b which receive signals /φSD and /φP, respectively, are arranged between n-channel MOS transistor 650c receiving control voltage VH on its gate and an output node 650x. Also, n-channel MOS transistors 650d and 650e which receive signals φSD and φP, respectively, are arranged between p-channel MOS transistor 650f receiving control voltage VL on its gate and output node 650x. Output node 650x is connected to the connection node between capacitance elements C1 and C2 shown in FIG. 61.

In this structure shown in FIG. 62, output node 650x surely enters an electrically floating state by MOS transistors 650a, 650b, 650d and 650e, similarly to the foregoing structure. Therefore, in the operation of transferring charges of capacitance elements C1 and C2 shown in FIG. 61, it is possible to prevent surely an influence exerted on the connection node between the elements C1 and C2 by a junction capacitance of MOS transistors 650c and 650f. MOS transistors 650a, 650b, 650d and 650e have sufficiently small channel resistances and sufficiently large current supply capabilities, so that the clamping operations of MOS transistors 650c and 650f are not adversely affected when MOS transistors 650a, 650b, 650d and 650e are turned on.

[Modification 2 of Intermediate Voltage Generating Portion]

Figure 63:
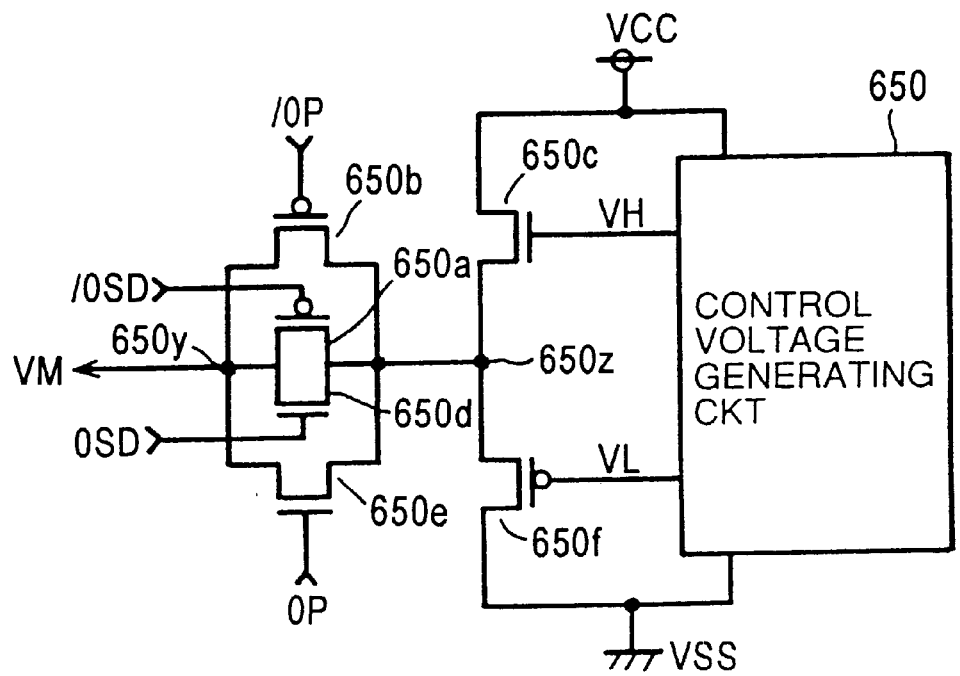
FIG. 63 shows a structure of another modification of an intermediate voltage applying circuit shown in FIG. 61.

FIG. 63 shows a structure of a second modification of the intermediate voltage generating portion shown in FIG. 61. In the structure shown in FIG. 63, an n-channel MOS transistor 650c receiving control voltage VH on its gate and p-channel MOS transistor 650f receiving control voltage VL on its gate are connected in series between power supply node VCC and ground node VSS. The structure of the intermediate voltage generating portion shown in FIG. 63 is substantially the same as that of intermediate voltage applying circuit 500 shown in FIG. 57.

In the intermediate voltage applying circuit shown in FIG. 63, MOS transistors 650a, 650b, 650d and 650e are connected in parallel between an internal node 650z and an output node 650y. MOS transistors 650a, 650b, 650d and 650e receive control signals /φSD, /φP, φSD and φP on their gates, respectively. Output node 650y is connected to the connection node between capacitance elements C1 and C2 shown in FIG. 61.

By equivalently arranging the CMOS transmission gate between output node 650y and internal node 650z, output node 650y and internal node 650z can be surely isolated electrically from each other when output node 650y is electrically floated. Owing to this structure of CMOS transmission gate, a low impedance state is attained between output node 650z and internal node 650z, when these MOS transistors 650a, 650b, 650d and 650e are turned on, so that MOS transistors 650c and 650f can surely perform the clamp operation in accordance with control voltages VH and VL and intermediate voltage VM.

This intermediate voltage applying circuit can employ any circuit structure, provided that generation of intermediate voltage VM is inhibited (i.e., clamping is inhibited) when both delayed sense amplifier activating signal φSD and precharge instructing signal φP is inactive. For example, such a structure may be employed in FIG. 63 that one CMOS transmission gate is arranged between output node 650y and internal node 650z, and turn-on/off of this CMOS transmission gate is controlled in accordance with the output signal of an OR circuit receiving delayed sense amplifier activating signal φSD and precharge instructing signal φP.

The structure, in which the intermediate voltage is applied to the connection node between capacitance elements connected in series, can be applied not only to the capacitance element structure of the embodiments including a plurality of unit capacitance elements connected in parallel but also to a structure including ordinary capacitance elements connected in series. In the latter case, it is possible to prevent malfunction which may be caused by noises and a leak current due to electrical floating of the connection node between capacitance elements connected in series.

According to the embodiment 7 of the invention, a voltage is applied to the connection node between the plurality of capacitance elements, which are connected in series between the first and second nodes, in such a manner that the voltage across the electrodes of each capacitance element is not larger than a fraction of the voltage difference between the first and second nodes, the fraction being equal to a reciprocal number of the number of the capacitance elements. Therefore, even when an insulation failure occurs at a capacitance element, the connection node can be surely held at a constant potential, so that the reliability as the capacitance can be ensured.

According to the invention, therefore, it is possible to provide a stabilizing, decoupling or coupling capacitance having a good area efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a capacitance element having a first electrode node and a second electrode node, wherein said capacitance element includes:
    a plurality of first conductive layers each having a predetermined pattern, formed on a surface of a first semiconductor substrate region and physically spaced from each other;
    a second conductive layer opposingly formed over said plurality of first conductive layers with an insulating film therebetween and electrically connected to said first electrode node; and
    a third conductive layer formed between said plurality of first conductive layers and the first semiconductor substrate region, commonly electrically connected to said plurality of first conductive layers and electrically connected to said second electrode node.

2. The semiconductor device according to claim 1, wherein:
    said semiconductor device further comprises a plurality of memory cells arranged in a matrix formed at a second semiconductor substrate region, and
    each of said plurality of memory cells has a memory cell capacitor having a storage node electrode for storing information charges formed at an interconnection layer in common with said first conductive layer and made of the same material as said first conductive layer, an electrode node comprising a cell plate electrode for receiving a predetermined constant potential formed at an interconnection layer in common with said second conductive layer and made of the same material as said second conductive layer.

3. The semiconductor device according to claim 1, wherein:
    said semiconductor device further comprises a plurality of memory cells arranged in a matrix of rows and columns at a second semiconductor substrate region, wherein:
    each of said plurality of memory cells includes a memory cell capacitor having (i) a storage node electrode for storing information charges formed at an interconnection layer in common with said first conductive layer and made of the same material as said first conductive layer, and (ii) an electrode node comprising a cell plate electrode for receiving a predetermined constant potential formed at an interconnection layer in common with said second conductive layer and made of the same material as said second conductive layer, and
    said semiconductor device further comprising conductive layers arranged corresponding to the columns of said memory cells, formed at an interconnection layer in common with said third conductive layer, made of the same material as said third conductive layer and serving as bit lines, said bit lines being connected to the memory cells in the corresponding memory cell columns.

4. The semiconductor device according to claim 1, wherein:
    said semiconductor device further comprises a plurality of memory cells arranged in a matrix of rows and columns at a second semiconductor substrate region, wherein:
    each of said plurality of memory cells includes a memory cell capacitor having (i) a storage node electrode for storing information charges formed at an interconnection layer in common with said first conductive layer and made of the same material as said first conductive layer and (ii) an electrode node comprising a cell plate electrode for receiving a predetermined constant potential formed at an interconnection layer in common with said second conductive layer and made of the same material as said second conductive layer, and
    said semiconductor device further comprises conductive layers arranged corresponding to the rows of said memory cells, formed at an interconnection layer in common with said third conductive layer, made of the same material as said third conductive layer and serving as word lines, said word lines being connected to the memory cells in the corresponding memory cell rows.

5. The semiconductor device according to claim 1, further comprising a fourth conductive layer arranged between said third conductive layer and said first semiconductor substrate region, opposed to said third conductive layer and electrically connected to said first electrode node.

6. The semiconductor device according to claim 1, wherein at least two said capacitance elements are connected in series and form a composite capacitance element.

7. A semiconductor device comprising a capacitance element, wherein said capacitance element includes:

- a plurality of first conductive layers each having a predetermined pattern, formed on a surface of a first semiconductor substrate region and physically spaced from each other;
- a second conductive layer opposed to said first conductive layers with an insulating film therebetween;
- a third conductive layer formed under and in common with said plurality of first conductive layers and commonly electrically connected to said plurality of first conductive layers; and
- a thick insulating film formed between said third conductive layer and said first semiconductor substrate region and opposed to said third conductive layer.

8. The semiconductor device according to claim 7, wherein at least two said capacitance elements are electrically connected in series and form a composite capacitance element.

9. The semiconductor device according to claim 7, wherein:

said semiconductor device further comprises a plurality of memory cells arranged in a matrix of rows and columns at a second semiconductor substrate region, each of said plurality of memory cells includes a memory cell capacitor having a storage node electrode for storing information charges formed at an interconnection layer in common with said first conductive layer and made of the same material as said first conductive layer, and an electrode node comprising a cell plate electrode for receiving a predetermined constant potential formed at an interconnection layer in common with said second conductive layer and made of the same material as said second conductive layer, and said semiconductor device further comprises conductive layers arranged corresponding to the columns of said memory cells, formed at an interconnection layer in common with said third conductive layer, made of the same material as said third conductive layers and serving as bit lines.

10. The semiconductor device according to claim 7, wherein:

said semiconductor device further comprises a plurality of memory cells arranged in a matrix of rows and columns at a second semiconductor substrate region, wherein:

each of said plurality of memory cells includes a memory cell capacitor having a storage node electrode for storing information charges formed at an interconnection layer in common with said first conductive layer and made of the same material as said first conductive layer, and an electrode node comprising a cell plate electrode for receiving a predetermined constant potential formed at an interconnection layer in common with said second conductive layer and made of the same material as said second conductive layer, and said semiconductor device further comprises conductive layers arranged corresponding to the rows of said memory cells, formed at an interconnection layer in common with said third conductive layer, made of the same material as said third conductive layers and serving as word lines.

11. The semiconductor device according to claim 7, wherein each of said first conductive layer has, in a planar layout, a first side extending in a first direction and a second side extending in a second direction perpendicular to said first direction, the length of said first side is substantially equal to the length of said second side and said first and second sides have minimum lengths according to a design criterion of said semiconductor device.

\* \* \* \* \*